(12) United States Patent
Tanaka et al.

(10) Patent No.: US 9,525,009 B2
(45) Date of Patent: Dec. 20, 2016

(54) ORGANIC ELECTROLUMINESCENT ELEMENT AND ORGANIC ELECTROLUMINESCENT DEVICE

(71) Applicant: MITSUBISHI CHEMICAL CORPORATION, Chiyoda-ku (JP)

(72) Inventors: Futoshi Tanaka, Kanagawa (JP); Ichiro Imada, Kanagawa (JP); Hideki Gorohmaru, Kanagawa (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 14/273,992

(22) Filed: May 9, 2014

(65) Prior Publication Data
US 2014/0246660 A1     Sep. 4, 2014

Related U.S. Application Data

(63) Continuation of application No. PCT/JP2012/067625, filed on Jul. 10, 2012.

(30) Foreign Application Priority Data

Nov. 11, 2011   (JP) .................................. 2011-247576

(51) Int. Cl.
*H01L 27/32*      (2006.01)
*H01L 51/50*      (2006.01)
(Continued)

(52) U.S. Cl.
CPC ....... *H01L 27/3206* (2013.01); *H01L 51/5016* (2013.01); *H01L 51/52* (2013.01);
(Continued)

(58) Field of Classification Search
CPC .. H01L 27/3206; H01L 51/52; H01L 51/5016; H01L 27/3211; H01L 51/5004; H01L 51/0059; H01L 51/0058; H01L 51/0052; H01L 51/0067; H01L 51/0072; H01L 51/0073; H01L 51/0085
See application file for complete search history.

(56) References Cited

U.S. PATENT DOCUMENTS 8,754,399 B2      6/2014   Tanaka et al.
2003/0082404 A1   5/2003   Sotoyama et al.
(Continued)

FOREIGN PATENT DOCUMENTS

CN     202543155     11/2012
CN     102807901     12/2012
(Continued)

OTHER PUBLICATIONS

International Search Report issued Oct. 23, 2012 in PCT/JP2012/067625.
(Continued)

*Primary Examiner* — Jarrett Stark
(74) *Attorney, Agent, or Firm* — Oblon, McClelland, Maier & Neustadt, L.L.P.

(57) ABSTRACT

The objection of invention is to provide an organic electroluminescent element having an excellent current-voltage property. The organic electroluminescent element of the invention comprises an anode, a light emitting layer and a cathode, in this order, wherein a total number of kinds of an electron transport material and a light emitting material contained in the light emitting layer is five or more. Preferably, a total number of kinds of an electron transport material contained in the light emitting layer is four or more, and at least one of an ionization potential and an electron affinity of three kinds or more of the electron transport materials contained in the light emitting layer is different from each other.

22 Claims, 1 Drawing Sheet

(51) Int. Cl.
*H01L 51/52* (2006.01)
*H01L 51/00* (2006.01)

(52) U.S. Cl.
CPC ....... *H01L 27/3211* (2013.01); *H01L 51/0052* (2013.01); *H01L 51/0058* (2013.01); *H01L 51/0059* (2013.01); *H01L 51/0067* (2013.01); *H01L 51/0072* (2013.01); *H01L 51/0073* (2013.01); *H01L 51/0085* (2013.01); *H01L 51/5004* (2013.01); *H01L 2227/32* (2013.01); *H01L 2251/5361* (2013.01); *H01L 2251/5384* (2013.01)

(56) References Cited

U.S. PATENT DOCUMENTS

| | | |
|---|---|---|
| 2004/0076853 A1 | 4/2004 | Jarikov et al. |
| 2005/0040758 A1 | 2/2005 | Wolk et al. |
| 2005/0158582 A1 | 7/2005 | Ise et al. |
| 2006/0088730 A1 | 4/2006 | Begley et al. |
| 2006/0099447 A1 | 5/2006 | Lee et al. |
| 2006/0103298 A1 | 5/2006 | Lee |
| 2006/0159952 A1 | 7/2006 | Ricks et al. |
| 2006/0199038 A1 | 9/2006 | Lee |
| 2007/0057630 A1 | 3/2007 | Nishita et al. |
| 2007/0218190 A1 | 9/2007 | Takashima et al. |
| 2008/0054794 A1* | 3/2008 | Hatanaka ............ C09K 11/06 313/504 |
| 2008/0074038 A1 | 3/2008 | Kim et al. |
| 2008/0135804 A1 | 6/2008 | Qiu et al. |
| 2008/0311425 A1 | 12/2008 | Okuda et al. |
| 2009/0197497 A1 | 8/2009 | Lee |
| 2010/0096622 A1 | 4/2010 | Iizumi et al. |
| 2010/0140605 A1 | 6/2010 | Shibata et al. |
| 2011/0215316 A1 | 9/2011 | Jang et al. |
| 2011/0291080 A1 | 12/2011 | Schmid et al. |
| 2012/0211735 A1 | 8/2012 | Imada et al. |
| 2013/0112951 A1 | 5/2013 | Xia et al. |
| 2013/0334512 A1 | 12/2013 | Abe et al. |

FOREIGN PATENT DOCUMENTS

| | | |
|---|---|---|
| CN | 103329619 A | 9/2013 |
| EP | 2 403 028 A1 | 1/2012 |
| JP | 2003-151775 A | 5/2003 |
| JP | 2003-347058 A | 12/2003 |
| JP | 2005-228737 A | 8/2005 |
| JP | 2006-135295 A | 5/2006 |
| JP | 2006-148045 A | 6/2006 |
| JP | 2006-245565 A | 9/2006 |
| JP | 2007-110102 A | 4/2007 |
| JP | 2007-201192 A | 8/2007 |
| JP | 2007-257897 A | 10/2007 |
| JP | 2008-518442 A | 5/2008 |
| JP | 2008-311367 A | 12/2008 |
| JP | 2009-141339 A | 6/2009 |
| JP | 2009-267393 A | 11/2009 |
| JP | 2010-161356 A | 7/2010 |
| JP | 2010-183009 A | 8/2010 |
| JP | 2010-183072 A | 8/2010 |
| JP | 2010-185007 A | 8/2010 |
| JP | 2010-205427 A | 9/2010 |
| JP | 2011-009498 A | 1/2011 |
| JP | 2011-077494 A | 4/2011 |
| TW | 201129243 | 8/2011 |
| WO | WO 2008/102644 A1 | 8/2008 |
| WO | WO 2009/143807 A1 | 12/2009 |
| WO | WO 2010/098246 A1 | 9/2010 |
| WO | WO 2011/119162 A1 | 9/2011 |

OTHER PUBLICATIONS

Norwin von Malm, et al., "Thermal Detection of Trapped Charge Carriers in Organic Transport Materials" Organic Light Emitting Materials and Devices VI, Proceedings of SPIE, vol. 4800, 2003, pp. 164-171.
"Organic Electroluminescence Technology and Material Development" CMC Publishing, May 2010, 2 Pages.
Extended European Search Report issued Mar. 10, 2015 in Patent Application No. 12848061.3.
Kai-Chin Tang, et al., "Broad band and white phosphorescent polymer light-emitting diodes in multilayer structure" Synthetic Metals, vol. 158, No. 7, XP22688740A, Mar. 28, 2008, pp. 287-291.
Combined Office Action and Search Report issued on Nov. 2, 2015 in Chinese Patent Application No. 201280055385.0 with partial unedited computer generated English translation and English translation of category of cited documents.
Office Action as received in the corresponding Japanese Patent Application No. 2013-542881 dated Mar. 15, 2016 w/English translation.
Office Action as received in the corresponding Chinese Patent Application No. 201280055385.0 dated Jul. 26, 2016 w/English Translation.
Office Action as received in the corresponding European Patent Application No. 12848061.3 dated Aug. 10, 2016.
Sung Hyun Kim, et al., Journal of Luminescence, Elsevier BV North-Holland, NL, vol. 129, No. 4, Nov. 24, 2008, pp. 389-392.
Office Action as received in the corresponding Taiwanese Patent Application No. 101124733 dated Aug. 29, 2016 w/English Translation.
Kai-Chin Tang, "Design of highly efficient green and broad-band white multilayer phosphorescent polymer-based light-emitting diode", Apr. 3, 2008, w/Partial English Translation, pp. 1-69.

* cited by examiner

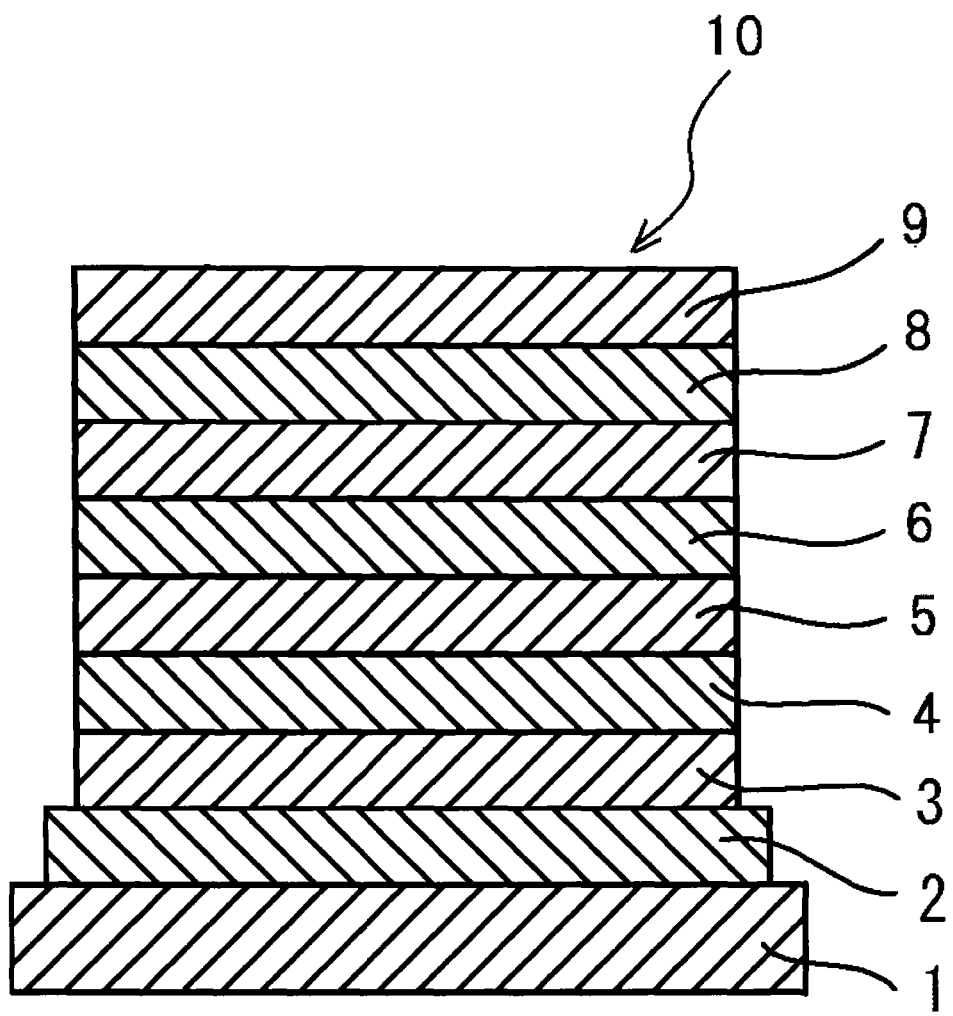

ORGANIC ELECTROLUMINESCENT ELEMENT AND ORGANIC ELECTROLUMINESCENT DEVICE

TECHNICAL FIELD

The present invention relates to an organic electroluminescent element and to an organic electroluminescent device having the organic electroluminescent element.

BACKGROUND ART

An organic electroluminescent element has a simple element configuration and can emit light in various colors, and recently, therefore, has become developed actively as a technique for producing light-emitting devices such as displays, illuminations, etc.

In the organic electroluminescent element, holes and electrons are injected from the anode and the cathode to thereby make the charges reach the light-emitting layer, and in the light-emitting layer, the charges are recombined to emit light. From this theory, for example, it is investigated to improve the luminescent efficiency by keeping the charges staying in the light-emitting layer (see PTL 1).

On the other hand, however, keeping the charges staying in the light-emitting layer worsens the current-voltage characteristics of the organic electroluminescent element. For keeping charges in one layer, in general, there is employed a method of keeping the charges therein by providing a charge trap level inside the film. According to the method, it is possible to increase the luminescent efficiency by keeping the charges in the light-emitting layer, which, however, at a time results in worsening the current-voltage characteristics. For example, "Organic EL Technology and Material Development (CMC Publishing)" says that a light-emitting material acts as a charge trap for a charge transport material therefore resulting in voltage increase (see NPL 1). In addition, "Proc. of SPIE Vil 4800, 164-171 (2003)" reports that, when 1-NaphDATA that is a charge transport material is added to αNPD that is also a charge transport material, then the former causes a charge trap to result in voltage increase (see NPL 2).

From the above, it is desired to further improve the current-voltage characteristics for putting an organic electroluminescent element into practical use as a light-emitting device.

CITATION LIST

Patent Literature

PTL 1: JP-A 2005-219513

Non-Patent Literature

NPL 1: Organic EL Technology and Material Development, CMC Publishing, issued May 2010, p. 184
NPL 2: Proc. of SPIE Vil 4800, 164-171 (2003)

SUMMARY OF INVENTION

Technical Problem

The present invention is to provide an organic electroluminescent element having good current-voltage characteristics.

Solution to Problem

The present inventors have assiduously investigated the problems and, as a result, have found that, in general, when multiple charge transport materials are used in a light-emitting layer, it has heretofore been considered that voltage increase would occur and go on for the above-mentioned reasons, but surprisingly, when a given number or more of charge transport materials are used and the level of the charge transport routes thereof are controlled, then it is possible to obtain an organic electroluminescent element having good current-voltage characteristics.

The present invention has been attained on the basis of these findings, and the gist thereof is as follows:

[1] An organic electroluminescent element comprising an anode, a light-emitting layer and a cathode, in this order, wherein
a total number of kinds of a charge transport material and a light-emitting material contained in the light-emitting layer is 5 or more, and a total number of kinds of the charge transport material contained in the light-emitting layer is 3 or more.

[2] The organic electroluminescent element according to the item [1], wherein the total number of kinds of the charge transport material contained in the light-emitting layer is 4 or more.

[3] The organic electroluminescent element according to the item [1] or [2], wherein the light-emitting layer contains three or more kinds of charge transport materials that differ in at least one value of ionization potential and electron affinity.

[4] The organic electroluminescent element according to the item [1] or [2], which has at least one combination satisfying a relationship where, when two kinds of the charge transport materials contained in the light-emitting layer are arbitrarily selected, at least one of ionization potential difference and electron affinity difference between the charge transport materials is 0.30 eV or less.

[5] The organic electroluminescent element according to the item [1] or [2], which has at least two combinations each satisfying a relationship where, when two kinds of the charge transport materials contained in the light-emitting layer are arbitrarily selected, at least one of ionization potential difference and electron affinity difference between the charge transport materials is 0.30 eV or less.

[6] The organic electroluminescent element according to the item [1] or [2], which has at least two combinations each satisfying a relationship where, when two kinds of the charge transport materials contained in the light-emitting layer are arbitrarily selected, at least one of ionization potential difference and electron affinity difference between the charge transport materials is 0.20 eV or less.

[7] The organic electroluminescent element according to the item [1] or [2], which has at least three combinations each satisfying a relationship where, when two kinds of the charge transport materials and the light-emitting materials contained in the light-emitting layer are arbitrarily selected, at least one of ionization potential difference and electron affinity difference between the selected materials is 0.20 eV or less.

[8] An organic electroluminescent device comprising two or more organic electroluminescent elements each emitting light in a different color, which comprises one or more organic electroluminescent elements of the item [1] or [2].

[9] An organic electroluminescent device comprising two or more organic electroluminescent elements each emitting light in a different color, wherein the two or more organic electroluminescent elements are composed of only the organic electroluminescent element of the item [1] or [2].
[10] An organic EL display using the organic electroluminescent device of the item [8].
[11] An organic EL lighting using the organic electroluminescent device of the item [8].
[12] An organic EL display using the organic electroluminescent device of the item [9].
[13] An organic EL lighting using the organic electroluminescent device of the item [9].

Advantageous Effects of Invention

According to the present invention, there is provided an organic electroluminescent element having good current-voltage characteristics; and using the organic electroluminescent element, there can be obtained light sources and others that take advantage of the characteristics of planar light emitters having high luminescent efficiency, for example, light sources for flat panel displays for OA computers, wall-mounted televisions and the like, and for sign boards, marker lights and duplicators, as well as backlight sources for liquid-crystal displays, indicators, etc.

BRIEF DESCRIPTION OF DRAWING

FIG. 1 is a schematic cross-sectional view showing one example of an embodiment of the organic electroluminescent element of the present invention.

DESCRIPTION OF EMBODIMENTS

Embodiments of the organic electroluminescent element and the organic electroluminescent device of the present invention are described in detail hereinunder; however, the following description is of some examples (typical examples) of the embodiments of the present invention, and the present invention is not specifically defined by these contents, not overstepping the scope and the spirit thereof.
(Organic Electroluminescent Element)

The organic electroluminescent element of the present invention is an organic electroluminescent element that has at least an anode, a light-emitting layer and a cathode in that order, wherein the light-emitting layer contains a charge transport material and a light-emitting material and wherein the total number of kinds of the charge transport material and the light-emitting material contained in the light-emitting layer is 5 or more and the total number of kinds of the charge transport material is 3 or more.

In the present invention, the total number of kinds of the charge transport material contained in the light-emitting layer is 4 or more.
[Mechanism of Action by Control of the Number of Materials in Light-Emitting Layer]

The mechanism of action of the present invention could be presumed as follows: In the layer that involves the mechanism of charge transfer, material aggregation and crystallization may occur therein whereby the condition of the layer in the film would be disproportionated to interfere with charge transfer therein, thereby often worsening the current-voltage characteristics of the element. In particular, the light-emitting layer is a layer where charges may concentrate from both electrodes, and is therefore readily influenced by the action. Given the situation, the present inventors have found that, as a means for preventing the aggregation and crystallization of materials, it is effective to use multiple kinds of different materials. Specifically, when multiple kinds of different materials are used in film formation, it is possible to secure the space between the materials having the same skeleton, and therefore the aggregation and the crystallization in the film can be thereby prevented to secure a uniform amorphous film, and it is possible to form a good charge transport film having few defects of charge transfer. For example, in a case where molecules are considered as pseudo-spheres, the system where the spheres could be efficiently brought into contact with each other and could be filled in a space could be considered as pseudo-unit lattices. In a closest packing method (face-centered cubing packing, hexagonal closest packing), 6 or more kinds of materials can be packed in such a manner that the same type of the material is prevented from being kept in contact with each other. In fact, owing to the difference in the molecular size, at most 6 kinds of materials can be packed in such a manner that the same type of the material is prevented from being kept in contact with each other. Five types or more of different materials, preferably 6 types or more of different materials, when used together, can enhance the effect of preventing the aggregation and the crystallization derived from the same type of material, and therefore, using such multiple kinds of different materials makes it possible to form a uniform film, consequently making the formed film have good current-voltage characteristics.

In general, a charge transport material comprises mainly an aromatic compound or a compound having an aromatic group,
as described below. Therefore, it is relatively easy to mix different compounds in the material, and the same type of the material can be prevented from being kept in contact with each other and from being aggregated. Accordingly, when 3 or more types, preferably 4 or more types, more preferably 5 or more kinds of charge transport materials are contained in the light-emitting layer, except the light-emitting material therein, the materials can be effectively prevented from being aggregated or crystallized in the film, and it is possible to reduce the charge trap caused by such aggregation or crystallization, thereby providing good current-voltage characteristics.

In view of the above, in the present invention, one type of the light-emitting material may be in the light-emitting layer, but it is desirable that 3 or more types, preferably 4 or more types, more preferably 5 or more kinds of the charge transport material are used therein, and the total of the kinds of the light-emitting material and the charge transport material in the layer is preferably 5 or more. Regarding the number of the kinds of the light-emitting material and the charge transport material in the light-emitting layer, preferably, the total of the kinds of the light-emitting material and the charge transport material in the light-emitting layer is 20 or less, from the viewpoint that the material control and the light-emitting layer-forming composition preparation do not take a lot of trouble and, in addition, from the viewpoint that the charge transport routes to be mentioned below could be suitably segmentalized and the driving voltage can be therefore readily reduced. More preferably, the total number is 15 or less. In practical use, it is desirable that one or two kinds of light-emitting materials are used in the light-emitting layer and from 4 to 12 types, especially from 5 to 10 kinds of charge transport materials are in the layer.
[Mechanism of Action by Control of Ionization Potential and Electron Affinity of Materials in Light-Emitting Layer]

In the present invention, multiple kinds of materials that differ in at least one of ionization potential and electron affinity are made to exist in one and the same layer to thereby form multiple charge transport routes therein, whereby it is considered that the charge transport retardation could be prevented to secure good current-voltage characteristics. For forming multiple charge transport routes, it is desirable that the charge transport materials are uniformly dispersed in the film of the layer and it is also desirable that the layer has 3 or more, preferably 4 or more, more preferably 5 or more kinds of materials differing from each other in at least one of ionization potential and electron affinity. This is because, when the layer has 3 or more kinds of materials differing from each other in at least one of ionization potential and electron affinity, one could function as a charge trap to reduce the risk of worsening the current-voltage characteristics of the element.

Preferably, the content of the charge transport material in the light-emitting layer is larger than that of the light-emitting material therein. This is because in the case, the charge transport routes to the light-emitting material could be physically increased.

In order that the charges could efficiently utilize the routes, it is desirable that the charge transport materials in the layer differ in at least one of the ionization potential and the electron affinity thereof and that at least one of the ionization potential difference and the electron affinity difference between the charge transport materials is smaller. This is because, when at least one of the ionization potential difference and the electron affinity difference between the charge transport materials is smaller, then the charges could readily move between the routes and could efficiently utilize the routes whereby the effect of reducing the charge transport congestion could be enhanced.

More preferably, it is desirable that at least one of the ionization potential difference and the electron affinity difference between the light-emitting material and the charge transport material in the light-emitting layer satisfies the above-mentioned relationship. This is for smooth charge transfer from the charge transport material to the light-emitting material.

Accordingly, in the present invention, it is desirable that at least one value of the ionization potential and the electron affinity differs between the three types or more of the charge transport material contained in the light-emitting layer, and it is more desirable that the values of the ionization potential and the electron affinity differ between them. It is further desirable that at least one value of the ionization potential and the electron affinity differs between all the charge transport materials in the light-emitting layer, and most preferably, the values of the ionization potential and the electron affinity differ between all of them.

On the other hand, it is desirable that the ionization potential difference or the electron affinity difference between the materials is small. Concretely, it is desirable that the organic electroluminescent element of the present invention has at least one combination satisfying the relationship of such that, when two kinds of the charge transport materials contained in the light-emitting layer are arbitrarily selected, at least one of the ionization potential difference and the electron affinity difference between the charge transport materials is 0.50 eV or less, preferably 0.30 eV or less, more preferably 0.20 eV or less, even more preferably 0.15 eV or less, still more preferably 0.10 eV or less. This is because, in the preferred cases, the charge transfer between the formed charge transport routes could be easier. The lower limit of the difference is 0.01 eV or more. The number of the combinations satisfying the above-mentioned relationship is preferably 2 or more, more preferably 3 or more, even more preferably 4 or more. However, the total number of the combinations depends on the total number of kinds of the materials.

From the viewpoint of low-voltage performance thereof, it is desirable that the organic electroluminescent element of the present invention has at least one combination satisfying the relationship of such that, when two kinds of the light-emitting materials and the charge transport materials contained in the light-emitting layer are arbitrarily selected, at least one of the ionization potential difference and the electron affinity difference between the selected materials is 0.50 eV or less, preferably 0.30 eV or less, more preferably 0.20 eV or less, even more preferably 0.15 eV or less, still more preferably 0.10 eV or less. The lower limit of the difference is 0.01 eV or more. The number of the combinations satisfying the above-mentioned relationship is preferably 2 or more, more preferably 3 or more. However, the total number of the combinations depends on the total number of kinds of the materials.

Preferably, the light-emitting layer in the present invention contains both a hole transport material and an electron transport material, more preferably contains two or more kinds of those two materials. This is because in the preferred cases, the above-mentioned multiple charge transport routes could be readily formed. Even more preferably, the layer contains three or more kinds of those materials.

Also preferably, the combinations of the charge transport materials contained in the light-emitting layer, in which at least one of the ionization potential difference and the electron affinity difference is 0.30 eV or less, are continued. Specifically, in case where the charge transport materials in the light-emitting layer are lined up as $h_1$, $h_2$, $h_3$, $h_4$, . . . having a lower ionization potential value or a lower electron affinity value in that order, it is desirable that the combinations of those charge transport materials have a consecutive relationship of such that the ionization potential difference or the electron affinity difference (preferably, the ionization potential difference and the electron affinity difference) between $h_1$ and $h_2$ is 0.30 eV or less, preferably 0.20 eV or less, more preferably 0.15 eV or less, even more preferably 0.10 eV or less, that the ionization potential difference or the electron affinity difference (preferably, the ionization potential difference and the electron affinity difference) between $h_2$ and $h_3$ is 0.30 eV or less, preferably 0.20 eV or less, more preferably 0.15 eV or less, even more preferably 0.10 eV or less, and that the ionization potential difference or the electron affinity difference (preferably, the ionization potential difference and the electron affinity difference) between $h_3$ and $h_4$ is 0.30 eV or less, preferably 0.20 eV or less, more preferably 0.15 eV or less, even more preferably 0.10 eV or less. Accordingly, of the charge transport materials contained in the light-emitting layer, the difference in the ionization potential or the electron affinity between the charge transport material having a largest ionization potential or electron affinity and the charge transport material having a smallest ionization potential or electron affinity is preferably $0.30\times(N_h-1)$ eV or less in which $N_h$ represents the number of the kinds of the charge transport material in the light-emitting layer, more preferably $0.20\times(N_h-1)$ eV or less, even more preferably $0.15\times(N_h-1)$ eV or less, still more preferably $0.10\times(N_h-1)$ eV or less.

Preferably, the light-emitting layer in the present invention contains a compound group α comprising two or more compounds each having a basic skeleton of multiple aromatic rings bonding to each other and having a molecular weight of 2000 or less.

The compound group α comprises a compound α1 in which the number of the aromatic ring groups constituting the basic skeleton is the smallest, and any other compound of which at least 50% of the basic skeleton is the same as that of the compound α1.

The other compounds "of which at least 50% of the basic skeleton is the same as that of the compound α1" are described here.

The wording "the same as" means that the aromatic ring groups constituting the basic skeleton are all the same in point of the ring skeleton, the bonding order to the other group and the bonding site. The ring skeleton means the number of the ring-forming atoms when the aromatic ring group is a monocyclic ring-derived one, and means both the number of the ring-forming atoms of each ring and the condensation relationship when the aromatic ring group is a condensed ring-derived one.

For example, in the following Case 1, the compound B in which the number of the aromatic ring groups constituting the basic skeleton is smaller corresponds to "compound α1". The basic skeleton of the compound A is compared with that of the compound B. Of the aromatic ring groups (rings f to i) constituting the basic skeleton of the compound B, the ring f and any two rings of the rings g to i (three rings in total) shall be "the same as" the basic skeleton of the compound A. In other words, three of the four aromatic ring groups constituting the basic skeleton of the compound B are "the same", or that is, 75% (=3/4) of the basic skeleton is "the same". The case may be expressed as "75% sameness (of basic skeleton)".
(Case 1)

[Chem. 1]

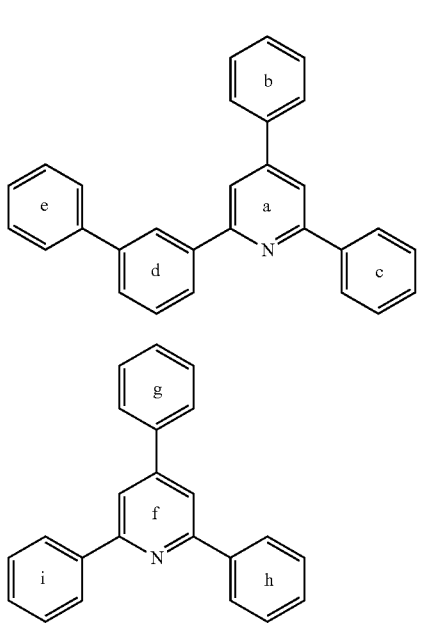

Compound A

Compound B (The ring a and the ring f, the ring b and the ring g, and the ring c and the ring h are all the same in point of the ring skeleton, the bonding order to the other group and the bonding site. The ring d and the ring i are not the same in point of the bonding order to the other group and the bonding site. Accordingly, in the above Case 1, the basic skeleton that the compound A has is the same in a ratio of 3/4 (75%) as the basic skeleton of the compound B.)

In the following Case 2, the compounds A and B are the same in point of the number of the aromatic ring groups constituting the basic skeleton thereof, and in this case, any of the two compounds could be the "compound α1". If for instance, the compound A is the "compound α1", the rings a to f of the aromatic ring groups constituting the basic skeleton of the compound A (rings a to g) are the "same" as the basic skeleton of the compound B. In other words, 6 of the 7 aromatic ring groups constituting the basic skeleton of the compound A are the "same", and the two compounds are the "same" in a ratio of 86%.
(Case 2)

[Chem. 2]

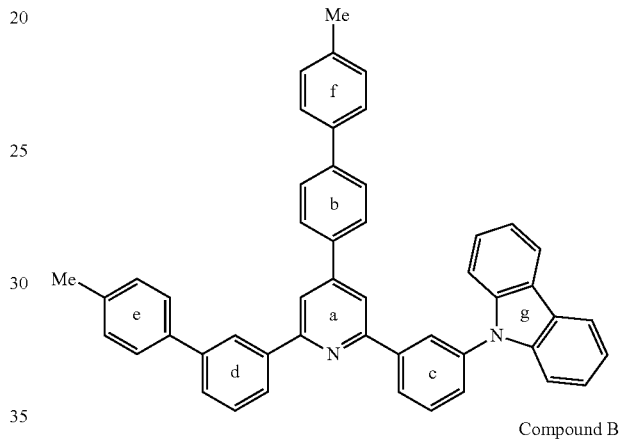

Compound A

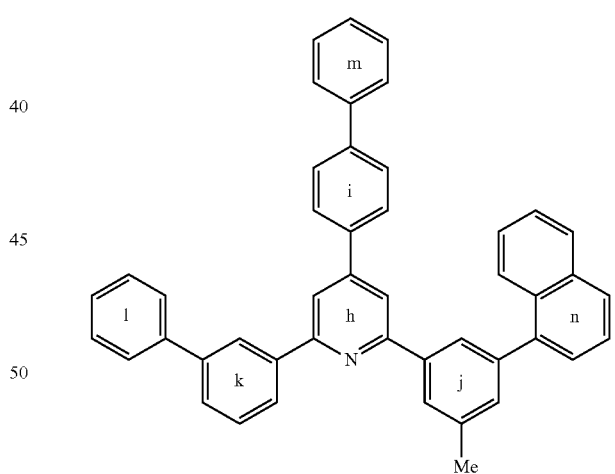

Compound B (The ring a and the ring h, the ring b and the ring i, the ring c and the ring j, the ring d and the ring k, the ring e and the ring l, and the ring f and the ring m are all the same in point of the ring skeleton, the bonding order to the other group and the bonding site. The ring g and the ring n are not the same in point of the ring skeleton thereof. Accordingly, in the above Case 2, the basic skeleton that the compound B has is the same in a ratio of 6/7 (86%) as the basic skeleton of the compound A. The methyl group is not an aromatic ring group and is not contained in the basic skeleton, and consequently, the methyl group is not taken into consideration in calculating the "sameness" in the present invention.)

In the following Case 3, the compounds A to C are the same in point of the number of the aromatic ring groups constituting the basic skeleton thereof, and therefore in the case, any of these could be the "compound α1". In addition, these compounds are all the same in point of the ring skeleton of the aromatic ring groups constituting the basic skeleton of each compound, the bonding order to the other group and the bonding site. In other words, if for instance, the compound A is the "compound α1", the three aromatic ring groups constituting the basic skeleton of the compound A are all the "same" as the basic skeleton of the compounds B and C, or that is, the three compounds are 100% "same".

(Case 3)

[Chem. 3]

Compound A

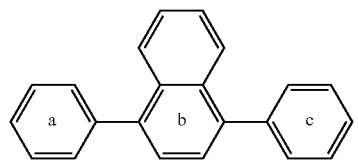

Compound B

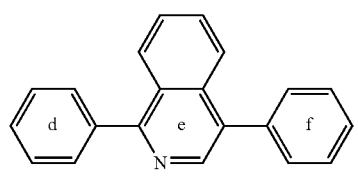

Compound C

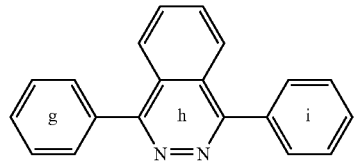

Similarly in the following Case 4, the compounds A to C are the same in point of the number of the aromatic ring groups constituting the basic skeleton thereof, and therefore in the case, any of these could be the "compound α1". In addition, of the aromatic ring groups constituting the basic skeleton of each compound, the ring b in the compound A differs from the ring f in the compound B and the ring b in the compound A differs from the ring j in the compound C both in point of the ring skeleton thereof. In addition, the ring f in the compound B differs from the ring j in the compound C in point of the bonding site.

If for instance, the compound A is the "compound α1", the rings a, c and d of the aromatic ring groups constituting the basic skeleton of the compound A are all the "same" as the basic skeleton of the compounds B and C. In other words, three of the four aromatic ring groups constituting the basic skeleton of the compound A are the "same", or that is, the three compounds are 75% "same".

(Case 4)

[Chem. 4]

Compound A

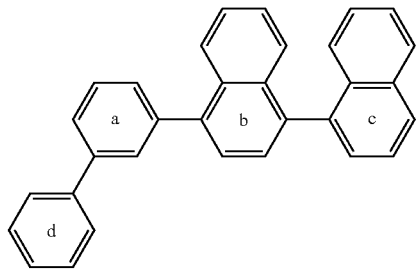

Compound B

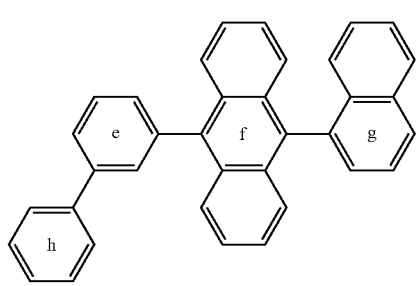

Compound C

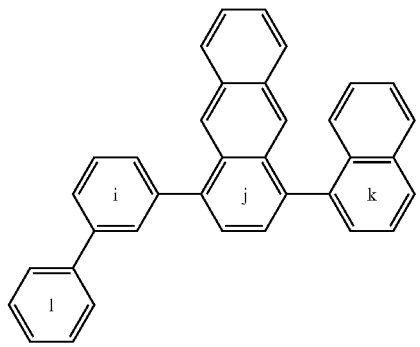

(The ring a and the ring e and the ring i, the ring c and the ring g and the ring k, and the ring d and the ring h and the ring l each are the same. The ring b and the ring f and the ring j are not the same.)

The compound group α in the present invention comprises two or more compounds each having a basic skeleton with multiple aromatic ring groups bonding to each other and having a molecular weight of 2000 or less. In the composition for organic electroluminescent elements that contains the compound group of the type, when the multiple compounds contained in the group satisfy the above-mentioned relationship, then the solute in the composition is prevented from crystallizing out, and therefore the composition can have good storage stability. In addition, when the composition of the type is used, there can be obtained an organic electroluminescent element that requires a low driving voltage and has a high luminescent efficiency.

Not specifically defined, the compounds to be contained in the compound group α may be any ones satisfying the above-mentioned requirement. Preferably, however, the compound group includes a group of charge transport host structures to be mentioned below.

[Method for Measurement of Ionization Potential and Electron Affinity]

Methods for measuring the ionization potential and the electron affinity of the materials in the present invention are described below.

<Method for Measurement of Ionization Potential (IP)>

The ionization potential (IP) of the light-emitting materials and the charge transport materials can be measured using commercially-available ionization potential measurement devices such as Riken Keiki's "AC-1", "AC-2", "AC-3", Optel's (Sumitomo Heavy Industries') "PCR-101", Sumitomo Heavy Industries' "PYS-201" or the like, so far as the data fall within a range detectable with those devices. Preferred is use of "PCR-101", "PYS-201" or the like that enables measurement in vacuum. This is because the data found in atmospheric air may often include considerable errors and in addition, since the light source output is lowered in view of the measurement theory, the measurement accuracy for the materials having a large absolute value of ionization potential is low, and accurate data could not often be obtained.

The sample for ionization potential (IP) measurement may be prepared by forming a film of the targeted light-emitting material or charge transport material on an ITO substrate according to a wet or dry film formation method. As the wet film formation method, there may be mentioned a method of forming a film according to a spin coating method where the targeted light-emitting material or charge transport material is dissolved in an organic solvent such as xylene, toluene or the like. As the dry film formation method, there may be mentioned a vacuum evaporation method, etc.

<Method for Measurement of Band Gap (Eg)>

Band gap (Eg) may be determined through thin-film absorption spectrometry using a UV-visible light absorption spectrometer. Concretely, in the rising part on the short wavelength side of the thin-film absorption spectrum, the tangent line is drawn to the absorption spectrum and to the base line, and from the wavelength W (nm) at the intersection of the two tangent lines, Eg is obtained according to the following equation:

$$Eg=1240/W$$

Specifically, Eg in the case where the wavelength at the intersection is 470 nm is 1240/470=2.63 (eV).

The energy indicating the band gap may be measured with a device that enables absorption spectrum measurement, and the type of the device is not specifically defined. For example, employable here are Hitachi's "F4500", etc.

The sample for energy measurement indicating the band gap may be prepared by forming a film of the targeted light-emitting material or charge transport material on a glass substrate according to a wet or dry film formation method. As the wet film formation method, there may be mentioned a method of forming a film according to a spin coating method where the targeted light-emitting material or charge transport material is dissolved in an organic solvent such as xylene, toluene or the like. As the thy film formation method, there may be mentioned a vacuum evaporation method, etc.

<Method for Measurement of Electron Affinity>

In the present invention, the electron affinity (EA) of the light-emitting material and the charge transport material is a value to be calculated form the value of the above-mentioned band gap (Eg) and the value of the above-mentioned ionization potential (IP) as calculated from the absorption spectrum of the film of the individual material alone, according to the following equation:

$$EA=IP-Eg$$

[Light-Emitting Layer]

The light-emitting layer that the organic electroluminescent element of the present invention has contains, in general, at least, one or more light-emitting materials (materials having the property of light emission) and three or more charge transport materials, and contains compounds of five types or more in total of the charge transport materials and the light-emitting materials. The preferred number of the charge transport materials and the light-emitting materials in the light-emitting layer is as mentioned above, and the light-emitting layer is formed by using the necessary number of the light-emitting materials and the charge transport materials so that the materials could satisfy the preferred relationship of ionization potential and electron affinity mentioned above.

The light-emitting layer in the present invention may contain the light-emitting material as a dopant material and the charge transport material such as hole transport material and electron transport material as a host material. Further, the light-emitting layer in the present invention may contain any other component within a range not markedly detracting from the advantageous effects of the present invention. In a case where the light-emitting layer is formed according to a wet film formation method, low-molecular-weight materials are preferably used.

{Light-Emitting Material}

The light-emitting material to be used here is not specifically defined, and usable here is any known material generally used as the light-emitting material in organic electroluminescent elements. Any substance is usable here that can emit light at a desired emission wavelength and has a good luminescent efficiency. The light-emitting material may be a fluorescent light-emitting material or a phosphorescent light-emitting material; however, from the viewpoint of the internal quantum efficiency, preferred is a phosphorescent light-emitting material.

In case where a phosphorescent light-emitting material is used in the light-emitting layer, it is considered that the event probability of the mechanism that involves charge recombination in the light-emitting layer would be higher than in the case where a fluorescent light-emitting material is used, and therefore the charge transfer between the materials in the light-emitting layer is more important, and it is considered that the influence of the number of the charge transfer routes and the charge trap would be more significant. Accordingly, the present invention is more advantageous in the case where a phosphorescent light-emitting material is used as the light-emitting material.

In addition, both a fluorescent light-emitting material and a phosphorescent light-emitting material may be used here as combined; and for example, a fluorescent light-emitting material may be used for blue and a phosphorescent light-emitting material may be used for green and red.

For the purpose of improving the solubility in the solvent to be used in preparing compositions for light-emitting layer formation for use in forming the light-emitting layer according to a wet film formation method, it is desirable to lower the symmetry or the rigidity of the molecules of the light-emitting material or to introduce an oleophilic substituent such as an alkyl group or the like into the material.

Any one type alone or two or more different kinds of the light-emitting materials may be used here either singly or as combined in any desired combination and in any desired ratio.

<Fluorescent Light-Emitting Material>

Of the light-emitting materials, examples of fluorescent light-emitting materials are mentioned below. However, the fluorescent light-emitting materials for use herein are not limited to those examples.

As fluorescent light-emitting materials of giving blue light emission (blue fluorescent dyes), for example, there are mentioned naphthalene, chrysene, perylene, pyrene, anthracene, coumarin, p-bis(2-phenylethenyl)benzene, arylamine and their derivatives, etc. Above all, preferred are anthracene, chrysene, pyrene, arylamine and their derivatives, etc.

As fluorescent light-emitting materials of giving green light emission (green fluorescent dyes), for example, there are mentioned quinacridone, coumarin, aluminium complexes such as $Al(C_9H_6NO)_3$ and their derivatives, etc.

As fluorescent light-emitting materials of giving yellow light emission (yellow fluorescent dyes), for example, there are mentioned rubrene, perimidone and their derivatives, etc.

As fluorescent light-emitting materials of giving red light emission (red fluorescent dyes), for example, there are mentioned xanthenes such as DCM (4-(dicyanomethylene)-2-methyl-6-(p-dimethylaminostyryl)-4H-pyran) compounds, benzopyran, rhodamine, benzothioxanthene, azabenzothioxanthene and their derivatives, etc.

More concretely, as the arylamine derivatives that are the materials of giving blue fluorescence mentioned above, preferred are compounds represented by the following formula (X) from the viewpoint of the luminescent efficiency and the drive life of the element.

[Chem. 5]

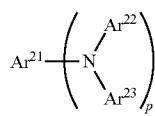

(X)

(In the formula, $Ar^{21}$ represents a substituted or unsubstituted, condensed aromatic ring group having from 10 to 40 ring carbon atoms, $Ar^{22}$ and $Ar^{23}$ each independently represent a substituted or unsubstituted, monovalent aromatic hydrocarbon ring group having from 6 to 40 carbon atoms; p indicates an integer of from 1 to 4.)

The aromatic ring group in the present invention may be an aromatic hydrocarbon ring group or an aromatic heterocyclic ring group.

Concretely, $Ar^{21}$ includes naphthalene, phenanthrene, fluoranthene, anthracene, pyrene, perylene, coronene, chrysene, picene, diphenylanthracene, fluorene, triphenylene, rubicene, benzanthracene, phenylanthracene, bisanthracene, dianthracenylbenzene, dibenzanthracene or the like having one free atomic valence. Here in the present invention, the free atomic valence is one capable of forming a bond with any other free atomic valence, as described in Organic Chemistry, Biochemical Nomenclature (Vol. 1) (revised version of 2nd edition, issued by Nanko-do in 1992).

Preferred examples of arylamine derivatives capable of serving as the fluorescent light-emitting material here are mentioned below; however, the fluorescent light-emitting material for use in the present invention is not limited to these. In the following, "Me" represents a methyl group, and "Et" represents an ethyl group.

[Chem. 6]

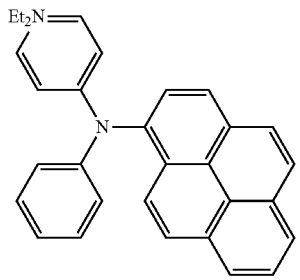

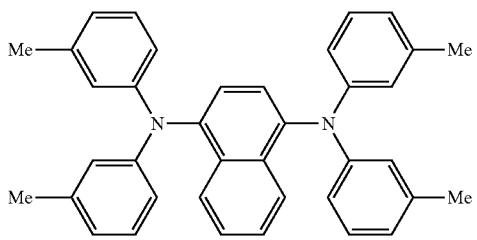

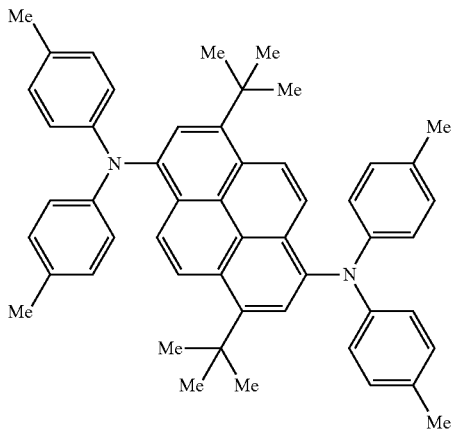

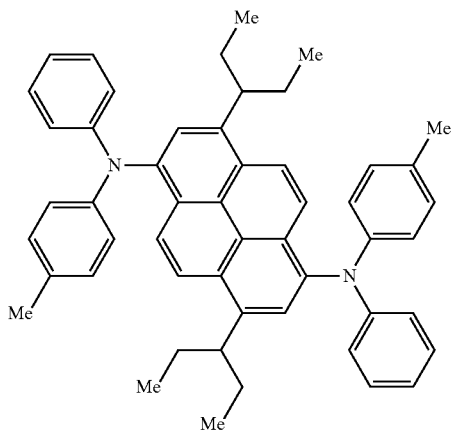

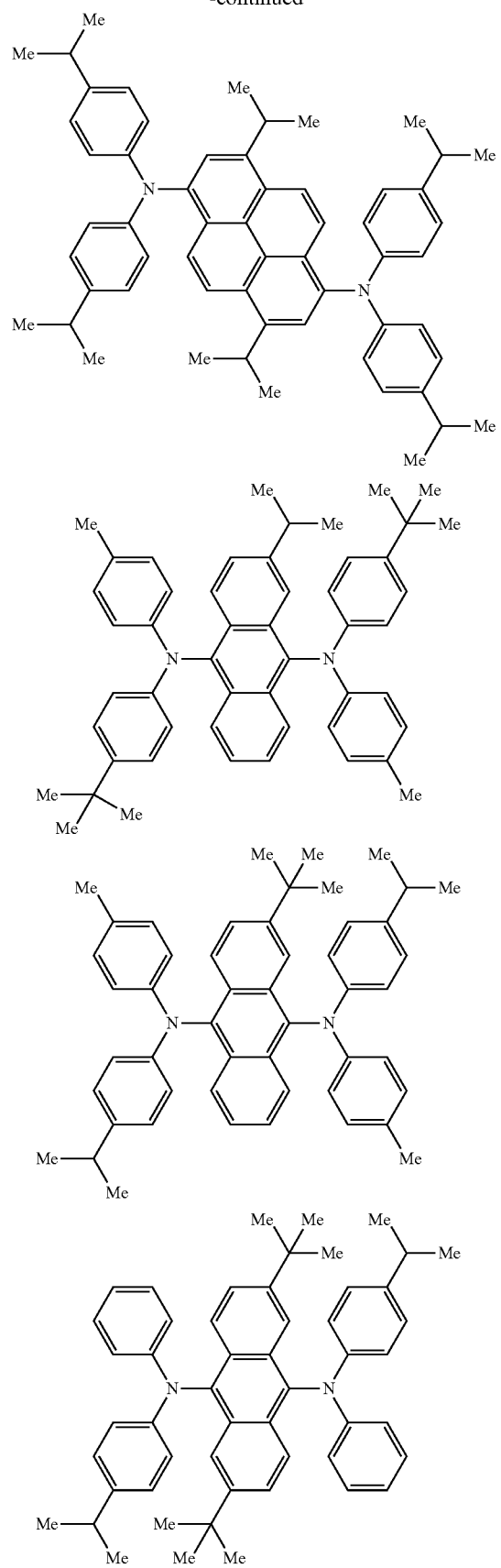
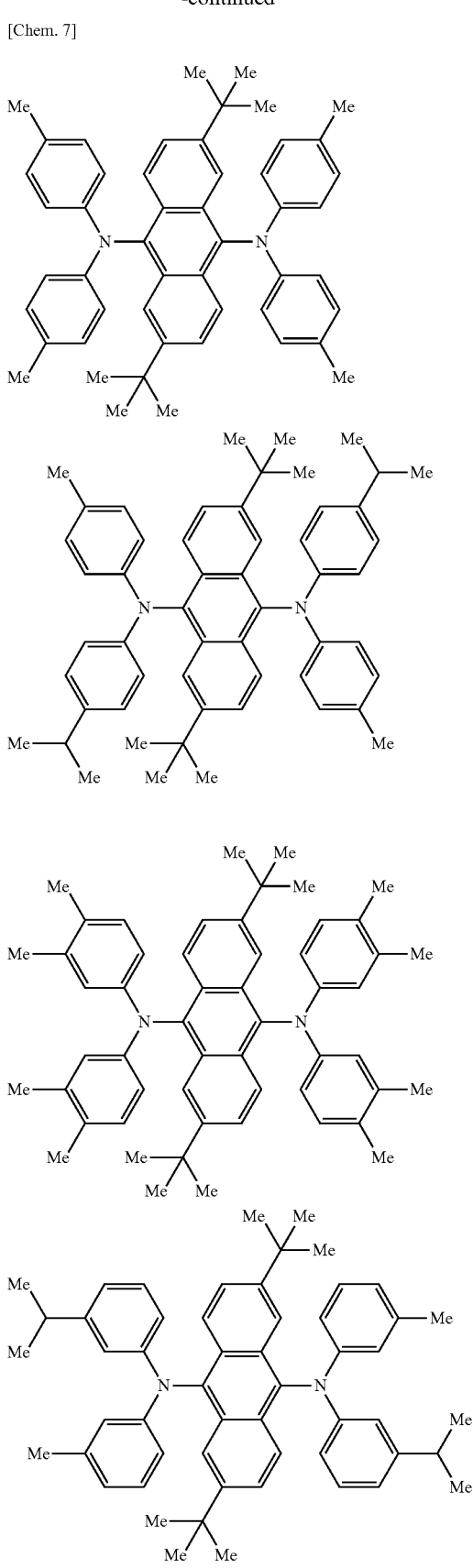

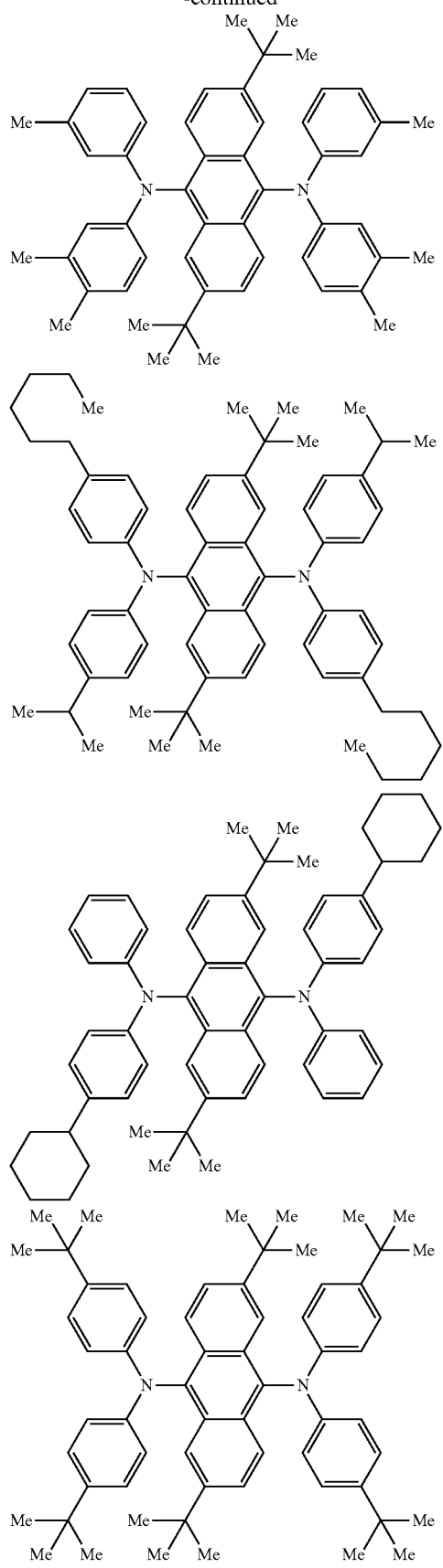
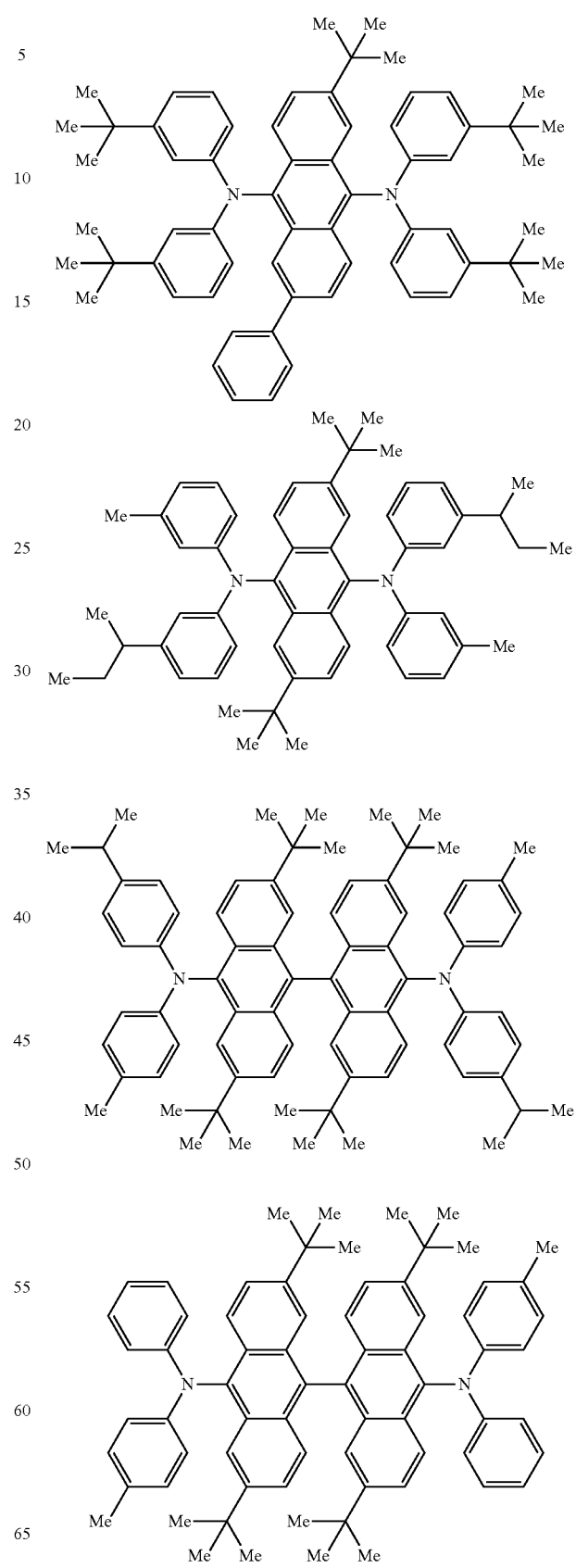

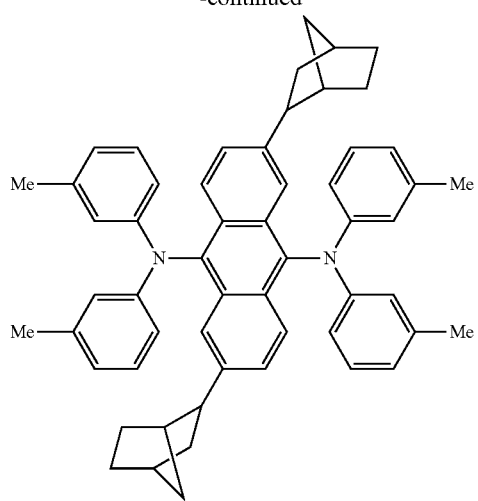
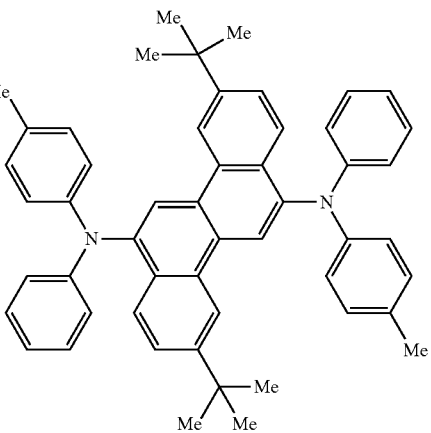
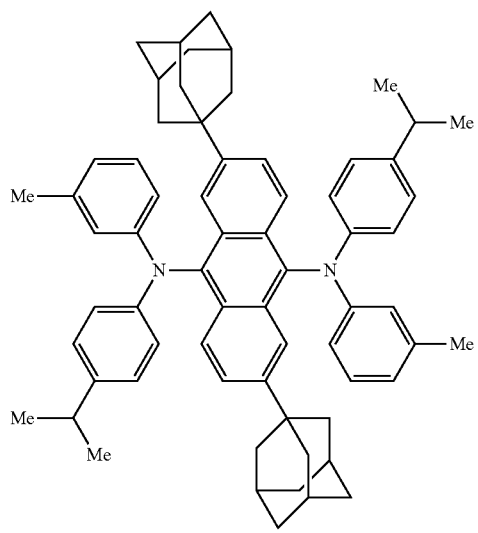
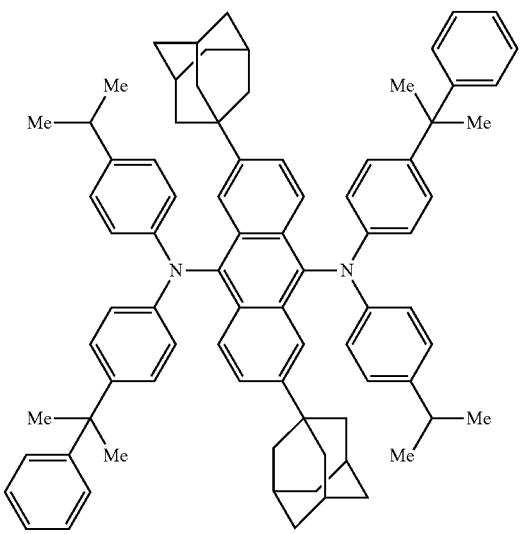
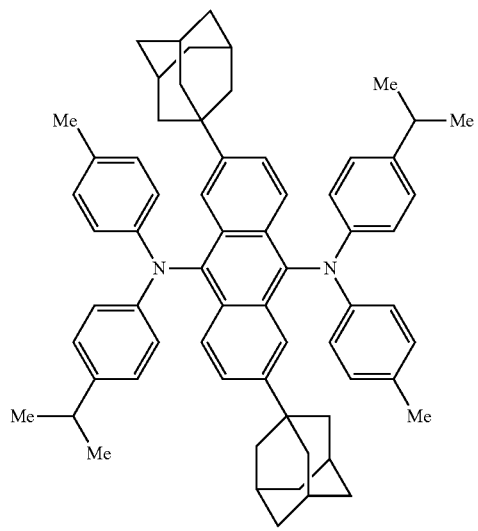
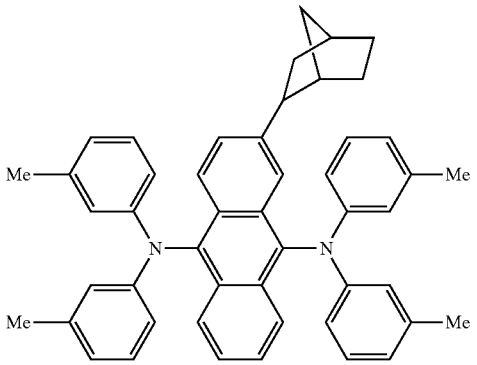

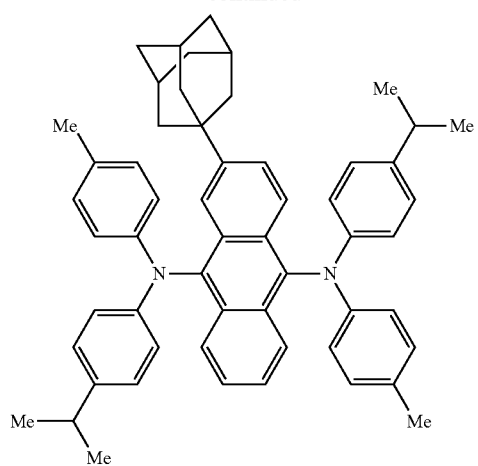
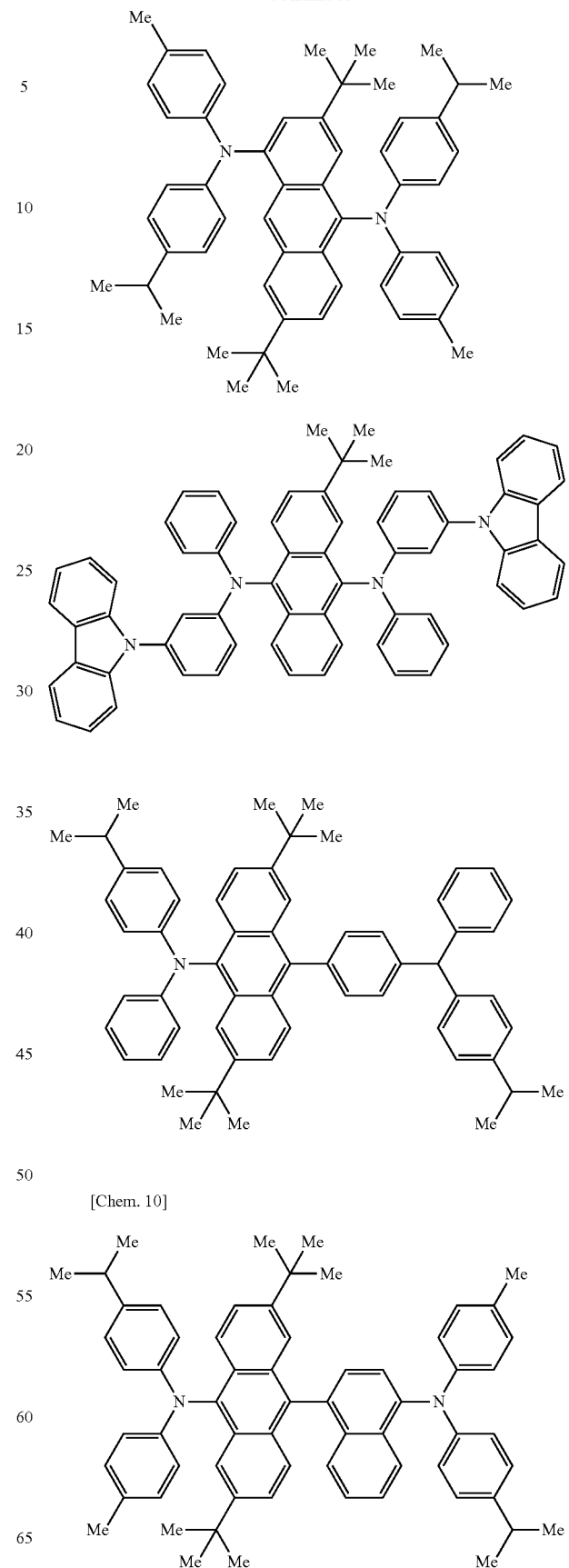

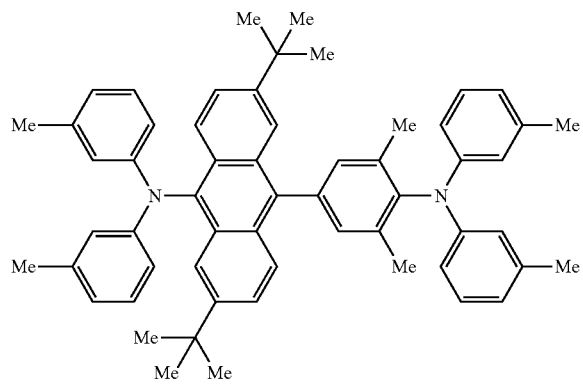
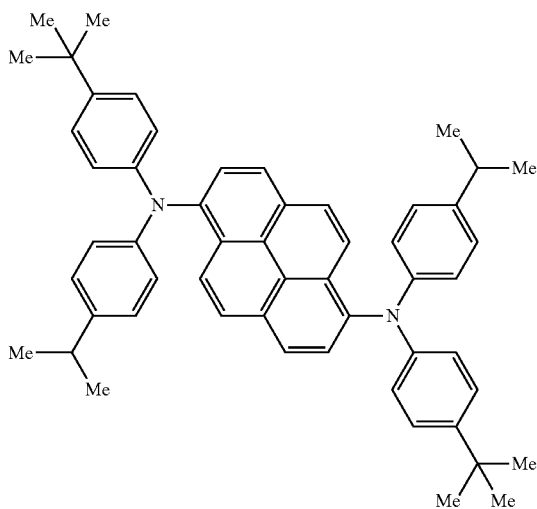
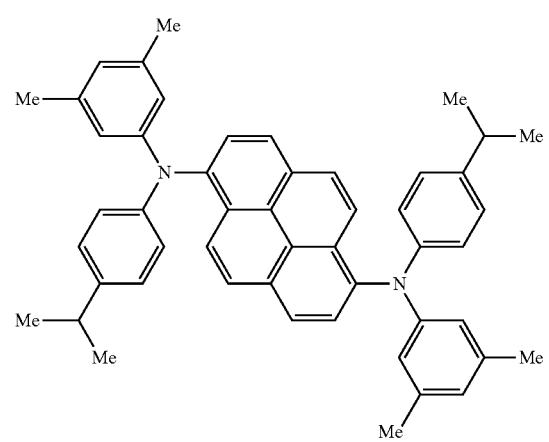
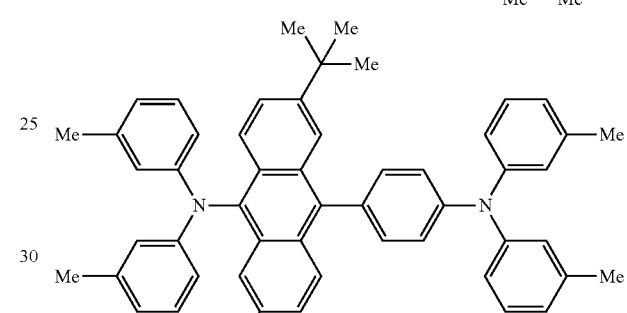
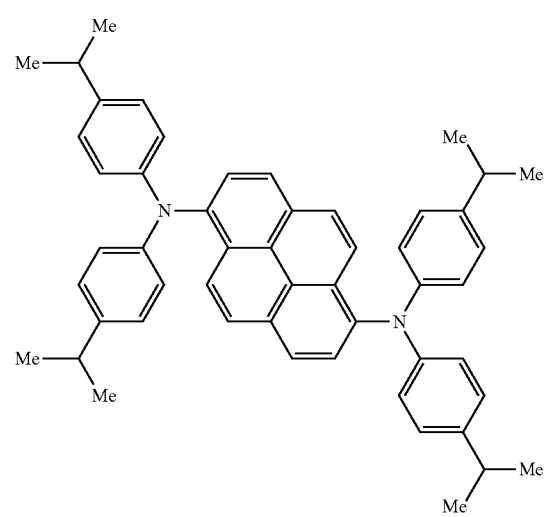
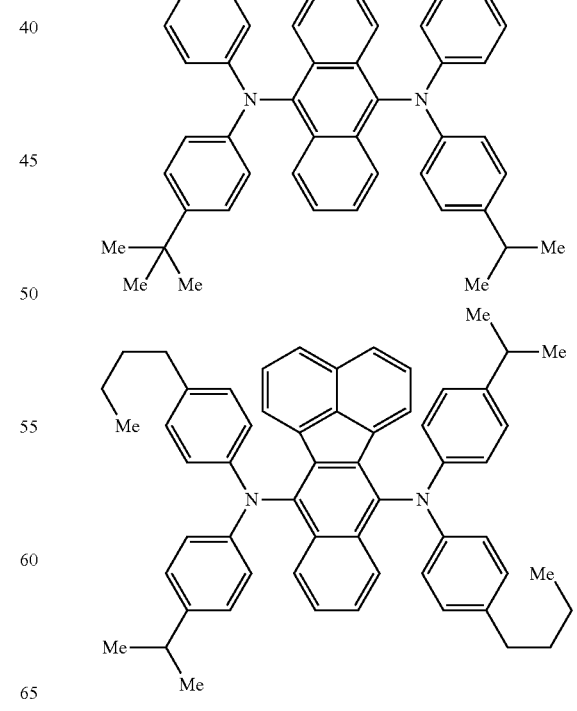

[Chem. 11]

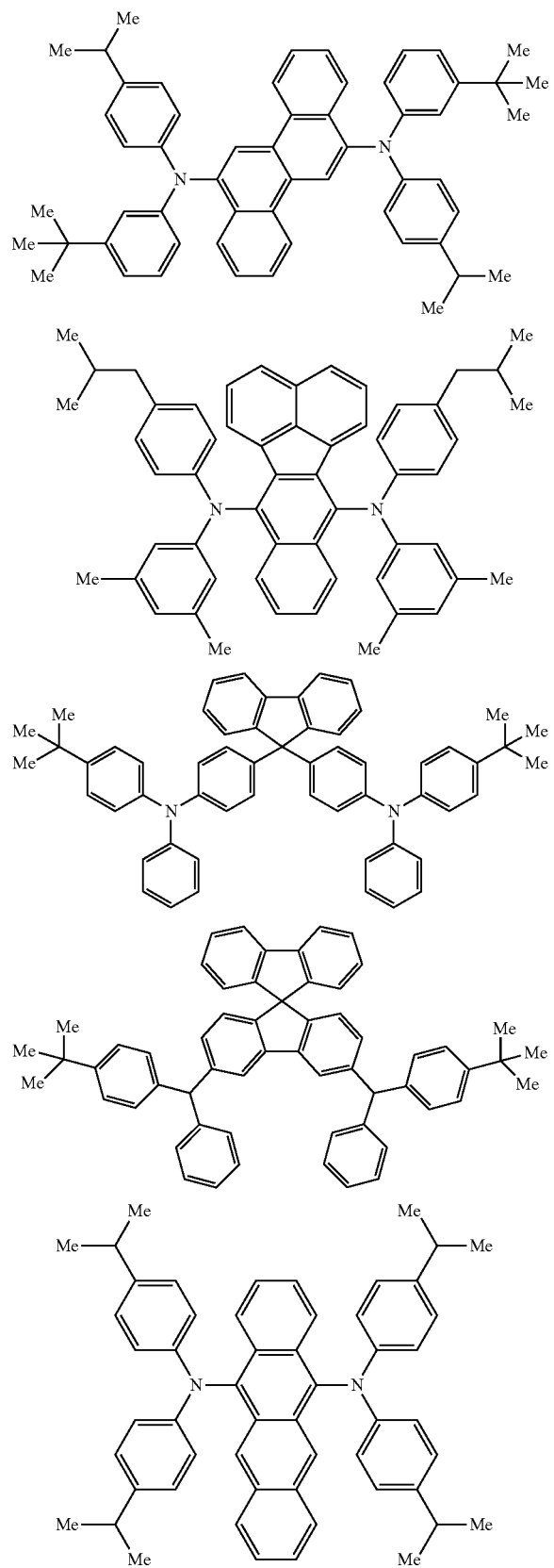

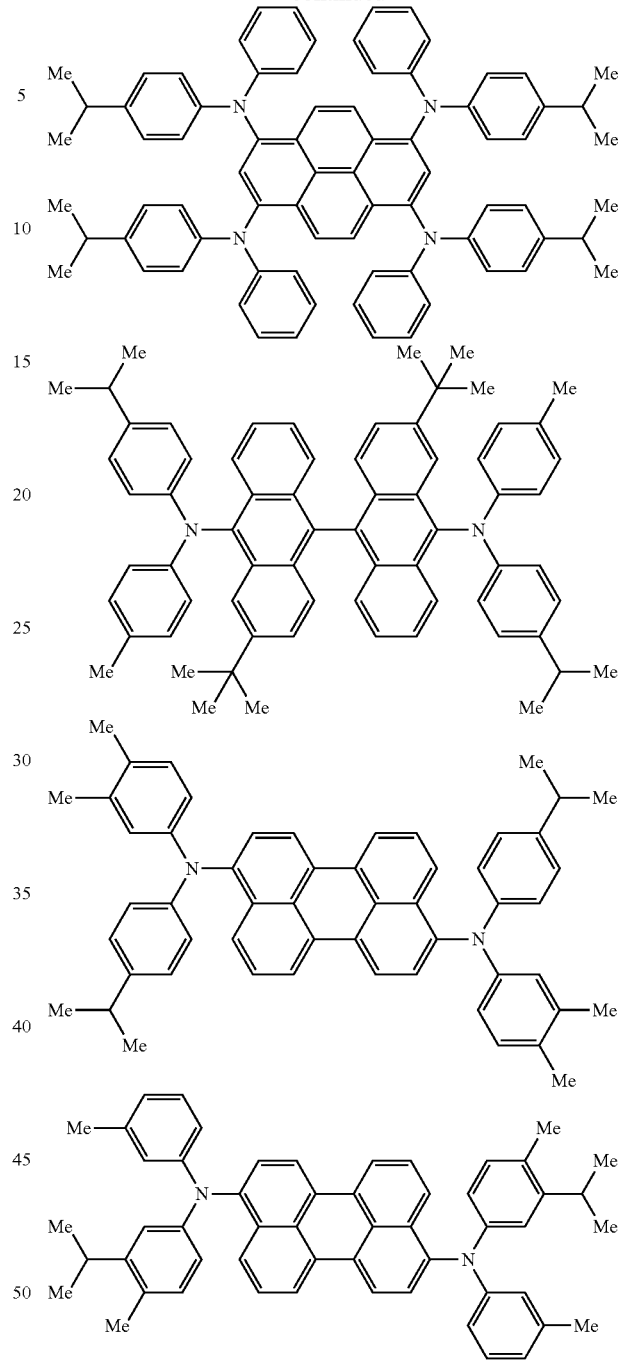

<Phosphorescent Light-Emitting Material>

The phosphorescent light-emitting material includes, for example, Werner complexes and organic metal complexes having, as the center metal therein, a metal selected from Groups 7 to 11 of the Long Format of the Periodic Table (unless otherwise specifically indicated hereinunder, "Periodic Table" means "Long Format of Periodic Table").

As the metal selected from the Groups 7 to 11 of the Periodic Table, preferred are ruthenium, rhodium, palladium, silver, rhenium, osmium, iridium, platinum, gold, etc. Above all, more preferred are iridium and platinum.

The ligand in the complexes is preferably one having a (hetero)aryl group and pyridine, pyrazole, phenanthroline or the like bonding thereto, such as a (hetero)arylpyridine ligand, a (hetero)arylpyrazole ligand or the like, and is more preferably a phenylpyridine ligand or a phenylpyrazole ligand. Here, (hetero)aryl means an aryl group or a heteroaryl group.

Concretely, the phosphorescent light-emitting material includes tris(2-phenylpyridine)iridium, tris(2-phenylpyridine)ruthenium, tris(2-phenylpyridine)palladium, bis(2-phenylpyridine)platinum, tris(2-phenylpyridine)osmium, tris(2-phenylpyridine)rhenium, octaethylplatinum porphyrin, octaphenylplatinum porphyrin, octaethylpalladium porphyrin, octaphenylpalladium porphyrin, etc.

In particular, as the phosphorescent organic metal complexes of the phosphorescent light-emitting material, preferably mentioned are compounds represented by the following formula (III) or formula (IV).

(In the formula (III), M represents a metal, and q indicates the valence of the metal. L and L' each represent a bidentate ligand. j indicates a number of 0, 1 or 2.)

[Chem. 12]

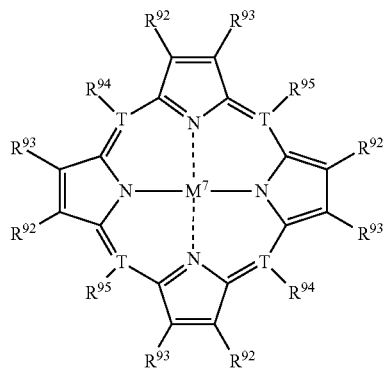

(IV)

(In the formula (IV), $M^7$ represents a metal; and T represents a carbon atom or a nitrogen atom. $R^{92}$ to $R^{95}$ each independently represent a substituent. However, when T is a nitrogen atom, the formula does not have $R^{94}$ and $R^{95}$.)

The compounds represented by the general formula (III) are described below.

In the formula (III), M represents an arbitrary metal, and its preferred examples are the metals described hereinabove as the metals selected from Groups 7 to 11 of the Periodic Table.

In the formula (III), the bidentate ligand L is a ligand having the following partial structure.

[Chem. 13]

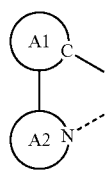

In the partial structure of L mentioned above, the ring A1 represents an aromatic ring group optionally having a substituent. The aromatic ring group in the present invention may be an aromatic hydrocarbon ring group or may also be an aromatic heterocyclic ring group.

The aromatic hydrocarbon ring includes a residue of a 5 or 6-membered monocyclic ring or a 2 to 5-condensed ring having one free atomic valence, etc.

Specific examples of the aromatic hydrocarbon ring group include a benzene ring, a naphthalene ring, an anthracene ring, a phenanthrene ring, a perylene ring, a tetracene ring, a pyrene ring, a benzopyrene ring, a chrysene ring, a triphenylene ring, an acenaphthene ring, a fluoranthene ring, a fluorene ring and the like having one free atomic valence.

The aromatic heterocyclic ring group includes a residue of a 5 or 6-membered monocyclic ring or a 2 to 4-condensed ring having one free atomic valence, etc.

Specific examples of the group include a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a benzimidazole ring, a perimidine ring, a quinazoline ring, a quinazolinone ring, an azurene ring and the like having one free atomic valence.

In the partial structure of L mentioned above, the ring A2 represents a nitrogen-containing aromatic heterocyclic ring group optionally having a substituent.

The nitrogen-containing aromatic heterocyclic ring group includes a residue of a 5 or 6-membered monocyclic ring or a 2 to 4-condensed ring having one free atomic valence, etc.

Specific examples of the group include a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a furopyrrole ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a quinoxaline ring, a phenanthridine ring, a benzimidazole ring, a perimidine ring, a quinazoline ring, a quinazolinone ring and the like having one free atomic valence.

Examples of the substituent that the ring A1 and the ring A2 may have include a halogen atom; an alkyl group; an alkenyl group; an alkoxycarbonyl group; an alkoxy group; an aryloxy group; a dialkylamino group; a diarylamino group; a carbazolyl group; an acyl group; a haloalkyl group; a cyano group; an aromatic hydrocarbon ring group, etc. In case where the ring A1 is a nitrogen-containing aromatic heterocyclic ring group, the ring A2 may have an aromatic hydrocarbon ring group as the substituent therein.

In the formula (III), the bidentate ligand L' is a ligand having the following partial structure. In the following formulae, "Ph" represents a phenyl group.

[Chem. 14]

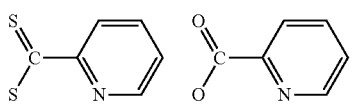

L'

-continued

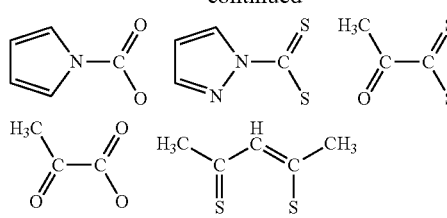
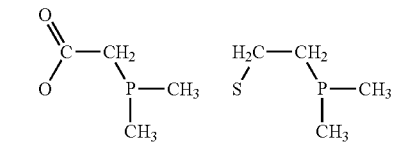
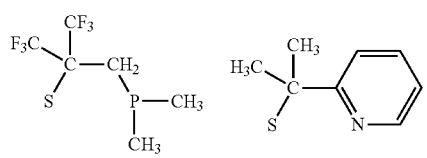
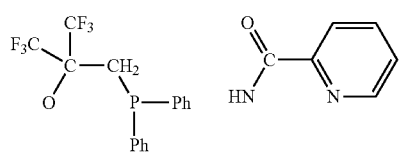
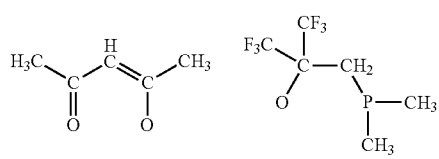
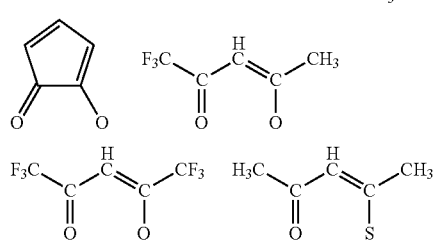
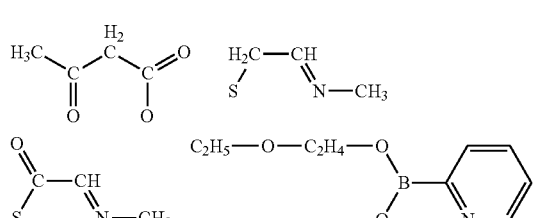
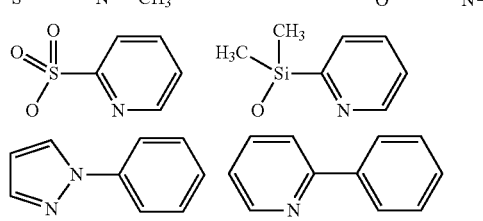
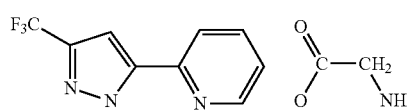

Above all, L' is preferably the following ligand from the viewpoint of the stability of the complex.

[Chem. 15]

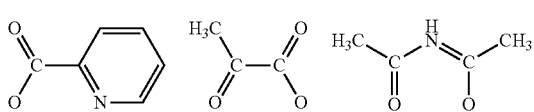
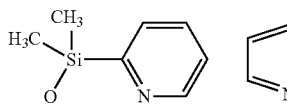
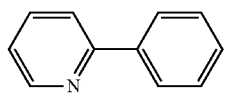

More preferably, the compounds represented by the formula (III) are compounds represented by the following formulae (IIIa), (IIIb) and (IIIc):

[Chem. 16]

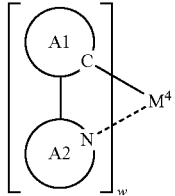

(IIIa)

(In the formula (IIIa), $M^4$ represents the same metal as M; w indicates the valence of the metal; the ring A1 represents an aromatic hydrocarbon ring group optionally having a substituent; and the ring A2 represents a nitrogen-containing aromatic heterocyclic ring group optionally having a substituent.)

[Chem. 17]

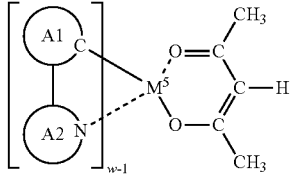

(IIIb)

(In the formula (IIIb), $M^5$ represents the same metal as M; w indicates the valence of the metal; the ring A1 represents an aromatic hydrocarbon ring group optionally having a substituent; and the ring A2 represents a nitrogen-containing aromatic heterocyclic ring group optionally having a substituent.)

[Chem. 18]

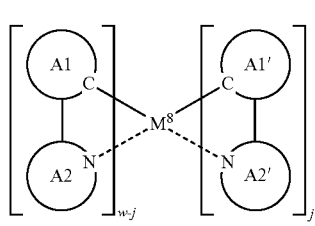

(IIIc)

(In the formula (IIIc), $M^6$ represents the same metal as M; w indicates the valence of the metal; j indicates 0, 1 or 2; the ring A1 and the ring A1' each independently represent an aromatic ring group optionally having a substituent; and the ring A2 and the ring A2' each independently represent a nitrogen-containing aromatic heterocyclic ring group optionally having a substituent.)

In the above formulae (IIIa) to (IIIc), preferred examples of the aromatic ring group of the ring A1 and the ring A1' include a phenyl group, a biphenyl group, a naphthyl group, an anthryl group, a thienyl group, a furyl group, a benzothienyl group, a benzofuryl group, a pyridyl group, a quinolyl group, an isoquinolyl group, a carbazolyl group, etc.

In the above formulae (IIIa) to (IIIc), preferred examples of the nitrogen-containing aromatic heterocyclic ring group of the ring A2 and the ring A2' include a pyridyl group, a pyrimidyl group, a pyrazinyl group, a triazinyl group, a benzothiazol group, a benzoxazole group, a benzimidazole group, a quinolyl group, an isoquinolyl group, a quinoxalyl group, a phenanthrydinyl group, etc.

Examples of the substituent that the aromatic ring group of the ring A1 and the ring A1' and the nitrogen-containing aromatic heterocyclic ring group of the ring A2 and the ring A2' in the above formulae (IIIa) to (IIIc) may have include a halogen atom; an alkyl group; an alkenyl group; an alkoxycarbonyl group; an alkoxy group; an aryloxy group; a dialkylamino group; a diarylamino group; a carbazolyl group; an acyl group; a haloalkyl group; a cyano group, etc.

These substituents may bond to each other to form a ring. As specific examples of the case, the substituent that the ring A1 has bonds to the substituent that the ring A2 has or the substituent that the ring A1' has bonds to the substituent that the ring A2' has, thereby forming one condensed ring. The condensed ring of the type includes a 7,8-benzoxazoline group, etc.

Above all, as the substituents for the ring A1, the ring A1', the ring A2 and the ring A2', more preferred are an alkyl group, an alkoxy group, an aromatic hydrocarbon ring group, a cyano group, a halogen atom, a haloalkyl group, a diarylamino group, a carbazolyl group, etc.

Preferred examples of $M^4$ to $M^6$ in the formulae (IIIa) to (IIIc) include ruthenium, rhodium, palladium, silver, rhenium, osmium, iridium, platinum, gold, etc.

Specific examples of the organic metal complexes represented by the above formulae (III) and (IIIa) to (IIIc) are shown below; however, the organic metal complexes are not limited to the following compounds.

[Chem. 19]

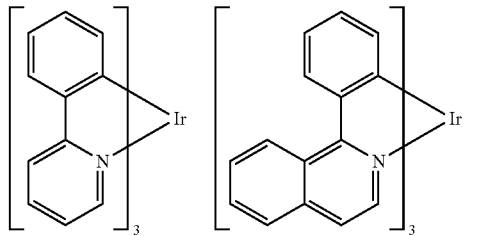

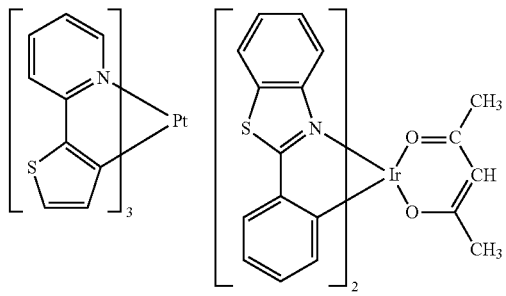

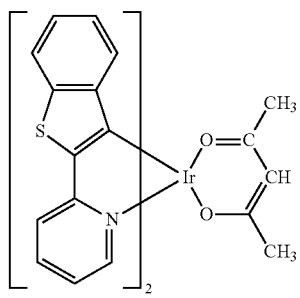

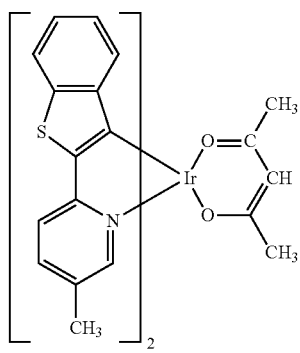

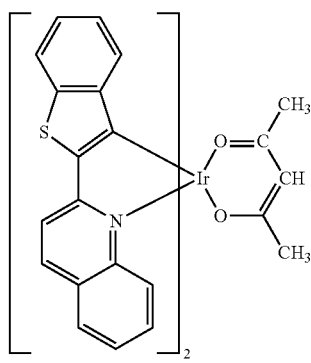

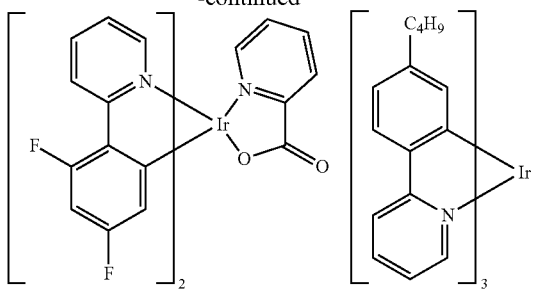
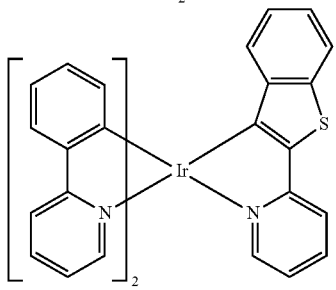
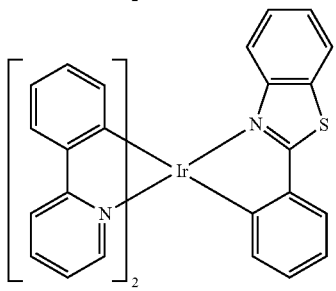
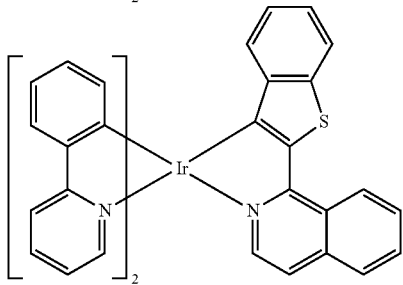
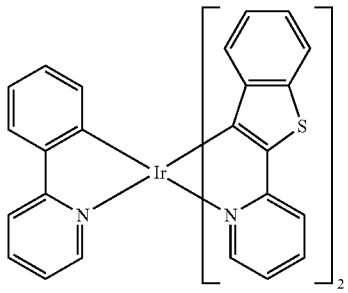
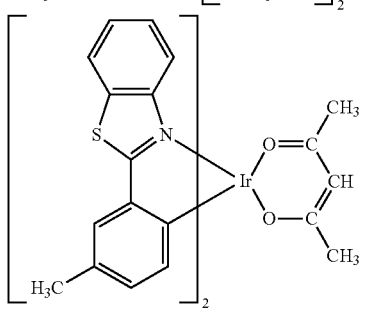
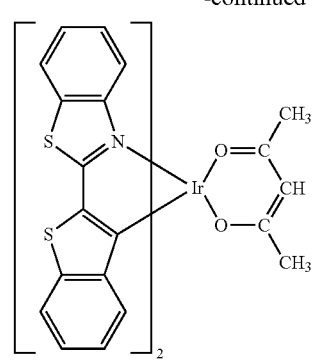
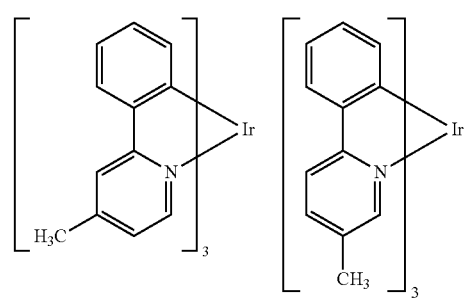
[Chem. 20]
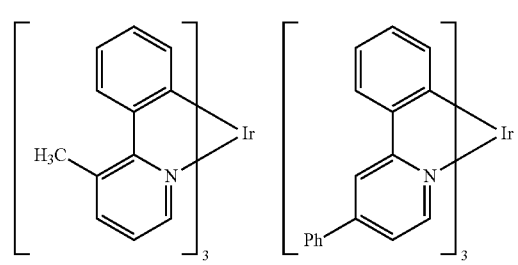
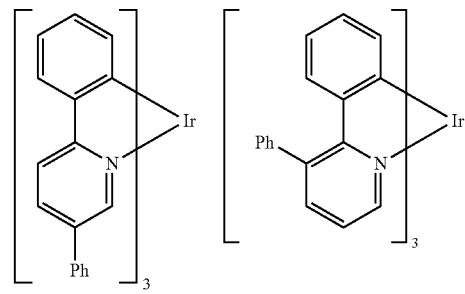
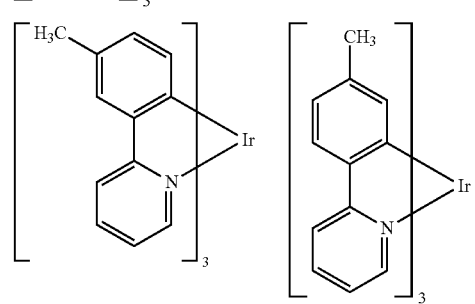

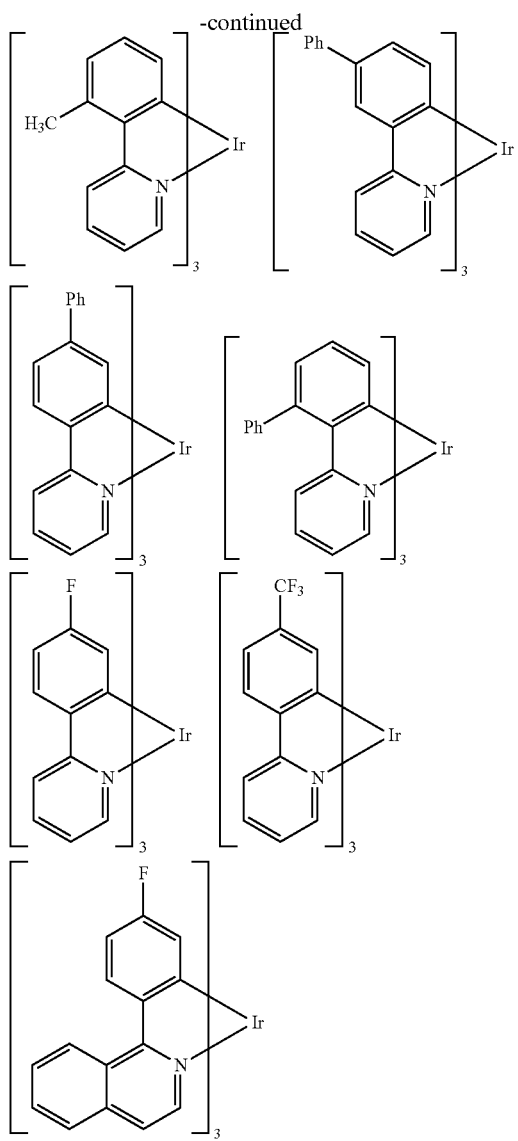

Of the organic metal complexes represented by the above formula (III), especially preferred are compounds where at least one of the ligands L and L' is a 2-arylpyridine-type ligand, or that is, a 2-arylpyridine, or a 2-arylpyridine with a substituent bonding thereto, or a 2-arylpyridine condensed with a substituent.

In addition, the compounds described in WO2005/019373 are also usable as the light-emitting material here.

The compounds represented by the formula (IV) are described below.

In the formula (IV), $M^7$ represents a metal. Specific examples of the metal include the metals mentioned hereinabove as the metals selected from the Groups 7 to 11 of the Periodic Table. More preferably, $M^7$ is ruthenium, rhodium, palladium, silver, rhenium, osmium, iridium, platinum or gold, and even more preferably a divalent metal such as platinum, palladium or the like.

In the formula (IV), $R^{92}$ and $R^{93}$ each independently represent a hydrogen atom, a halogen atom, an alkyl group, an aralkyl group, an alkenyl group, a cyano group, an amino group, an acyl group, an alkoxycarbonyl group, a carboxyl group, an alkoxy group, an alkylamino group, an aralky- lamino group, a haloalkyl group, a hydroxyl group, an aryloxy group, or an aromatic ring group.

Further, when T is a carbon atom, $R^{94}$ and $R^{95}$ each independently represent the same substituent as that mentioned hereinabove for $R^{92}$ and $R^{93}$. When T is a nitrogen atom, the formula does not have $R^{94}$ and $R^{95}$.

In addition, $R^{92}$ to $R^{95}$ may further have a substituent. When they have a substituent, the type of the substituent is not specifically defined, and they may have any desired substituent.

Further, any two or more of $R^{92}$ to $R^{95}$ may bond to each other to form a ring.

Specific examples (T-1, T-10 to T-15) of the organic metal complexes represented by the formula (IV) are shown below; however, the metal complexes are not limited to the following examples. In the following chemical formulae, "Me" represents a methyl group, and "Et" represents an ethyl group.

[Chem. 21]

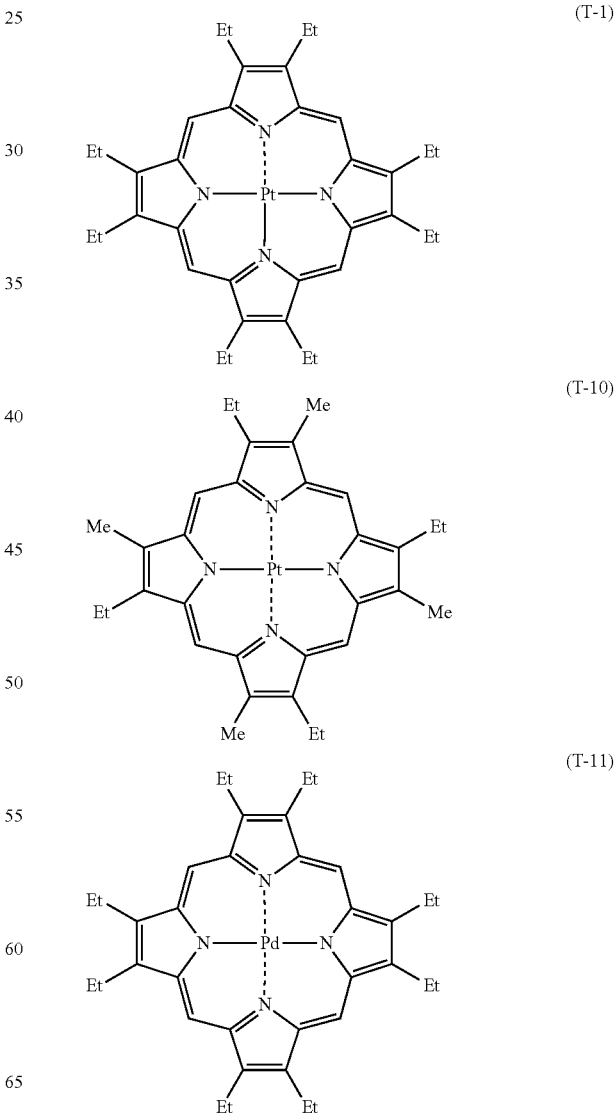

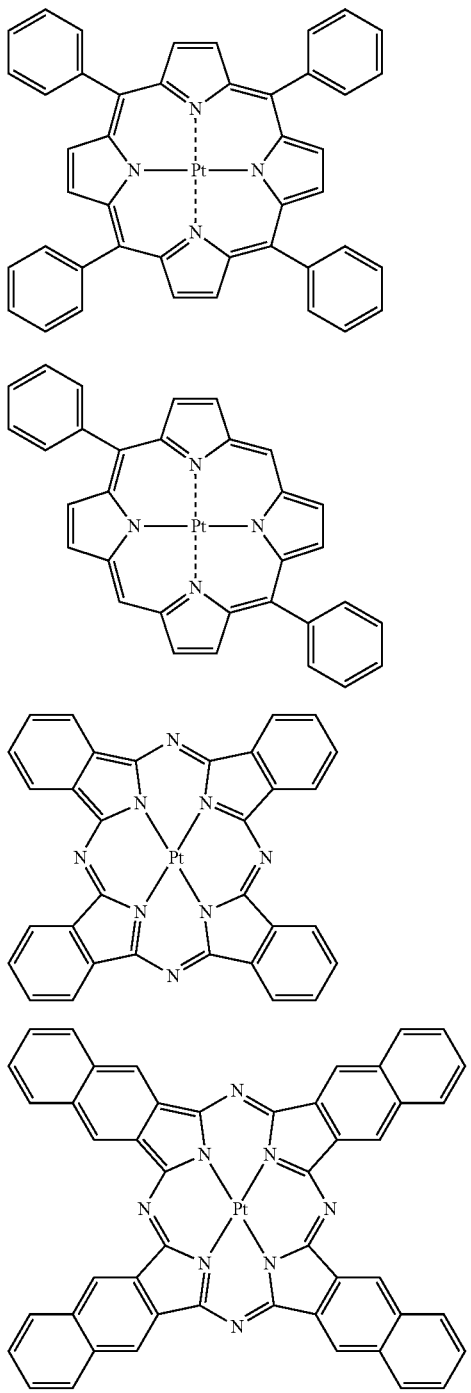

One alone or two or more different kinds of those light-emitting materials may be used here either along or as combined in any desired manner and in any desired ratio. In the present invention, however, the light-emitting layer contains 5 types or more of charge transport materials and light-emitting materials.

<Molecular Weight>

Not markedly detracting from the advantageous effects of the present invention, the molecular weight of the light-emitting material for use in the invention is not specifically defined. The molecular weight of the light-emitting material for use in the present invention is preferably 10000 or less, more preferably 5000 or less, even more preferably 4000 or less, still more preferably 3000 or less. In general, the molecular weight of the light-emitting material in the present invention is 100 or more, preferably 200 or more, more preferably 300 or more, even more preferably 400 or more.

The molecular weight of the light-emitting material is preferably larger, from the viewpoint that the glass transition temperature, the melting point and the decomposition temperature thereof could be high and the light-emitting material and the light-emitting layer formed of the material could have excellent heat resistance and from the viewpoint that the film quality degradation owing to gas generation, recrystallization and molecule migration as well as the impurity concentration increase to be caused by thermal decomposition of material may hardly occur. On the other hand, however, the molecular weight of the light-emitting material is preferably smaller from the viewpoint that the organic compound is easy to purify and is easy to dissolve in solvent.

Preferably, the light-emitting layer in the present invention contains the light-emitting material generally in an amount of 0.01% by weight or more, preferably 0.05% by weight or more, more preferably 0.1% by weight or more. Also preferably, the layer contains the light-emitting material generally in an amount of 35% by weight or less, preferably 20% by weight or less, more preferably 10% by weight or less. In case where two or more different kinds of light-emitting materials are used here, it is desirable that the total content of the materials falls within the above-mentioned range.

{Charge Transport Material}

In the light-emitting layer of the organic electroluminescent element, preferably, the light-emitting material receives charge or energy from the host material that has charge transport capability to thereby emit light. Accordingly, in general, the light-emitting layer contains, for example, a charge transport material capable of being used as the host material. The charge transport material includes a compound having hole transportability (this may be referred to as a hole transport material or a hole-transporting compound) and a compound having electron transportability (this may be referred to as an electron transport material or an electron-transporting compound). The light-emitting layer may contain both the hole transport material and the electron transport material, or may contain any one of them. In case where the light-emitting layer contains a hole-transporting compound but does not contain an electron-transporting compound, the hole-transporting compound may transport electrons in the light-emitting layer. Similarly in case where the light-emitting layer contains an electron-transporting compound but does not contain a hole-transporting compound, the electron-transporting compound may transport holes in the light-emitting layer.

Here examples of the charge transport material include aromatic amine compounds, phthalocyanine compounds, porphyrin compounds, thiophene compounds, benzylphenyl compounds, fluorene compounds, hydrazine compounds, silazane compounds, silanamine compounds, phosphamine compounds, quinacridone compounds, triphenylene compounds, carbazole compounds, pyrene compounds, anthracene compounds, phenanthroline compounds, quinoline compounds, pyridine compounds, triazine compounds, oxadiazole compounds, imidazole compounds, etc.

One alone or two or more different kinds of those charge transport materials may be used here either along or as combined in any desired manner and in any desired ratio. In the present invention, however, the light-emitting layer contains 5 types or more of charge transport materials and light-emitting materials.

Preferably, the electron transport material is a compound having an electron-transporting unit. The electron-transporting unit (electron transport unit) is a structure (unit) excellent in resistance to electrons and having electron transportability. In case where the light-emitting layer contains two or more kinds of charge transport materials, the compound having such an electron-transporting unit could be readily the charge transport material that plays a role of charge transportation mentioned above.

The electron transport unit in the present invention is a unit into which electrons could readily come and in which the electrons having come could be readily stabilized. For example, a pyridine ring or the like is slightly short in electrons owing to the nitrogen atom and could readily receive electrons, and the electrons having come into the ring could be non-localized therein and could be therefore stabilized on the pyridine ring.

The structure of the unit having the above-mentioned property includes a monocyclic ring or a condensed ring that contains a hetero atom with an $sp^2$ hybrid orbital. Here, the hetero atom can readily form an $sp^2$ hybrid orbital and is highly stable for electrons and has high electron transportability. From these, preferred are nitrogen, oxygen, sulfur and selenium, and more preferred is nitrogen. The number of the hetero atoms with an $sp^2$ hybrid orbital that the charge transport material has is preferably larger from the viewpoint that the material having a larger number of hetero atoms could have higher electron transportability.

Examples of the electron transport unit are mentioned below, which, however, are not limitative.

Concretely, the electron transport unit includes a quinoline ring, a quinazoline ring, a quinoxaline ring, a phenanthroline ring, a pyridine ring, a pyrimidine ring, a pyridazine ring, a pyrazine ring, a triazine ring, a thiadiazole ring, a benzothiadiazole ring, a quinolinol metal complex, a phenanthroline metal complex, a hexaazatriphenylene structure, a tetracyanobenzoquinoline structure, etc. Of those, preferred are a quinoline ring, a quinazoline ring, a quinoxaline ring, a phenanthroline ring, a pyridine ring, a pyrimidine ring, a pyridazine ring, a pyrazine ring, a triazine ring and the like, as highly stable to electrons and having high electron transportability. Above all, more preferred are a quinoline ring, a quinazoline ring, a pyridine ring, a pyrimidine ring, a triazine ring, a 1,10-phenanthroline ring and the like in view of the electric stability thereof.

Further, in case where the electron transport unit is a nitrogen-containing, 6-membered monocyclic ring or a condensed ring thereof; it is desirable that the o-position and the p-position to the nitrogen atom are all substituted with an aromatic ring.

The reason is as follows: The o-position and the p-position of the nitrogen atom-containing 6-membered ring are active sites, and therefore, when the active sites are substituted with an aromatic ring group, then electrons could be non-localized. Accordingly, the unit of the type is more stable to electrons.

On the other hand, in case where the electron transport unit is a condensed ring with a nitrogen atom-containing 6-membered ring, it may be good that, of the o-position and the p-position to the nitrogen atom therein, the site not forming a part of the condensed ring is substituted with an aromatic ring group.

As the electron transport material, more preferred are organic compounds having a derivative of the ring listed in the following group (b) (electron transport units), from the viewpoint of high stability to electrons and high electron transportability thereof.

[Chem. 22]

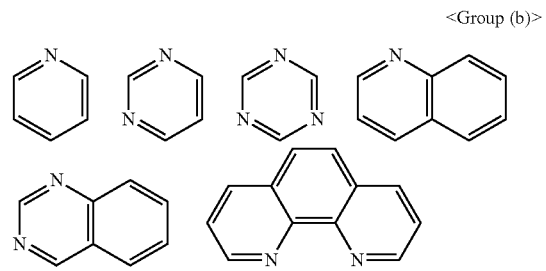

<Group (b)>

(However, the rings contained in the above-mentioned group (b) are all substituted with an aromatic ring group at every site of the o-position and the p-position to the nitrogen atom therein.)

In the above group (b), the aromatic ring group with which the hydrogen atom on the 2-, 4- or 6-positioned carbon atoms in one and the same group relative to the nitrogen atom therein is substituted is not specifically defined. In other words, the aromatic ring group may be an aromatic hydrocarbon ring group or an aromatic heterocyclic ring group, but from the viewpoint that the unit could have excellent resistance to electric oxidation, preferred is an aromatic hydrocarbon ring group. The carbon number of the aromatic ring group is preferably from 6 to 30, and in case where the aromatic ring group is a group composed of condensed rings, the number of the condensed aromatic rings is preferably from 2 to 4.

Here, as the preferred substituent that the cyclic structure contained in the above group (b) could have, there may be mentioned a halogen atom, and an alkyl group with from 1 to 10 carbon atoms, an alkenyl group with from 2 to 10 carbon atoms or a monovalent aromatic hydrocarbon ring group with from 6 to 30 carbon atoms, which may further has a substituent, etc.

In addition, as low-molecular-weight electron transport materials, there may be mentioned 2,5-bis(1-naphthyl)-1,3,4-oxadiazole (BND), 2,5-bis(6'-(2',2"-bipyridyl)-1,1-dimethyl-3,4-diphenylsilol (PyPySPyPy), basophenanthroline (BPhen), 2,9-dimethyl-4,7-diphenyl-1,10-phenanthroline (BCP, bathocuproine), 2-(4-biphenylyl)-5-(p-tertiary butylphenyl)-1,3,4-oxadiazole (tBu-PBD), 4,4'-bis(9-carbazole)-biphenyl (CBP), etc.

The electron transport material is described in more detail.

[Chem. 23]

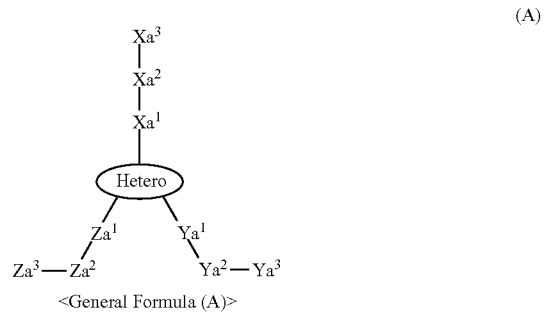

<General Formula (A)>

(In the above general formula (A), the Hetero structure represents any of the following structural formulae (A-1), (A-2) and (A-3); Xa¹, Xa², Y¹, Ya², Za¹ and Za² each independently represent an aromatic hydrocarbon group having from 6 to 30 carbon atoms and optionally having a substituent, or an aromatic heterocyclic group having from 3 to 30 carbon atoms and optionally having a substituent; Xa³, Ya³ and Za³ each independently represent a hydrogen atom, an aromatic hydrocarbon group having from 6 to 30 carbon atoms and optionally having a substituent, or an aromatic heterocyclic group having from 3 to 30 carbon atoms and optionally having a substituent.)

[Chem. 24]

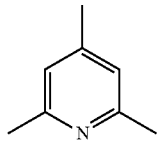

(A-1)

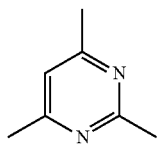

(A-2)

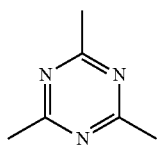

(A-3)

Xa¹, Xa², Ya¹, Ya², Za¹ and Za² in the above general formula (A) each independently represent an aromatic hydrocarbon group having from 6 to 30 carbon atoms and optionally having a substituent, or an aromatic heterocyclic group having from 3 to 30 carbon atoms and optionally having a substituent. Above all, preferred is an aromatic hydrocarbon group having from 6 to 30 carbon atoms and optionally having a substituent, from the viewpoint of the stability of the compound.

The aromatic hydrocarbon ring to form the aromatic hydrocarbon group having from 6 to 30 carbon atoms and optionally having a substituent is preferably a 6-membered monocyclic ring, or a 2 to 5-condensed ring thereof. Concretely mentioned are a benzene ring, a naphthalene ring, anthracene ring, phenanthrene ring, a perylene ring, a tetracene ring, a pyrene ring, a benzopyrene ring, a chrysene ring, a triphenylene ring, and a fluoranthene ring. Above all, preferred is a benzene ring from the viewpoint of the stability and the solubility of the compound.

Preferably, at least one of Xa¹, Xa², Ya¹, Ya², Za¹ and Za² in the above general formula (A) is a 1,2-phenylene group or a 1,3-phenylene group, more preferably a 1,3-phenylene group; and even more preferably, at least two of any one of Xa¹ and Xa², any one of Ya¹ and Ya², or any one of Za¹ and Za² is a 1,2-phenylene group or a 1,3-phenylene group, most preferably a 1,3-phenylene group. The bonding via such a 1,2-phenylene group or a 1,3-phenylene group is preferred, since the stericity of the molecular structure could be high and the solubility of the compound in solvent could also be high and, in addition, the molecular energy gap could be high owing to the non-conjugated bond. In particular, since the excitation triplet energy could be high, the compound is preferred as a host material for phosphorescent light-emitting materials. Further, the bond is more preferably a 1,3-phenylene group in view of the stability of the compound and of the easiness in producing the compound.

As the aromatic heterocyclic ring to form the aromatic heterocyclic group having from 3 to 30 carbon atoms and optionally having a substituent, preferred is a 5- or 6-membered monocyclic ring, or a 2 to 5-condensed ring of those rings. Concretely mentioned are a furan ring, a benzofuran ring, a dibenzofuran ring, a thiophene ring, a benzothiophene ring, a dibenzothiophene ring, a pyrrole ring, a pyrazole ring, an imidazole ring, an oxadiazole ring, an indole ring, a carbazol ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a perimidine ring, a quinazoline ring, and a quinazolinone ring. Above all, preferred are a carbazole ring, a dibenzofuran ring and a dibenzothiophene ring, from the viewpoint of the high stability of the compound and of the high charge transportability thereof; and also preferred are a pyridine ring, a pyrimidine ring and a triazine ring from the viewpoint of the high electron transportability of the compound.

Xa³, Ya³ and Za³ in the above general formula (A) each independently represent a hydrogen atom, an aromatic hydrocarbon group having from 6 to 30 carbon atoms and optionally having a substituent, or an aromatic heterocyclic group having from 3 to 30 carbon atoms and optionally having a substituent.

The aromatic hydrocarbon ring to form the aromatic hydrocarbon group having from 6 to 30 carbon atoms and optionally having a substituent is preferably a 6-membered monocyclic ring, or a 2 to 5-condensed ring thereof. Concretely mentioned here are the groups to be derived from the same rings as those mentioned hereinabove for Xa¹ and others in the general formula (A). Preferred are a benzene ring, a naphthalene ring and a phenanthrene ring from the viewpoint of the stability of the compound.

As the aromatic heterocyclic ring to form the aromatic heterocyclic group having from 3 to 30 carbon atoms and optionally having a substituent, preferred is a 5- or 6-membered monocyclic ring, or a 2 to 5-condensed ring of those rings. Concretely mentioned are the same rings as those mentioned hereinabove for Xa¹ and others in the general formula (A). Above all, preferred are groups derived from a carbazole ring, a dibenzofuran ring and a dibenzothiophene ring from the viewpoint of the high stability of the compound and of the high charge transferability thereof.

The three substituents, -Xa¹-Xa²-Xa³, -Ya¹-Ya²-Ya³ and -Za¹-Za²-Za³ bonding to the Hetero structure in the above general formula (A) may be the same or different. Preferably at least one differs from the others from the viewpoint of increasing the solubility in solvent by depressing the symmetricity of the compound.

The substituent that the aromatic hydrocarbon group or the aromatic heterocyclic group may have includes a saturated hydrocarbon group having from 1 to 20 carbon atoms, an aromatic hydrocarbon group having from 6 to 25 carbon atoms, an aromatic heterocyclic group having from 3 to 20 carbon atoms, a diarylamino group having from 12 to 60 carbon atoms, an alkyloxy group having from 1 to 20 carbon atoms, a (hetero)aryloxy group having from 3 to 20 carbon atoms, an alkylthio group having from 1 to 20 carbon atoms, a (hetero)arylthio group having from 3 to 20 carbon atoms, a cyano group, etc. Of those, preferred are a saturated hydrocarbon group having from 1 to 20 carbon atoms and an aromatic hydrocarbon group having from 6 to 25 carbon atoms, from the viewpoint of the solubility and the heat resistance of the compound. Also preferred is absence of the substituent from the viewpoint of the stability of the compound.

Concretely, the saturated hydrocarbon group having from 1 to 20 carbon atoms includes a methyl group, an ethyl group, a propyl group, an isopropyl group, a butyl group, an iso-butyl group, a sec-butyl group, a tert-butyl group, a hexyl group, an octyl group, a cyclohexyl group, a decyl group, an octadecyl group, etc. Of those, preferred are a methyl group, an ethyl group and an isopropyl group from the viewpoint of the availability and the inexpensiveness of the starting materials for the compound; and more preferred are a methyl group and an ethyl group.

The monovalent aromatic hydrocarbon group having from 6 to 25 carbon atoms includes a phenyl group, a naphthyl group such as a 1-naphthyl group, a 2-naphthyl group, etc.; a phenanthyl group such as a 9-phenanthyl group, a 3-phenanthyl group, etc.; an anthryl group such as a 1-anthryl group, a 2-anthryl group, a 9-anthryl group, etc.; a naphthacenyl group such as a 1-naphthacenyl group, a 2-naphthacenyl group, etc.; a chrysenyl group such as a 1-chrysenyl group, a 2-chrysenyl group, a 3-chrysenyl group, a 4-chrysenyl group, a 5-chrysenyl group, a 6-chrysenyl group, etc.; a pyrenyl group such as a 1-pyrenyl group, etc.; a triphenylenyl group such as a 1-triphenylenyl group, etc.; a coronenyl group such as a 1-coronenyl group, etc.; a biphenyl group such as a 4-biphenyl group, a 3-biphenyl group, etc.; a group having a fluoranthene ring; a group having a fluorene ring; a group having an acenaphthene ring; a substituent having a benzopyrene ring, etc. Of those, preferred is a phenyl group, a 2-naphthyl group and a 3-biphenyl group from the viewpoint of the stability of the compound; and more preferred is a phenyl group from the viewpoint of the easiness in purifying the compound.

The aromatic heterocyclic group having from 3 to 20 carbon atoms includes a thienyl group such as a 2-thienyl group, etc.; a furyl group such as a 2-furyl group, etc.; an imidazolyl group such as a 2-imidazolyl group, etc.; a carbazolyl group such as a 9-carbazolyl group, etc.; a pyridyl group such as a 2-pyridyl group, etc.; a triazinyl group such as a 1,3,5-triazin-2-yl group, etc. Above all, preferred is a carbazoyl group and more preferred is a 9-carbazoyl group from the viewpoint of the stability of the compound.

The diarylamino group having from 12 to 60 carbon atoms includes a diphenylamino group, an N-1-naphthyl-N-phenylamino group, an N-2-naphthyl-N-phenylamino group, an N-9-phenanthryl-N-phenylamino group, an N-(biphenyl-4-yl)-N-phenylamino group, a bis(biphenyl-4-yl)amino group, etc. Above all, preferred are a diphenylamino group, an N-1-naphthyl-N-phenylamino group and an N-2-naphthyl-N-phenylamino group, and more preferred is a diphenylamino group from the viewpoint of the stability of the compound.

The alkyloxy group having from 1 to 20 carbon atoms includes a methoxy group, an ethoxy group, an isopropyloxy group, a cyclohexyloxy group, an octadecyloxy group, etc.

As the (hetero)aryloxy group having from 3 to 20 carbon atoms, there may be mentioned a substituent having an aryloxy group such as a phenoxy group, a 1-naphthyloxy group, a 9-anthranyloxy group or the like, or a heteroaryloxy group such as a 2-thienyloxy group, etc.

The alkylthio group having from 1 to 20 carbon atoms includes a methylthio group, an ethylthio group, an isopropylthio group, a cyclohexylthio group, etc.

The (hetero)arylthio group having from 3 to 20 carbon atoms includes an arylthio group such as a phenylthio group, a 1-naphthylthio group, a 9-anthranylthio group, etc.; and a heteroarylthio group such as a 2-thienylthio group, etc.

In the light-emitting layer, one alone or two or more different kinds of electron transport materials may be used either singly or as combined in any desired manner and in any desired ratio.

Preferably, the hole transport material is a compound having a hole-transporting unit. The hole-transporting unit (hole transport unit) is a structure (unit) excellent in resistance to holes and having hole transportability.

The hole transport unit in the present invention means a unit that has an ionization potential at which the unit can readily take out holes from the layer on the anode side of the light-emitting layer and that is stable to holes.

The ionization potential at which the unit can readily take out holes from the layer on the anode side of the light-emitting layer is generally 6.3 eV or less, preferably 5.9 eV or less, more preferably 5.8 eV or less, even more preferably 5.7 eV or less, and is generally 5.3 eV or more, preferably 5.4 eV or more, more preferably 5.5 eV or more, even more preferably 5.6 eV or more.

The condition stable to holes means that the hole transport unit is hardly decomposed even in a radial state. This means that radical cations are non-localized and therefore the unit is stabilized even in a radical state.

The structure of the unit having the above-mentioned property includes a structure containing a hetero atom with an sp$^3$ orbital, or an aromatic condensed ring having a carbon number of 4n, etc.

Examples of the hole transport unit are mentioned below, to which, however, the unit is not limited.

Concretely, the hole transport unit includes a carbazole ring, a phthalocyanine ring, a naphthalocyanine structure, a porphyrin structure, a triarylamine structure, a triaryl phosphine structure, a benzofuran ring, a dibenzofuran ring, a pyrene ring, a phenylenediamine structure, a pyrrole ring, a benzidine structure, an aniline structure, a diarylamine structure, an imidazolidinone structure, a pyrazole ring, etc. Of those, preferred are a carbazole ring, a benzofuran ring, a dibenzofuran ring, a pyrene ring and a triarylamine structure, from the viewpoint that the compound has excellent stability to holes and has high hole transportability, more preferred are a carbazole ring, a benzofuran ring, a dibenzofuran ring and a pyrene ring, and even more preferred are a carbazole ring and a pyrene ring.

As the hole transport material, more preferred are organic compounds having a derivative of the ring listed in the following group (a) (hole transport units), from the viewpoint of high stability to electrons and high electron transportability thereof.

[Chem. 25]

<Group (a)>

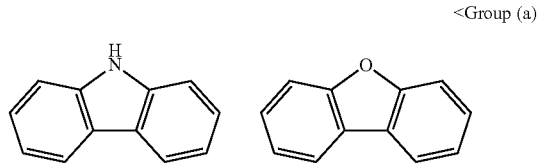

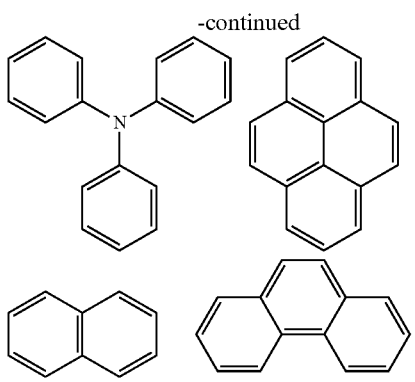

These ring structures may have a substituent, and the preferred substituent includes a halogen atom, and an alkyl group having from 1 to 10 carbon atoms, an alkenyl group having from 2 to 10 carbon atoms and a monovalent aromatic hydrocarbon ring group having from 6 to 30 carbon atoms, which may further have a substituent, etc.

More concretely, as examples of a low-molecular-weight hole transport material, there are mentioned aromatic amine compounds having at least two tertiary amines and having at least two condensed aromatic rings on the nitrogen atoms therein, such as typically 4,4'-bis[N-(1-naphthyl)-N-phenylamino]biphenyl (JP-A 5-234681); aromatic amine compounds having a starburst structure such as 4,4',4''-tris(1-naphthylphenylamino)triphenylamine, etc. (Journal of Luminescence, 1997, Vol. 72-74, p. 985); aromatic amine compounds comprising a triphenylamine tetramer (Chemical Communications, 1996, p. 2175); fluorene compounds such as 2,2',7,7'-tetrakis-(diphenylamino)-9,9'-spirobifluorene, etc. (Synthetic Metals, 1997, Vol. 91, p. 209), etc.

Structures of more preferred hole transport materials are shown below.

[Chem. 26]

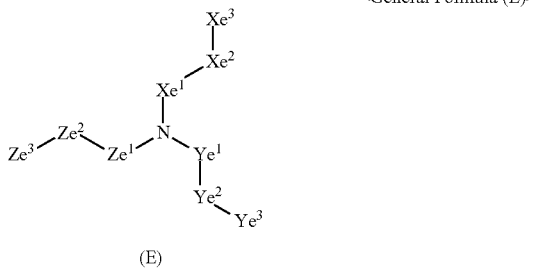

<General Formula (E)>

(E)

(In the above general formula (E), $Xe^1$, $Xe^2$, $Ye^1$, $Ye^2$, $Ze^1$ and $Ze^2$ each independently represent an aromatic hydrocarbon group having from 6 to 30 carbon atoms and optionally having a substituent, or an aromatic heterocyclic group having from 3 to 30 carbon atoms and optionally having a substituent; $Xe^3$, $Ye^3$ and $Ze^3$ each independently represent a hydrogen atom, an aromatic hydrocarbon group having from 6 to 30 carbon atoms and optionally having a substituent, or an aromatic heterocyclic group having from 3 to 30 carbon atoms and optionally having a substituent.)

$Xe^1$, $Xe^2$, $Ye^1$, $Ye^2$, $Ze^1$ and $Ze^2$ in the above general formula (E) each independently represent an aromatic hydrocarbon group having from 6 to 30 carbon atoms and optionally having a substituent, or an aromatic heterocyclic group having from 3 to 30 carbon atoms and optionally having a substituent. Above all, preferred is an aromatic hydrocarbon group having from 6 to 30 carbon atoms and optionally having a substituent, from the viewpoint of the stability of the compounds.

The aromatic hydrocarbon ring to form the aromatic hydrocarbon group having from 6 to 30 carbon atoms and optionally having a substituent is preferably a 6-membered monocyclic ring, or a 2 to 5-condensed ring thereof. Concretely mentioned are a benzene ring, a naphthalene ring, an anthracene ring, a phenanthrene ring, a perylene ring, a tetracene ring, a pyrene ring, a benzopyrene ring, a chrysene ring, a triphenylene ring, and a fluoranthene ring. Above all, preferred is a benzene ring from the viewpoint of the stability and the solubility of the compound.

Preferably, at least one of $Xe^1$, $Xe^2$, $Ye^1$, $Ye^2$, $Ze^1$ and $Ze^2$ in the above general formula (E) is a 1,2-phenylene group or a 1,3-phenylene group, more preferably a 1,3-phenylene group. Even more preferably at least two of any one of $Xe^1$ and $Xe^2$, any one of $Ye^1$ and $Ye^2$, and any one of $Ze^1$ and $Ze^2$ is a 1,2-phenylene group or a 1,3-phenylene group, most preferably a 1,3-phenylene group.

As the aromatic heterocyclic ring to form the aromatic heterocyclic group having from 3 to 30 carbon atoms and optionally having a substituent, preferred is a 5- or 6-membered monocyclic ring, or a 2 to 5-condensed ring of those rings. Concretely mentioned are a furan ring, a benzofuran ring, a dibenzofuran ring, a thiophene ring, a benzothiophene ring, a dibenzothiophene ring, a pyrrole ring, a pyrazole ring, an imidazole ring, an oxadiazole ring, an indole ring, a carbazol ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a perimidine ring, a quinazoline ring, and a quinazolinone ring. Above all, preferred are a carbazole ring, a dibenzofuran ring and a dibenzothiophene ring, from the viewpoint of the high stability of the compound and of the high charge transportability thereof; and also preferred are a pyridine ring, a pyrimidine ring and a triazine ring from the viewpoint of the high electron transportability of the compound.

$Xe^3$, $Ye^3$ and $Ze^3$ in the above general formula (E) each independently represent a hydrogen atom, an aromatic hydrocarbon group having from 6 to 30 carbon atoms and optionally having a substituent, or an aromatic heterocyclic group having from 3 to 30 carbon atoms and optionally having a substituent.

The aromatic hydrocarbon ring to form the aromatic hydrocarbon group having from 6 to 30 carbon atoms and optionally having a substituent is preferably a 6-membered monocyclic ring, or a 2 to 5-condensed ring thereof. Concretely mentioned here are the groups to be derived from the same rings as those mentioned hereinabove for $Xa^1$ and others in the general formula (A). Preferred are a benzene ring, a naphthalene ring and a phenanthrene ring from the viewpoint of the stability of the compound.

As the aromatic heterocyclic ring to form the aromatic heterocyclic group having from 3 to 30 carbon atoms and optionally having a substituent, preferred is a 5- or 6-membered monocyclic ring, or a 2 to 5-condensed ring of those rings. Concretely mentioned are the same rings as those mentioned hereinabove for $Xa^1$ and others in the general formula (A). Above all, preferred are groups derived from a carbazole ring, a dibenzofuran ring and a dibenzothiophene ring from the viewpoint of the high stability of the compound and of the high charge transferability thereof.

The three substituents, -$Xe^1$-$Xe^2$-$Xe^3$, -$Ye^1$-$Ye^2$-$Ye^3$ and -$Ze^1$-$Ze^2$-$Ze^3$ bonding to N in the above general formula (E) may be the same or different. Preferably at least one differs from the others from the viewpoint of increasing the solubility in solvent by depressing the symmetricity of the compound.

The substituent that the aromatic hydrocarbon group or the aromatic heterocyclic group may have includes a saturated hydrocarbon group having from 1 to 20 carbon atoms, an aromatic hydrocarbon group having from 6 to 25 carbon atoms, an aromatic heterocyclic group having from 3 to 20 carbon atoms, a diarylamino group having from 12 to 60 carbon atoms, an alkyloxy group having from 1 to 20 carbon atoms, a (hetero)aryloxy group having from 3 to 20 carbon atoms, an alkylthio group having from 1 to 20 carbon atoms, a (hetero)arylthio group having from 3 to 20 carbon atoms, a cyano group, etc. Of those, preferred are a saturated hydrocarbon group having from 1 to 20 carbon atoms and an aromatic hydrocarbon group having from 6 to 25 carbon atoms, from the viewpoint of the solubility and the heat resistance of the compound. Also preferred is absence of the substituent from the viewpoint of the stability of the compound.

Concretely, the saturated hydrocarbon group having from 1 to 20 carbon atoms includes a methyl group, an ethyl group, a propyl group, an isopropyl group, a butyl group, an iso-butyl group, a sec-butyl group, a tert-butyl group, a hexyl group, an octyl group, a cyclohexyl group, a decyl group, an octadecyl group, etc. Of those, preferred are a methyl group, an ethyl group and an isopropyl group from the viewpoint of the availability and the inexpensiveness of the starting materials for the compound; and more preferred are a methyl group and an ethyl group.

The monovalent aromatic hydrocarbon group having from 6 to 25 carbon atoms includes a phenyl group, a naphthyl group such as a 1-naphthyl group, a 2-naphthyl group, etc.; a phenanthyl group such as a 9-phenanthyl group, a 3-phenanthyl group, etc.; an anthryl group such as a 1-anthryl group, a 2-anthryl group, a 9-anthryl group, etc.; a naphthacenyl group such as a 1-naphthacenyl group, a 2-naphthacenyl group, etc.; a chrysenyl group such as a 1-chrysenyl group, a 2-chrysenyl group, a 3-chrysenyl group, a 4-chrysenyl group, a 5-chrysenyl group, a 6-chrysenyl group, etc.; a pyrenyl group such as a 1-pyrenyl group, etc.; a triphenylenyl group such as a 1-triphenylenyl group, etc.; a coronenyl group such as a 1-coronenyl group, etc.; a biphenyl group such as a 4-biphenyl group, a 3-biphenyl group, etc.; a group having a fluoranthene ring; a group having a fluorene ring; a group having an acenaphthene ring; a substituent having a benzopyrene ring, etc. Of those, preferred is a phenyl group, a 2-naphthyl group and a 3-biphenyl group from the viewpoint of the stability of the compound; and more preferred is a phenyl group from the viewpoint of the easiness in purifying the compound.

The aromatic heterocyclic group having from 3 to 20 carbon atoms includes a thienyl group such as a 2-thienyl group, etc.; a furyl group such as a 2-furyl group, etc.; an imidazolyl group such as a 2-imidazolyl group, etc.; a carbazolyl group such as a 9-carbazolyl group, etc.; a pyridyl group such as a 2-pyridyl group, etc.; a triazinyl group such as a 1,3,5-triazin-2-yl group, etc. Above all, preferred is a carbazoyl group and more preferred is a 9-carbazoyl group from the viewpoint of the stability of the compound.

The diarylamino group having from 12 to 60 carbon atoms includes a diphenylamino group, an N-1-naphthyl-N-phenylamino group, an N-2-naphthyl-N-phenylamino group, an N-9-phenanthryl-N-phenylamino group, an N-(biphenyl-4-yl)-N-phenylamino group, a bis(biphenyl-4-yl) amino group, etc. Above all, preferred are a diphenylamino group, an N-1-naphthyl-N-phenylamino group and an N-2-naphthyl-N-phenylamino group, and more preferred is a diphenylamino group from the viewpoint of the stability of the compound.

The alkyloxy group having from 1 to 20 carbon atoms includes a methoxy group, an ethoxy group, an isopropyloxy group, a cyclohexyloxy group, an octadecyloxy group, etc.

As the (hetero)aryloxy group having from 3 to 20 carbon atoms, there may be mentioned a substituent having an aryloxy group such as a phenoxy group, a 1-naphthyloxy group, a 9-anthranyloxy group or the like, or a heteroaryloxy group such as a 2-thienyloxy group, etc.

The alkylthio group having from 1 to 20 carbon atoms includes a methylthio group, an ethylthio group, an isopropylthio group, a cyclohexylthio group, etc.

The (hetero)arylthio group having from 3 to 20 carbon atoms includes an arylthio group such as a phenylthio group, a 1-naphthylthio group, a 9-anthranylthio group, etc.; and a heteroarylthio group such as a 2-thienylthio group, etc.

In the light-emitting layer, one alone or two or more different kinds of hole transport materials may be used either singly or as combined in any desired manner and in any desired ratio.

As the charge transport material to be combined with a fluorescent light-emitting material, the following examples are mentioned.

[Chem. 27]

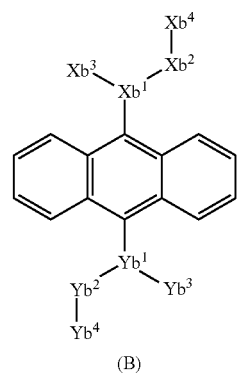

General Formula (B)

(B)

(In the above general formula (B), $Xb^1$, $Xb^2$, $Yb^1$ and $Yb^2$ each independently represent an aromatic hydrocarbon group having from 6 to 30 carbon atoms and optionally having a substituent, or an aromatic heterocyclic group having from 3 to 30 carbon atoms and optionally having a substituent; $Xb^3$, $Xb^4$, $Yb^3$ and $Yb^4$ each independently represent a hydrogen atom, an aromatic hydrocarbon group having from 6 to 30 carbon atoms and optionally having a substituent, or an aromatic heterocyclic group having from 3 to 30 carbon atoms and optionally having a substituent.)

[Chem. 28]

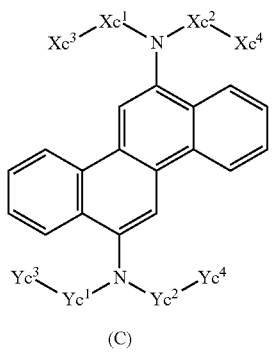

General Formula (C)

(In the above general formula (C), $Xc^1$, $Xc^2$, $Yc^1$ and $Yc^2$ each independently represent an aromatic hydrocarbon group having from 6 to 30 carbon atoms and optionally having a substituent, or an aromatic heterocyclic group having from 3 to 30 carbon atoms and optionally having a substituent; $Xc^3$, $Xc^4$, $Yc^3$ and $Yc^4$ each independently represent a hydrogen atom, an aromatic hydrocarbon group having from 6 to 30 carbon atoms and optionally having a substituent, or an aromatic heterocyclic group having from 3 to 30 carbon atoms and optionally having a substituent.)

$Xb^1$, $Xb^2$, $Yb^1$ and $Yb^2$ in the above general formula (B) and $Xc^1$, $Xc^2$, $Yc^1$ and $Yc^2$ in the above general formula (C) each independently represent an aromatic hydrocarbon group having from 6 to 30 carbon atoms and optionally having a substituent, or an aromatic heterocyclic group having from 3 to 30 carbon atoms and optionally having a substituent. Above all, preferred is an aromatic hydrocarbon group having from 6 to 30 carbon atoms and optionally having a substituent from the viewpoint of the stability of the compounds.

The aromatic hydrocarbon ring to form the aromatic hydrocarbon group having from 6 to 30 carbon atoms and optionally having a substituent is preferably a 6-membered monocyclic ring, or a 2 to 5-condensed ring thereof. Concretely mentioned are a benzene ring, a naphthalene ring, an anthracene ring, a phenanthrene ring, a perylene ring, a tetracene ring, a pyrene ring, a benzopyrene ring, a chrysene ring, a triphenylene ring, and a fluoranthene ring. Above all, preferred is a benzene ring from the viewpoint of the stability and the solubility of the compounds.

As the aromatic heterocyclic ring to form the aromatic heterocyclic group having from 3 to 30 carbon atoms and optionally having a substituent, preferred is a 5- or 6-membered monocyclic ring, or a 2 to 5-condensed ring of those rings. Concretely mentioned are a furan ring, a benzofuran ring, a dibenzofuran ring, a thiophene ring, a benzothiophene ring, a dibenzothiophene ring, a pyrrole ring, a pyrazole ring, an imidazole ring, an oxadiazole ring, an indole ring, a carbazol ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a perimidine ring, a quinazoline ring, and a quinazolinone ring. Above all, preferred are a carbazole ring, a dibenzofuran ring and a dibenzothiophene ring, from the viewpoint of the high stability of the compounds and of the high charge transportability thereof.

$Xb^3$, $Xb^4$, $Yb^3$ and $Yb^4$ in the above general formula (B) and $Xc^3$, $Xc^4$, $Yc^3$ and $Yc^4$ in the above general formula (C) each independently represent a hydrogen atom, an aromatic hydrocarbon group having from 6 to 30 carbon atoms and optionally having a substituent, or an aromatic heterocyclic group having from 3 to 30 carbon atoms and optionally having a substituent.

The aromatic hydrocarbon ring to form the aromatic hydrocarbon group having from 6 to 30 carbon atoms and optionally having a substituent is preferably a 6-membered monocyclic ring, or a 2 to 5-condensed ring thereof. Concretely mentioned here are the groups to be derived from the same rings as those mentioned hereinabove for $Xb^1$ and others in the general formula (B). Preferred are a benzene ring, a naphthalene ring and a phenanthrene ring from the viewpoint of the stability of the compounds.

As the aromatic heterocyclic ring to form the aromatic heterocyclic group having from 3 to 30 carbon atoms and optionally having a substituent, preferred is a 5- or 6-membered monocyclic ring, or a 2 to 5-condensed ring of those rings. Concretely mentioned are the same rings as those mentioned hereinabove for $Xb^1$ and others in the general formula (B). Above all, preferred are groups derived from a carbazole ring, a dibenzofuran ring and a dibenzothiophene ring from the viewpoint of the high stability of the compounds and of the high charge transferability thereof.

The substituent that the aromatic hydrocarbon group or the aromatic heterocyclic group may have includes a saturated hydrocarbon group having from 1 to 20 carbon atoms, an aromatic hydrocarbon group having from 6 to 25 carbon atoms, an aromatic heterocyclic group having from 3 to 20 carbon atoms, a diarylamino group having from 12 to 60 carbon atoms, an alkyloxy group having from 1 to 20 carbon atoms, a (hetero)aryloxy group having from 3 to 20 carbon atoms, an alkylthio group having from 1 to 20 carbon atoms, a (hetero)arylthio group having from 3 to 20 carbon atoms, a cyano group, etc. Of those, preferred are a saturated hydrocarbon group having from 1 to 20 carbon atoms and an aromatic hydrocarbon group having from 6 to 25 carbon atoms, from the viewpoint of the solubility and the heat resistance of the compounds.

Concretely, the saturated hydrocarbon group having from 1 to 20 carbon atoms includes a methyl group, an ethyl group, a propyl group, an isopropyl group, a butyl group, an iso-butyl group, a sec-butyl group, a tert-butyl group, a hexyl group, an octyl group, a cyclohexyl group, a decyl group, an octadecyl group, etc. Of those, preferred is a saturated hydrocarbon group having from 1 to 6 carbon atoms from the viewpoint of the structure stability of the compounds.

The monovalent aromatic hydrocarbon group having from 6 to 25 carbon atoms includes a phenyl group, a naphthyl group such as a 1-naphthyl group, a 2-naphthyl group, etc.; a phenanthyl group such as a 9-phenanthyl group, a 3-phenanthyl group, etc.; an anthryl group such as a 1-anthryl group, a 2-anthryl group, a 9-anthryl group, etc.; a naphthacenyl group such as a 1-naphthacenyl group, a 2-naphthacenyl group, etc.; a chrysenyl group such as a 1-chrysenyl group, a 2-chrysenyl group, a 3-chrysenyl group, a 4-chrysenyl group, a 5-chrysenyl group, a 6-chrysenyl group, etc.; a pyrenyl group such as a 1-pyrenyl group, etc.; a triphenylenyl group such as a 1-triphenylenyl group, etc.; a coronenyl group such as a 1-coronenyl group, etc.; a biphenyl group such as a 4-biphenyl group, a 3-biphenyl group, etc.; a group having a fluoranthene ring; a group having a fluorene ring; a group having an acenaphthene ring; a substituent having a benzopyrene ring, etc. Of those, preferred is a phenyl group, a 2-naphthyl group and a 3-biphenyl group from the viewpoint of the stability of the compounds; and more preferred is a phenyl group from the viewpoint of the easiness in purifying the compounds.

The aromatic heterocyclic group having from 3 to 20 carbon atoms includes a thienyl group such as a 2-thienyl group, etc.; a furyl group such as a 2-furyl group, etc.; an imidazolyl group such as a 2-imidazolyl group, etc.; a carbazolyl group such as a 9-carbazolyl group, etc.; a pyridyl group such as a 2-pyridyl group, etc.; a triazinyl group such as a 1,3,5-triazin-2-yl group, etc. Above all, preferred is a carbazoyl group and more preferred is a 9-carbazoyl group from the viewpoint of the stability of the compounds.

The diarylamino group having from 12 to 60 carbon atoms includes a diphenylamino group, an N-1-naphthyl-N-phenylamino group, an N-2-naphthyl-N-phenylamino group, an N-9-phenanthryl-N-phenylamino group, an N-(biphenyl-4-yl)-N-phenylamino group, a bis(biphenyl-4-yl) amino group, etc. Above all, preferred are a diphenylamino group, an N-1-naphthyl-N-phenylamino group and an N-2-naphthyl-N-phenylamino group, and more preferred is a diphenylamino group from the viewpoint of the stability of the compounds.

The alkyloxy group having from 1 to 20 carbon atoms includes a methoxy group, an ethoxy group, an isopropyloxy group, a cyclohexyloxy group, an octadecyloxy group, etc.

As the (hetero)aryloxy group having from 3 to 20 carbon atoms, there may be mentioned a substituent having an aryloxy group such as a phenoxy group, a 1-naphthyloxy group, a 9-anthranyloxy group or the like, or a heteroaryloxy group such as a 2-thienyloxy group, etc.

The alkylthio group having from 1 to 20 carbon atoms includes a methylthio group, an ethylthio group, an isopropylthio group, a cyclohexylthio group, etc.

The (hetero)arylthio group having from 3 to 20 carbon atoms includes an arylthio group such as a phenylthio group, a 1-naphthylthio group, a 9-anthranylthio group, etc.; and a heteroarylthio group such as a 2-thienylthio group, etc.

<Molecular Weight>

Not markedly detracting from the advantageous effects of the present invention, the molecular weight of the charge transport material for use in the invention is not specifically defined. The molecular weight of the charge transport material for use in the present invention is preferably 10000 or less, more preferably 5000 or less, even more preferably 4000 or less, still more preferably 3000 or less. In general, the molecular weight of the charge transport material in the present invention is 100 or more, preferably 200 or more, more preferably 300 or more, even more preferably 400 or more.

The charge transport material of which the molecular weight falls within the above-mentioned range is preferred from the viewpoint that the glass transition temperature, the melting point and the decomposition temperature thereof could be high and the light-emitting layer material and the light-emitting layer formed of the material could have excellent heat resistance and from the viewpoint that the film quality degradation owing to recrystallization or molecule migration as well as the impurity concentration increase to be caused by thermal decomposition of material may hardly occur, and therefore the device performance is excellent and the material of the type is easy to purify.

<Electron Affinity (EA)>

The light-emitting layer may contain one alone or two or more different kinds of the above-mentioned charge transport materials, but in the present invention, the light-emitting layer contains 5 types or more of charge transport materials and light-emitting materials.

In case where the light-emitting layer contains two or more kinds of charge transport materials, it is desirable that EA of the charge transport material mainly playing a role of electron transport (electron transport material) is larger than EA of the charge transport material mainly playing a role of hole transport (hole transport material). Specifically, in general, when multiple charge transport materials are contained in one and the same layer, EA could readily ride on the material having a larger EA, and therefore in such a case, when the charge transport material having a large EA is an electron transport material, then a long-life device having a high luminescent efficiency can be produced.

The absolute value of EA, |EA|, of the charge transport material that plays a role of electron transport in the light-emitting layer in the present invention is preferably larger from the viewpoint that the compound could be in a stable state when electrons exists therein at the energy level for electron transport, but is, on the other hand, smaller from the viewpoint that charge transport and transfer as well as exciton formation could hardly be interfered with by formation of stable radical anions. Concretely, |EA| is preferably 2.40 eV or more, more preferably 2.50 eV or more, and is, on the other hand, preferably 3.30 eV or less, more preferably 3.20 eV or less.

Almost the following tendency could be admitted between the chemical structure and |EA| of the charge transport material. For example, materials having an aromatic 6-membered monocycle in the center thereof tend to have a larger |EA| in the order of benzene ring (0 hetero atom)<pyridine ring (1 hetero atom)<pyrimidine ring (2 hetero atoms)<triazine ring (3 hetero atoms) of the center ring. Materials having a condensed ring of aromatic rings having the same structure tends to have a larger |EA| in the order of benzene ring (monocycle)<naphthalene ring (2-condensed ring)<anthracene ring (3-condensed ring) <chrysene ring (4-condensed ring).

Preferably, the light-emitting layer in the present invention contains the charge transport material generally in an amount of 65% by weight or more, preferably 70% by weight or more, more preferably 75% by weight or more. Also preferably, the layer contains the charge transport material generally in an amount of 99.99% by weight or less, preferably 99.95% by weight or less, more preferably 99.9% by weight or less. In case where two or more different kinds of charge transport materials are used here, it is desirable that the total content of the materials falls within the above-mentioned range.

{Formation of Light-Emitting Layer}

Preferably, the light-emitting layer in the present invention is formed according to a wet film formation method since the material use efficiency is high and since the layer formed could suitably mix with the hole transport layer formed on the anode side thereof to thereby facilitate hole injection.

In the present invention, the wet film formation method means a method of film formation according to a wet coating process of, for example, a spin coating method, a dip coating method, a die coating method, a bar coating method, a blade coting method, a roll coating method, a spray coating method, a capillary coating method, an inkjet method, a nozzle printing method, a screen printing method, a gravure coating method, a flexographic coating method or the like, followed by drying the coating film for the intended film formation. Of the film formation method, preferred is a spin coating method, a spray coating method, an inkjet method, a nozzle printing method or the like.

In case where the light-emitting layer is formed according to the wet film formation method, in general, the above-mentioned light-emitting material and charge transport material and the other optional materials to be mentioned below are dissolved in a suitable solvent to prepare a composition for light-emitting layer formation, and the composition is used for film formation for the layer.

Not specifically defined, the solvent for use in the wet film formation method for the light-emitting layer may be any and every solvent capable of well dissolving or dispersing the materials for use for formation of the light-emitting layer such as the light-emitting material, the charge transport material, etc.

Regarding the solubility of the solvent, it is desirable that the solvent can dissolve the light-emitting material and the charge transport material each in an amount of generally at least 0.01% by weight, preferably at least 0.05% by weight, more preferably at least 0.1% by weight, at 25° C. and under 1 atmospheric pressure.

Specific examples of the solvent are mentioned below; however, not detracting from the advantageous effects of the present invention, the solvent is not limited to these.

The solvent includes, for example, alkanes such as n-decane, cyclohexane, ethylcyclohexane, decalin, bicyclohexane, etc.; aromatic hydrocarbons such as toluene, xylene, mesitylene, cyclohexylbenzene, tetramethylcyclohexanone, tetralin, etc.; halogenoaromatic hydrocarbons such as chlorobenzene, dichlorobenzene, trichlorobenzene, etc.; aromatic ethers such as 1,2-dimethoxybenzene, 1,3-dimethoxybenzene, anisole, phenetol, 2-methoxytoluene, 3-methoxytoluene, 4-methoxytoluene, 2,3-dimethylanisole, 2,4-dimethylanisole, diphenyl ether, etc.; aromatic esters such as phenyl acetate, phenyl propionate, methyl benzoate, ethyl benzoate, propyl benzoate, n-butyl benzoate, etc.; alicyclic ketones such as cyclohexanone, cyclooctanone, fenchone, etc.; alicyclic alcohols such as cyclohexanol, cyclooctanol, etc.; aliphatic ketones such as methyl ethyl ketone, dibutyl ketone, etc.; aliphatic alcohols such as butanol, hexanol, etc.; aliphatic ethers such as ethylene glycol dimethyl ether, ethylene glycol diethyl ether, propylene glycol 1-monomethyl ether acetate (PGMEA), etc.

Above all, alkanes and aromatic hydrocarbons are preferred as the solvent.

One alone or two or more different kinds of those solvents may be used here either singly or as combined in any desired manner and in any desired ratio.

For obtaining a more uniform film, it is desirable that the solvent could evaporate away from the liquid film at a suitable speed just after the film formation. Accordingly, it is desirable that the boiling point of the solvent is generally 80° C. or higher, preferably 100° C. or higher, more preferably 120° C. or higher. It is also desirable that the boiling point of the solvent is generally 270° C. or lower, preferably 250° C. or lower, more preferably 230° C. or lower.

[Composition for Formation of Light-Emitting Layer]

It is desirable that the composition for formation of the light-emitting layer in the present invention contains the light-emitting material in an amount of generally 0.01% by weight or more, preferably 0.05% by weight or more, more preferably 0.1% by weight or more. It is also desirable that the composition contains the light-emitting material generally in an amount of 10% by weight or less, preferably 7% by weight or less, more preferably 5% by weight or less. In case where the composition contains two or more different kinds of light-emitting materials, preferably, the total amount of those materials therein falls within the above-mentioned range.

It is desirable that the composition for formation of the light-emitting layer in the present invention contains the charge transport material in an amount of generally 0.1% by weight or more, preferably 0.5% by weight or more, more preferably 1% by weight or more. It is also desirable that the composition contains the charge transport material generally in an amount of 20% by weight or less, preferably 15% by weight or less, more preferably 10% by weight or less. In case where two or more different kinds of charge transport materials are used for formation of the light-emitting layer, preferably, the total amount of those materials to be used falls within the above-mentioned range.

It is desirable that the ratio of the content of the light-emitting material to that of the charge transport material in the composition for formation of the light-emitting layer (ratio by weight of light-emitting material/charge transport material) is generally 0.01 or more, preferably 0.03 or more. It is also desirable that the ratio of the content of the light-emitting material to that of the charge transport material in the composition for formation of the light-emitting layer (ratio by weight of light-emitting material/charge transport material) is generally 0.05 or less, preferably 0.3 or less.

The content of the solvent in the composition for formation of the light-emitting layer in the present invention is not specifically defined, not markedly detracting from the advantageous effects of the present invention. When the content of the solvent in the composition for formation of the light-emitting layer is large, then it is advantageous since the viscosity of the composition is low and the workability thereof in film formation is good. On the other hand, when the content of the solvent is small, then it is also desirable since the thickness of the film to be formed after solvent removal after the film formation could be reduced relative to the amount of the composition used for the film formation and the film formation is easy. Concretely, the content of the solvent is preferably 10 parts by weight or more, more preferably 50 parts by weight or more, even more preferably 80 parts by weight or more relative to 100 parts by weight of the composition for formation of the light-emitting layer. Also preferably, the content of the solvent is 99.95 parts by weight or less, more preferably 99.9 parts by weight or less, even more preferably 99.8 parts by weight or less. In case where two or more different kinds of solvents are used as mixed in the composition for formation of the light-emitting layer, preferably, the total content of those solvents falls within the range.

For improving the film formability thereof, the composition for formation of the light-emitting layer in the present invention may contain various additives such as a leveling agent, a defoaming agent, etc.

The solid concentration of the total content of the light-emitting material, the hole transport material and the electron transport material in the composition for formation of the light-emitting layer in the present invention is preferably smaller from the viewpoint of securing uniform film thickness; but on the other hand, the solid concentration is preferably larger from the viewpoint of preventing film defects. Concretely, in general, the solid concentration is from 0.01% by weight or more and is 70% by weight or less.

The light-emitting layer may be formed typically by applying the light-emitting layer forming composition onto the layer to be the underlying layer (in general, the hole injection layer or the hole transport layer to be mentioned hereinunder) below the light-emitting layer to be formed thereon, according to a dry film formation method, and thereafter drying the formed coating film to remove the solvent.

{Film Thickness}

Not markedly detracting from the advantageous effects of the present invention, the thickness of the light-emitting layer is not specifically defined. Preferably, the layer is thicker from the viewpoint of preventing film defects, but on the other hand, the layer is preferably thinner from the viewpoint of depressing the driving voltage. Concretely, in general, the thickness is 3 nm or more, preferably 5 nm or more, and is generally 200 nm or less, preferably 100 nm or less.

The organic electroluminescent element may have two or more such light-emitting layers. In case where the element has two or more light-emitting layers, the condition of each layer is as mentioned above.

When two or more light-emitting layers are provided in the element, any of the layers may be good to satisfy the requirement in the present invention.

[Layer Configuration and Method for Formation of Organic Electroluminescent Element]

One example of the embodiment of the layer configuration of the organic electroluminescent element of the present invention and a typical formation method for the element are described below with reference to FIG. 1.

FIG. 1 is a schematic view of a cross section that shows a configuration example of an organic electroluminescent element 10 of the present invention. In FIG. 1, 1 is a substrate, 2 is an anode, 3 is a hole injection layer, 4 is a hole transport layer, 5 is a light-emitting layer, 6 is a hole block layer, 7 is an electron transport layer, 8 is an electron injection layer, 9 is a cathode.

Specifically, the organic electroluminescent element of the present invention has an anode, a light-emitting layer and a cathode as the indispensable configuration therein, but if desired, the element may have any other functional layer between the anode and the light-emitting layer and between the cathode and the light-emitting layer, as shown in FIG. 1.

[Substrate]

The substrate 1 is to be a support of the organic electroluminescent element. As the substrate 1, usable are plates of quartz or glass, metal plates, metal foils, plastic films, sheets, etc. Especially preferred are glass plates; and transparent synthetic resin plates of polyester, polymethacrylate, polycarbonate, polysulfone, etc. In case where a synthetic resin substrate is used, it is desirable to note the gas-barrier performance thereof. Preferably, the gas-barrier performance of the substrate is higher since the organic electroluminescent element is hardly deteriorated by air that may pass through the substrate. Consequently, preferably employed here is a method that comprises providing a dense silicon oxide film or the like on at least one side of the synthetic resin substrate to secure the gas-barrier performance of the substrate.

[Anode]

The anode 2 is an electrode having a role of hole injection to the layer on the side of the light-emitting layer 5.

The anode 2 is typically formed of a metal such as aluminium, gold, silver, nickel, palladium, platinum, etc.; a metal oxide such as an oxide of at least one of indium and tin, etc.; a metal halide such as copper iodide, etc.; carbon black; a conductive polymer such as poly(3-methylthiophene), polypyrrole, polyaniline, etc.

In many cases, the anode 2 is formed typically according to a sputtering method, a vacuum evaporation method or the like. In case where the anode 2 is formed of metal fine particles of silver or the like, other fine particles of copper iodide or the like, carbon black, conductive metal oxide fine particles, conductive polymer fine powders or the like, these fine particles may be dispersed in a suitable binder resin solution and then applied onto the substrate 1 to form the anode 2 thereon. Further, when a conductive polymer is used, a thin film may be directly formed on the substrate 1 through electrolytic polymerization. In addition, a conductive polymer may be applied onto the substrate 1 to form the anode 2 thereon (Appl. Phys. Lett., Vol. 60, p. 2711, 1992).

The anode 2 typically has a single-layer structure, but if desired, may have a laminate structure formed of multiple materials.

The thickness of the anode 2 may be suitably selected depending on the necessary transparency of the element. In case where the element is required to be transparent, it is desirable that the visible light transmittance thereof is generally 60% or more, preferably 80% or more. In this case, the thickness of the anode 2 is generally 5 nm or more, preferably 10 nm or more. Also in this case, the thickness of the anode 2 is generally 1000 nm or less, preferably 500 nm or less or so. In case where the element may be nontransparent, the thickness of the anode 2 is not specifically defined. The substrate 1 additionally having the function of the anode 2 may be used here. Further, a different conductive material may be laminated on the anode 2.

For the purpose of removing the impurities adhering to the anode 2 to thereby control the ionization potential to improve the hole injection capability, the surface of the anode 2 is preferably processed for ultraviolet (UV)/ozone treatment or for oxygen plasma or argon plasma treatment.

[Hole Injection Layer]

The hole injection layer 3 is a layer for transporting holes from the anode 2 to the light-emitting layer 5. The hole injection layer 3 is not an indispensable layer in the organic electroluminescent element of the present invention, however, in case where the hole injection layer 3 is provided in the element, the hole injection layer 3 is formed generally on the anode 2.

The method for forming the hole injection layer 3 in the present invention is not specifically defined, and the layer may be formed according to a vacuum evaporation method or a wet film formation method. From the viewpoint of reducing dark spots, it is desirable that the hole injection layer 3 is formed according to a wet film formation method.

The thickness of the hole injection layer 3 is typically 5 nm or more, preferably 10 nm or more, and is typically 1000 nm or less, preferably 500 nm or less.

{Formation of Hole Injection Layer in Wet Film Formation Method}

In case where the hole injection layer 3 is formed according to a wet film formation method, in general, the materials to constitute the hole injection layer 3 are mixed with a suitable solvent (solvent for hole injection layer) to prepare a composition for film formation (composition for formation of hole injection layer), and the composition for formation of the hole injection layer 3 is applied onto the layer corresponding to the underlying layer below the hole injection layer (in general, anode 2) for film formation thereon, and then dried to form the hole injection layer 3, according to a suitable method.

<Hole Transport Material>

The composition for formation of hole injection layer generally contains, as the constitutive material of the hole injection layer 3, a hole transport material and a solvent.

In general, the hole transport material may be any high-molecular compound such as polymer or the like or any low-molecular compound such as monomer or the like, which is a compound having hole transportability for use in the hole injection layer 3 of the organic electroluminescent element. Preferably, the material is a high-molecular compound.

As the hole transport material, preferred is a compound having an ionization potential of from 4.5 eV to 6.0 eV, from the viewpoint of the charge injection barrier from the anode 2 to the hole injection layer 3. Examples of the hole transport material include aromatic amine derivatives, phthalocyanine derivatives, porphyrin derivatives, oligothiophene derivatives, polythiophene derivatives, benzylphenyl derivatives, compounds with a tertiary amine bonded via a fluorene group, hydrazine derivatives, silazane derivatives, silanamine derivatives, phosphamine derivatives, quinacridone derivatives, polyaniline derivatives, polypyrrole derivatives, polyphenylenevinylene derivatives, polythienylenevinylene derivatives, polyquinoline derivatives, polyquinoxaline derivatives, carbon, etc.

Derivatives as referred to in the present invention are as follows. Described as one example, aromatic amine derivatives include aromatic amines themselves and compounds having an aromatic amine as the main skeleton thereof, and may be either polymers or monomers.

The hole transport material for use as the material of the hole injection layer 3 may contain any one alone of those compounds, or may contain 2 or more different kinds of those compounds. In case where the layer contains two or more different kinds of such hole transport materials, the combination thereof is not specifically defined. Preferably, the layer contains one or more aromatic tertiary amine polymer compound and one or more other hole transport materials, as combined.

Of the above-exemplified ones, preferred are aromatic amine compounds from the viewpoint of the non-crystallinity and the visible light transmittance thereof, and more preferred are aromatic tertiary amine compounds. Here, the aromatic tertiary amine compounds are compounds having an aromatic tertiary amine structure and include compounds having an aromatic tertiary amine-derived group.

The aromatic tertiary amine compounds are not specifically defined in point of the type thereof, but from the viewpoint of uniform light emission owing to the surface-smoothing effect thereof, more preferred are polymer compounds having a weight-average molecular weight of 1000 or more and 1000000 or less (polymerization-type compounds with continuing recurring units). As preferred examples of the aromatic tertiary amine polymer compound, mentioned are polymer compounds having a recurring unit represented by the following formula (I).

[Chem. 29]

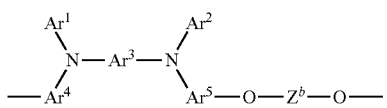

(I)

(In the formula (I), $Ar^1$ to $Ar^5$ each independently represent an aromatic ring group optionally having a substituent. $Z^b$ represents a linking group selected from the following linking groups. Of $Ar^1$ to $Ar^5$, two groups bonding to the same N atom may bond to each other to form a ring.)

[Chem. 30]

<Linking Groups>

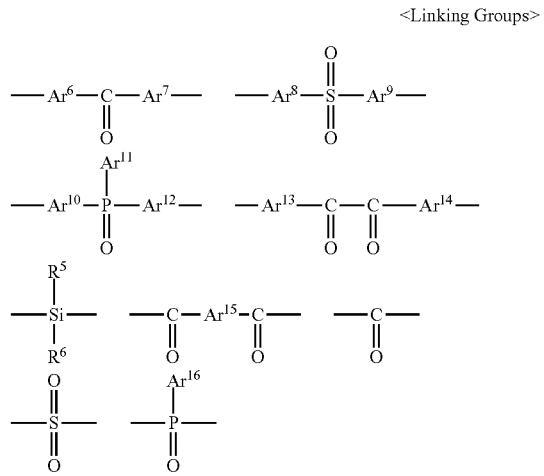

(In the above formulae, $Ar^6$ to $Ar^{16}$ each independently represent an aromatic group optionally having a substituent. $R^5$ and $R^6$ each independently represent a hydrogen atom or an arbitrary substituent.)

As the aromatic ring group for $Ar^1$ to $Ar^{16}$, preferred are groups derived from a benzene ring, a naphthalene ring, a phenanthrene ring, a thiophene ring and a pyridine ring, from the viewpoint of the solubility, heat resistance and hole injection/transport capability of the polymer compounds; and more preferred are a benzene ring and a naphthalene ring.

The aromatic ring group for $Ar^1$ to $Ar^{16}$ may further have a substituent. The molecular weight of the substituent is, in general, preferably 400 or less, more preferably 250 or less or so. As the substituent, preferred are an alkyl group, an alkenyl group, an alkoxy group, an aromatic ring group, etc.

In case where $R^5$ and $R^6$ each are a substituent, the substituent includes an alkyl group, an alkenyl group, an alkoxy group, a silyl group, a siloxy group, an aromatic ring group, etc.

As specific examples of the aromatic tertiary amine polymer compound having the recurring unit represented by the formula (I), mentioned here are those described in WO2005/089024.

As the hole transport material, also preferred is a conductive polymer (PEDOT/PSS) which is a polythiophene derivative and which is prepared through polymerization of 3,4-ethylenedioxythiophene in a high-molecular-weight polystyrenesulfonic acid. The end of the polymer may be capped with methacrylate or the like for use herein.

The hole transport material may also be a crosslinking compound to be described in the section of "hole transport layer" given below. The same as above shall apply to the film formation method using the crosslinking compound.

The concentration of the hole transport material in the composition for formation of the hole injection layer may be any one, not markedly detracting from the advantageous effects of the present invention. The concentration of the hole transport material in the composition for formation of the hole injection layer is typically 0.01% by weight or more, preferably 0.1% by weight or more, more preferably 0.5% by weight or more, from the viewpoint of the uniformity of the film thickness, but on the other hand, the concentration is typically 70% by weight or less, preferably 60% by weight or less, more preferably 50% by weight or less. The concentration is preferably smaller from the viewpoint of uniform film thickness. On the other hand, the concentration is preferably larger from the viewpoint of preventing the formed hole injection layer from having film defects.

<Electron Accepting Compound>

Preferably, the composition for formation of the hole injection layer contains an electron-accepting compound as the constitutive material of the hole injection layer 3.

The electron-accepting compound is preferably a compound having an oxidation power and having the ability to accept one electron from the above-mentioned hole transport material. Concretely, as the electron-accepting compound, preferred is a compound having an electron affinity of 4 eV or more, more preferably 5 eV or more.

As the electron-accepting compound of the type, there are mentioned one or more compounds selected from a group consisting of triarylboron compounds, metal halides, Lewis acids, organic acids, onium salts, salts of arylamine and metal halide, and salts of arylamine and Lewis acid. More concretely, the electron-accepting compounds include onium salts substituted with an organic group, such as 4-isopropyl-4'-methyldiphenyliodonium tetrakis(pentafluorophenyl)borate, triphenylsulfonium tetrafluoroborate, etc. (WO2005/089024); inorganic compounds having a high valence, such as iron(III) chloride (JP-A 11-251067), ammonium peroxodisulfate, etc.; aromatic boron compounds such as tris(pentafluorophenyl)borane (JP-A 2003-31365), etc.; fullerene derivatives; iodine; sulfonate ions such as polystyrenesulfonate ions, alkylbenzenesulfonate ions, camphorsulfonate ions, etc.

The electron-accepting compound may increase the electroconductivity of the hole injection layer 3, as oxidizing the hole transport material in the layer.

<Other Constitutive Material>

Not markedly detracting from the advantageous effects of the present invention, the hole injection layer 3 may further contain any other components, in addition to the above-mentioned hole transport material and electron-accepting compound therein.

<Solvent>

At least one solvent in the composition for formation of the hole injection layer that is used in a wet film formation method is preferably a compound capable of dissolving the constitutive materials of the hole injection layer 3.

As the solvent, for example, there are mentioned ether solvents, ester solvents, aromatic hydrocarbon solvents, amide solvents, etc.

The ether solvents include, for example, aliphatic ethers such as ethylene glycol dimethyl ether, ethylene glycol diethyl ether, propylene glycol 1-monomethyl ether acetate (PGMEA), etc.; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, etc.

The ester solvents include, for example, aromatic esters such as phenyl acetate, phenyl propionate, methyl benzoate, ethyl benzoate, propyl benzoate, n-butyl benzoate, etc.

The aromatic hydrocarbon solvents include, for example, toluene, xylene, cyclohexylbenzene, 3-isopropylbiphenyl, 1,2,3,4-tetramethylbenzene, 1,4-diisopropylbenzene, methylnaphthalene, etc.

The amide solvents include, for example, N,N-dimethylformamide, N,N-dimethylacetamide, etc.

In addition, dimethyl sulfoxide or the like is also usable here.

One alone or two or more different kinds of those solvents may be used here either singly or as combined in any desired manner and in any desired ratio.

[Formation of Hole Injection Layer 3 in Vacuum Evaporation Method]

In case where the hole injection layer 3 is formed according to vacuum evaporation method, for example, the hole injection layer 3 may be formed as follows. One or more of the constitutive materials of the hole injection layer 3 (hole transport material, electron-accepting materials and others mentioned above) are put into the crucible arranged in a vacuum container (when two or more materials are used, they are put in individual crucibles), and then the vacuum container is degassed to $10^{-4}$ Pa or so via a suitable vacuum pump. Subsequently, the crucible is heated so that the material is evaporated at a controlled evaporation rate (when two or more materials are used, the individual crucibles are heated) to thereby form the hole injection layer 3 on the anode 2 on the substrate 1 arranged opposite to the crucible. When two or more materials are used, a mixture thereof may be put in a crucible, heated and evaporated to form the hole injection layer 3.

Not markedly detracting from the advantageous effects of the present invention, the vacuum degree in evaporation is not specifically defined. The vacuum degree in evaporation is typically $0.1 \times 10^{-6}$ Torr $(0.13 \times 10^{-4}$ Pa) or more and $9.0 \times 10^{-6}$ Torr $(12.0 \times 10^{-4}$ Pa) or less. Not markedly detracting from the advantageous effects of the present invention, the evaporation rate is not specifically defined. The evaporation rate is typically 0.1 angstrom/sec or more and is 5.0 angstrom/sec or less. Also not markedly detracting from the advantageous effects of the present invention, the film formation temperature in evaporation is not specifically defined. The film formation temperature in evaporation is preferably 10° C. or higher and is 50° C. or lower.

[Hole Transport Layer]

The hole transport layer 4 is a layer for transportation from the anode 2 to the light-emitting layer 5. The hole transport layer 4 is not an indispensable layer in the organic electroluminescent element of the present invention, however, in case where the hole transport layer 4 is provided and when the element has the hole injection layer 3, in general, the hole transport layer 4 may be formed on the hole injection layer 3, but when the element does not have the hole injection layer 3, the hole transport layer 4 may be formed on the anode 2.

The method for formation of the hole transport layer 4 is not specifically defined, and the layer may be formed according to a vacuum evaporation method or a wet film formation method. Preferably, the hole transport layer 4 is formed according to a wet film formation method from the viewpoint of reducing dark spots.

The material for forming the hole transport layer 4 is preferably a material having high hole transportability and capable of efficiently transporting the injected holes. Consequently, it is desirable that the material for forming the hole transport layer 4 has a small ionization potential, is highly transparent to visible light, has a large hole mobility, is excellent in stability and generates few impurities to be traps in production and during use. Kept in adjacent to the light-emitting layer 5, in many cases, it is desirable that the hole transport layer 4 does not quench the emission from the light-emitting layer 5 and does not form an exciplex with the light-emitting layer 5 to lower the luminescent efficiency.

The material for the hole transport layer 4 may be any and every material heretofore used as the constitutive material for the hole transport layer 4. The material of the hole transport layer 4 includes, for example, arylamine derivatives, fluorene derivatives, Spiro derivatives, carbazole derivatives, pyridine derivatives, pyrazine derivatives, pyrimidine derivatives, triazine derivatives, quinoline derivatives, phenanthroline derivatives, phthalocyanine derivatives, porphyrin derivatives, silol derivatives, oligothiophene derivatives, condensed polycyclic aromatic derivatives, metal complexes, etc.

In addition, for example, there are further mentioned polyvinylcarbazole derivatives, polyarylamine derivatives, polyvinyltriphenylamine derivatives, polyfluorene derivatives, polyarylene derivatives, tetraphenylbenzidine-containing polyarylene ether sulfone derivatives, polyarylenevinylene derivatives, polysiloxane derivatives, polythiophene derivatives, poly(p-phenylenevinylene) derivatives, etc. These may be any of alternate copolymers, random polymers, block polymers or graft copolymers. In addition, also employable are polymers and so-called dendrimers having a branched main chain or having 3 or more end parts.

Above all, as the material for the hole transport layer 4, preferred are polyarylamine derivatives and polyarylene derivatives.

Specific examples of polyarylamine derivatives and polyarylene derivatives are described in JP-A 2008-98619.

In case where the hole transport layer 4 is formed according to a wet film formation method, a composition for formation of the hole transport layer is prepared and then formed into a film in a mode of wet film formation and then dried, in the same manner as that for the formation of the hole injection layer 3 mentioned above.

In case where the composition for formation of the hole transport layer contains a solvent in addition to the above-mentioned hole transport layer therein, the solvent to be used is the same as that used in the composition for formation of the hole injection layer mentioned above. The film formation condition, the drying condition and others are the same as in the case of forming the hole injection layer 3.

Also in case where the hole transport layer 4 is formed according to a vacuum evaporation method, the film formation condition and others are the same as in the case of forming the hole injection layer 3 mentioned above.

The thickness of the hole transport layer 4 thus formed in the manner as above is generally 5 nm or more, preferably 10 nm or more, and is generally 300 nm or less, preferably 100 nm or less.

[Light-Emitting Layer]

The light-emitting layer 5 is a layer to be the main light-emitting source, which is excited by recombination of the holes injected from the anode 2 and the electrons injected from the cathode 9 between the electrodes given an electric field. In case where the element has the hole transport layer 4, the light-emitting layer 5 may be formed generally on the hole transport layer 4, however, when the element does not have the hole transport layer 4 but has the hole injection layer 3, the light-emitting layer 5 may be formed on the hole injection layer 3. In case where the element has neither the hole transport layer 4 nor the hole injection layer 3, the light-emitting layer 5 may be formed on the anode 2.

The constitutive materials and the formation method for the light-emitting layer 5 are as mentioned above. In the present invention, the total number of kinds of the light-emitting material and the charge transport material in the light-emitting layer is 5 or more, and preferably, the light-emitting material and the charge transport material to be used for the light-emitting material are so selected as to satisfy at least one of the requirement for the ionization potential and the requirement for the electron affinity mentioned above, thereby forming the intended light-emitting material.

[Hole Block Layer]

The hole block layer 6 may be provided between the light-emitting layer 5 and the electron injection layer 8 to be mentioned below. The hole block layer 6 is, of the electron transport layer, a layer that plays a role of blocking the holes moving from the anode 2 from reaching the cathode 9. The hole block layer 6 is a layer to be laminated on the light-emitting layer 5 so as to be kept in contact with the interface on the side of the cathode 9 of the light-emitting layer 5. In the organic electroluminescent element of the present invention, the hole block layer is not an indispensable constitutive layer.

The hole block layer 9 plays a role of blocking the holes moving from the anode 2 from reaching the cathode 9 and a role of efficiently transporting the electrons injected from the cathode 9 toward the direction of the light-emitting layer 5.

Regarding the necessary physical properties thereof, the material to constitute the hole block layer 6 is desired to have a high electron mobility, a low hole mobility, a large energy gap (difference between HOMO and LUMO) and a high excitation triplet energy level (T1). The material satisfying the requirements for the hole block layer 6 includes, for example, mixed ligand complexes such as bis(2-methyl-8-quinolinolato)(phenolato)aluminium, bis(2-methyl-8-quinolinolato)(triphenylsilanolato)aluminium, etc.; metal complexes such as bis(2-methyl-8-quinolinolato)aluminium-μ-oxo-bis(2-methyl-8-quinolinolato)aluminium binuclear metal complex, etc.; styryl compounds such as distyrylbiphenyl derivatives, etc. (JP-A 11-242996); triazole derivatives such as 3-(4-biphenylyl)-4-phenyl-5(4-tert-butylphenyl)-1,2,4-triazole, etc. (JP-A 7-41759); phenanthroline derivatives such as bathocuproin, etc. (JP-A 10-79297), etc. Further, compounds having at least one pyridine ring substituted at the 2,4,6-positions, as described in WO2005/022962, are also preferred as the material for the hole block layer 6.

The method for forming the hole block layer 6 is not defined. Accordingly, the hole block layer 6 may be formed according to a wet film formation method, a vaporization method or any other method.

The thickness of the hole block layer 6 may be any desired one, not markedly detracting from the advantageous effects of the present invention. The thickness of the hole block layer 6 is typically 0.3 nm or more, preferably 0.5 nm or more, and is typically 100 nm or less, preferably 50 nm or less.

[Electron Transport Layer]

The electron transport layer 7 is a layer provided between the light-emitting layer 5 and the cathode 9 for transportation of electrons. In the organic electroluminescent element of the present invention, the electron transport layer 7 is not an indispensable constitutive layer.

As the electron transport material for the electron transport layer 7, in general, used is a compound having a high electron injection efficiency from the cathode or from the adjacent layer on the side of the cathode and having a high electron mobility, and capable of efficiently transporting the injected electrons. The compound satisfying the requirements includes, for example, metal complexes such as aluminium complex and lithium complex of 8-hydroxyquinoline, etc. (JP-A 59-194393), 10-hydroxybenzo[h]quinoline metal complexes, oxadiazole derivatives, distyrylbiphenyl derivatives, silol derivatives, 3-hydroxyflavone metal complexes, 5-hydroxyflavone metal complexes, benzoxazole metal complexes, benzothiazole metal complexes, trisbenzimidazolylbenzene (U.S. Pat. No. 5,645,948), quinoxaline compounds (JP-A 6-207169), phenanthroline derivatives (JP-A 5-331459), 2-t-butyl-9,10-N,N'-dicyanoanthraquinonediimine, triazine compound derivatives, n-type hydrogenated amorphous silicon carbide, n-type zinc sulfide, n-type zinc selenide, etc.

In addition, for the electron transport material for use in the electron transport layer, also preferred is doping an electron-transporting organic compound such as typically a nitrogen-containing heterocyclic compound such as basophenanthroline or the like, or a metal complex such as an aluminium complex of 8-hydroxyquinoline or the like, with an alkali metal such as sodium, potassium, cesium, lithium, rubidium or the like (as described in JP-A 10-270171, 2002-100478, 2002-100482, etc.), as capable of satisfying both good electron injection/transport capability and excellent film quality. Further, it is also effective to dope the above-mentioned electron-transporting organic compound with an inorganic salt such as lithium fluoride, cesium carbonate or the like.

The method for forming the electron transport layer 7 is not defined. Accordingly, the layer may be formed according to a wet film formation method, a vaporization method or any other method.

The thickness of the electron transport layer may be any desired one, not markedly detracting from the advantageous effects of the present invention. The thickness of layer is typically 1 nm or more, preferably 5 nm or more, and is typically 300 nm or less, preferably 100 nm or less.

[Electron Injection Layer]

The electron injection layer 8 may be provided between the electron transport layer 7 and the cathode 9 to be mentioned below, for efficiently injecting the holes from the cathode 9 to the light-emitting layer 5. The electron injection layer 8 is formed of an inorganic salt or the like. In the organic electroluminescent element of the present invention, the electron injection layer 8 is not an indispensable constitutive layer.

The material for the electron injection layer 8 includes, for example, lithium fluoride (LiF), magnesium fluoride ($MgF_2$), lithium oxide ($Li_2O$), cesium(II) carbonate ($CsCO_3$), etc. (See Applied Physics Letters, 1997, Vo. 70, p. 152; JP-A 10-74586; IEEE transactions on Electron Devices, 1997, Vol. 44, p. 1245; SID 04 Digest, p. 154, etc.).

The electron injection layer 8 does not often have charge transportability and therefore for efficient electron injection, the layer is preferably an ultra-thin film. The thickness of the layer is typically 0.1 nm or more and is preferably 5 nm or less.

[Cathode]

The cathode 9 is an electrode that plays a role of injecting electrons to the layer on the side of the light-emitting layer 5.

Regarding the material thereof, in general, the cathode 9 is formed of a metal such as aluminium, gold, silver, nickel, palladium, platinum or the like; a metal oxide such as an oxide of at least any one of indium and tin, etc.; a silver halide such as copper iodide, etc.; carbon black; or a conductive polymer such as poly(3-methylthiophene), polypyrrole, polyaniline, etc. Of those, preferred are metals having a low work function for efficient electron injection, and for example, employable is a suitable metal such as tin, magnesium, indium, calcium, aluminium, silver or the like, or an alloy thereof, etc. As concrete examples, there are mentioned alloy electrodes having a low work function, such as magnesium-silver alloys, magnesium-indium alloys, aluminium-lithium alloys, etc.

One alone or two or more different kinds of materials may be used for the cathode, either singly or as combined in any desired manner and in any desired ratio.

The thickness of the cathode 9 varies depending on the necessary transparency. In case where the element is required to be transparent, it is desirable that the visible light transmittance thereof is generally 60% or more, preferably 80% or more. In this case, the thickness of the cathode 9 is generally 5 nm or more, preferably 10 nm or more, and is generally 1000 nm or less, preferably 500 nm or less or so. In case where the element may be nontransparent, the thickness of the cathode 9 is not specifically defined. The cathode may be the same as the substrate. If desired, a different conductive material may be laminated on the cathode 9.

Further, for example, for the purpose of protecting the cathode formed of a metal having a low work function, for example, an alkali metal such as sodium, cesium or the like, or an alkaline earth metal such as barium, calcium or the like, it is desirable to further laminate a metal layer having a high work function and stable to air on the cathode, since the lamination increases the stability of the element. For this purpose, for example, usable is a metal such as aluminium, silver, copper, nickel, chromium, gold, platinum, etc. One alone or two or more different kinds of those materials may be used either singly or as combined in any desired manner and in any desired ratio.

[Other Layers]

Within a range not overstepping the scope and the spirit thereof, the organic electroluminescent element of the present invention may have any other configuration. Concretely, for example, the element may have any other optional layer in addition to the layers mentioned hereinabove, between the anode 2 and the cathode 9, not detracting from the performance thereof. Further, of the layers described above, those not indispensable in the element of the present invention may be omitted.

In the layer configuration mentioned above, the constituent members except the substrate may be laminated in the reverse order. For example, in the layer configuration of FIG. 1, the other constituent members may be laminated on the substrate 1 in an order of the cathode 9, the electron injection layer 8, the electron transport layer 7, the hole block layer 6, the light-emitting layer 5, the hole transport layer 4, the hole injection layer 3 and the anode 2 thereon.

Further, between two substrate of which at least one is transparent, the other constituent members than those substrates may be sandwiched to construct the organic electroluminescent element of the present invention.

The other constituent members (light-emitting units) than the substrate may be laminated in multiple stages to construct a structure (having multiple light-emitting units laminated therein). In the case, in place of the interlayer between the adjacent stages (light-emitting units) (when the anode is ITO and the cathode is Al, the two are the interlayers), for example, a carrier generation layer (CGL) formed of vanadium pentoxide ($V_2O_5$) or the like may be provided, and the embodiment is more preferred since the barrier between the stages is reduced and from the viewpoint of the luminescent efficiency and the driving voltage.

Further, the organic electroluminescent element of the present invention may be formed as a single organic electroluminescent element, or may be applied to a configuration where multiple organic electroluminescent elements are arranged in an array, or may also be applied to a configuration where the anode and the cathode are arranged in an X-Y matrix.

Not markedly detracting from the advantageous effects of the present invention, the above-mentioned layers may contain any other component than those described as the materials of the layers hereinabove.

[Organic Electroluminescent Device]

The organic electroluminescent device of the present invention is an organic electroluminescent device having two or more organic electroluminescent elements each emitting light in different colors, wherein at least one element is the organic electroluminescent element of the present invention. In the organic electroluminescent device, preferably, all the organic electroluminescent elements are the organic electroluminescent elements of the present invention. The reason is because the driving voltage of the organic electroluminescent device is lowered and therefore the device is an power-saving one. The organic electroluminescent device of the present invention includes an organic EL display, an organic EL lighting, etc.

[Organic EL Display]

The organic EL display of the present invention is a display that uses the organic electroluminescent element of the present invention mentioned above. The type and the configuration of the organic EL display of the present invention are not specifically defined. The display can be constructed using the organic electroluminescent element of the present invention and according to an ordinary method.

For example, the organic EL display of the present invention can be constructed according to the method described in "Organic EL Display" (by Ohm, issued on Aug. 20, 2004, written by Shizuo Tokito, Chihaya Adachi, Hideyuki Murata).

[Organic EL Lighting]

The organic EL lighting of the present invention is an illumination using the above-mentioned organic electroluminescent element of the present invention. The type and the configuration of the organic EL lighting of the present invention are not specifically defined. The illumination can be constructed using the organic electroluminescent element of the present invention and according to an ordinary method.

EXAMPLES

Next, the invention is described more concretely with reference to Examples; however, not overstepping the spirit and the scope thereof, the present invention is not limited to the following Examples.

[Measurement of Ionization Potential and Electron Affinity]

The ionization potential (IP) and the electron affinity (EA) of the light-emitting material and the charge transport material used in the light-emitting layer in the following Examples and Comparative Examples were measured according to the method mentioned below.

First, the coated surface of an ITO-coated substrate (Geomatec's film product produced by sputtering), which had been produced by depositing an ITO transparent conductive film on a glass substrate in a thickness of 70 nm thereon, was ultrasonically washed with an aqueous surfactant solution, washed with ultrapure water, ultrasonically washed with ultrapure water, and washed with ultrapure water in that order, then dried with compressed air, and thereafter washed with UV-ozone.

A one wt % toluene solution of each of charge transport materials (h-1 to h-21) and the light-emitting materials (D-1 to D-4) was prepared, and applied onto the washed, ITO-coated substrate according to a spin coating method while the rotation speed was suitably controlled under the condition mentioned below for film formation thereon, thereby forming a single-layer film of the charge transport material or the light-emitting material in a thickness of 50 nm. Using Optel's "PCR-101", these samples were analyzed for the ionization potential IP thereof in a vacuum condition of up to 10 Torr or less.

Further, using a spectrofluorophotometer, Hitachi's "F-4500", the single-layered film was analyzed for the transmitted light spectrum, or that is, the thin-film absorption spectrum. In the rising part on the short wavelength side of the spectrum, the tangent line was drawn to the absorption spectrum and to the base line, and from the wavelength W (nm) at the intersection of the two tangent lines, the band gap Eg was calculated according to the following equation:

$$Eg = 1240/W$$

From the sum of the ionization potential IP and the band gap Eg, the absolute value of the electron affinity EA was calculated. The results are shown in Table 1 below.

TABLE 1

|      | |IP|/eV | |EA|/eV |
|------|---------|---------|
| h-1  | 6.05    | 2.83    |
| h-2  | 5.62    | 2.58    |
| h-3  | 5.61    | 2.58    |
| h-4  | 5.59    | 2.54    |
| h-5  | 5.57    | 2.60    |
| h-6  | 5.54    | 2.46    |
| h-7  | 5.52    | 2.43    |
| h-8  | 5.98    | 2.94    |
| h-9  | 6.11    | 2.89    |
| h-10 | 6.03    | 2.86    |
| h-11 | 5.92    | 3.01    |
| h-12 | 5.91    | 2.99    |
| h-13 | 5.87    | 3.00    |
| h-14 | 5.83    | 2.98    |
| h-15 | 5.65    | 2.59    |
| h-16 | 5.58    | 2.55    |
| h-17 | 5.52    | 2.46    |
| h-18 | 5.45    | 2.37    |
| h-19 | 6.00    | 2.79    |
| h-20 | 5.96    | 2.74    |
| h-21 | 5.97    | 2.56    |
| D-1  | 5.48    | 2.97    |
| D-2  | 5.52    | 2.77    |
| D-3  | 5.41    | 2.87    |
| D-4  | 5.40    | 2.97    |

Production of Elements for Characteristics Evaluation

Example 1

An organic electroluminescent element shown in FIG. 1 was produced.

First, an ITO transparent conductive film was deposited on the glass substrate 1 in a thickness of 70 nm thereon, and then patterned in stripes each having a width of 2 mm to form the anode 2 of ITO. The coated surface of the ITO-coated substrate with the anode 2 formed thereon (Geomatec's film product produced by sputtering) was ultrasonically washed with an aqueous surfactant solution, washed with ultrapure water, ultrasonically washed with ultrapure water, and washed with ultrapure water in that order, then dried with compressed air, and thereafter washed with UV-ozone.

Next, an ethyl benzoate solution containing 2.0% by weight of a hole-transporting polymer compound having a recurring unit represented by the following formula (P1) and 0.8% by weight of 4-isopropyl-4'-methyldiphenyliodonium tetrakis(pentafluorophenyl)borate represented by the following formula (A1) (composition for formation of hole injection layer) was prepared.

[Chem. 31]

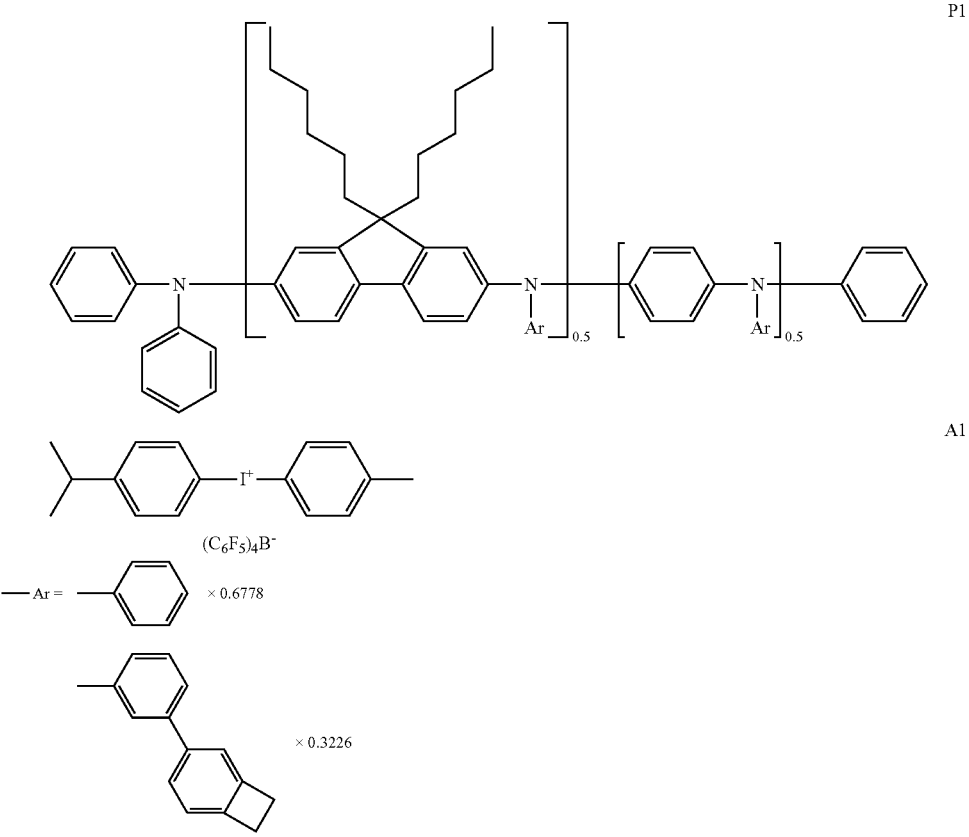

The composition for formation of hole injection layer was applied onto the above-mentioned ITO substrate according to a spin coating method under the film formation condition mentioned below, and further baked under the baking condition also mentioned below, thereby forming the hole injection layer 3 having a thickness of 40 nm.
<Film Formation Condition>
Spin Coating Atmosphere: air atmosphere
Baking Condition: air atmosphere, 230° C., 1 hour Subsequently, a one wt % cyclohexylbenzene solution of a hole-transporting polymer compound represented by the following formula (H-1) (composition for formation of hole transport layer) was prepared, and this was applied onto the hole injection layer 3 according to a spin coating method under the film formation condition mentioned below, and baked for crosslinking treatment thereby forming the hole transport layer 4 having a thickness of 10 nm.

[Chem. 32]

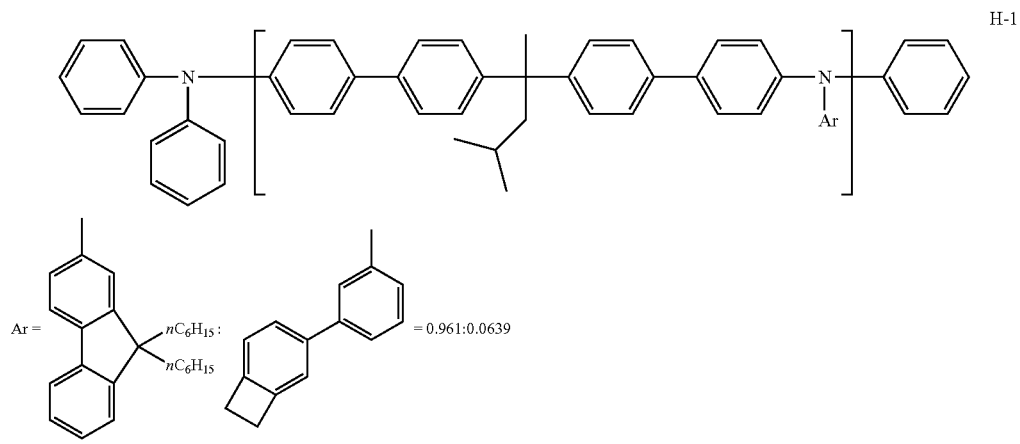

<Film Formation Condition>
Spin Coating Atmosphere: nitrogen atmosphere
Baking Condition: nitrogen atmosphere, 230° C., 1 hour
Subsequently, the light-emitting layer 5 was formed. Of the light-emitting materials (D-1 to D-4) and the charge transport material (h-1) to (h-21) mentioned below, prepared were cyclohexylbenzene solutions containing 1.2% by weight of (h-1), 0.6% by weight of any of (h-2) to (h-7) or 0.48% by weight of (D-1) (compositions for formation of light-emitting layer).

[Chem. 33]

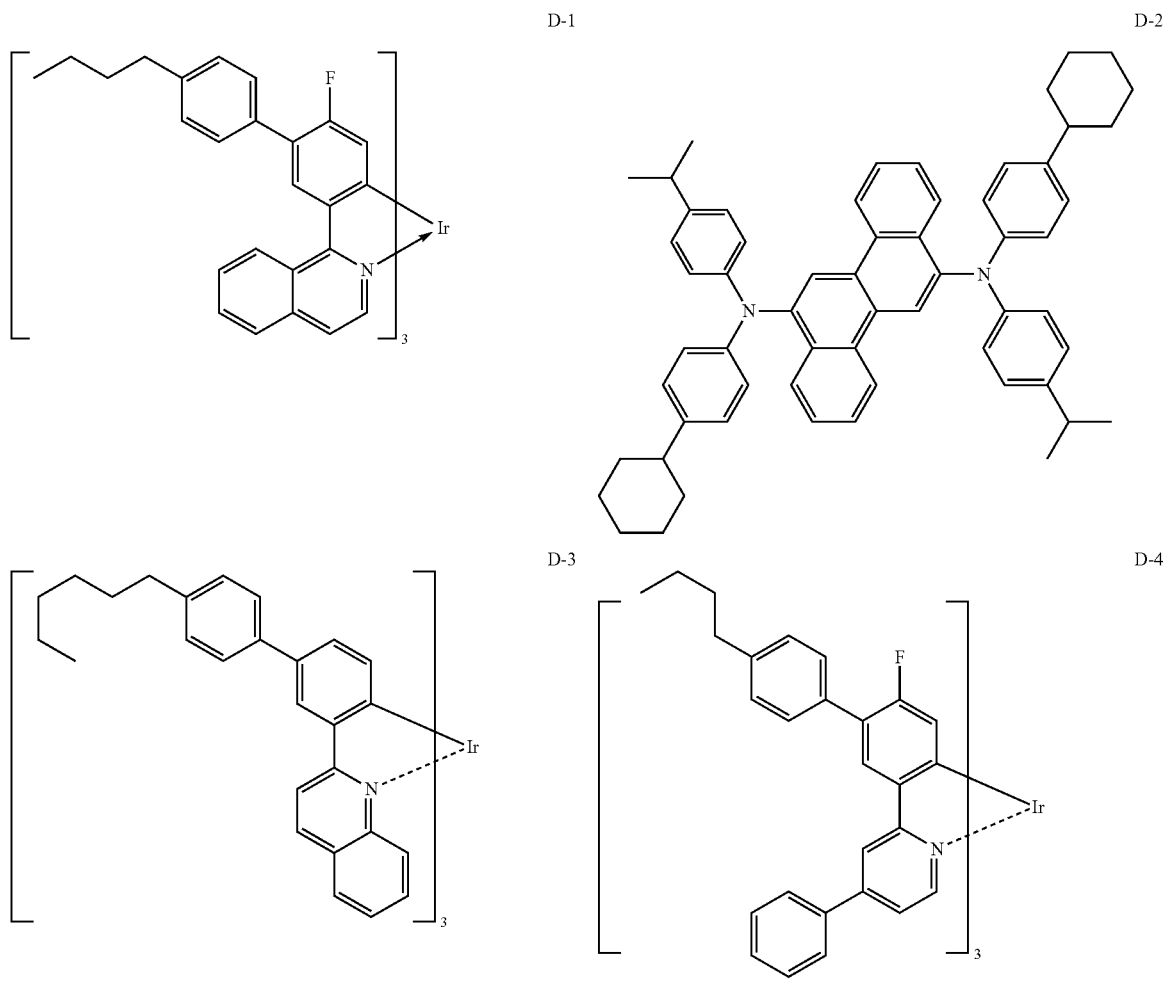

[Chem. 34]

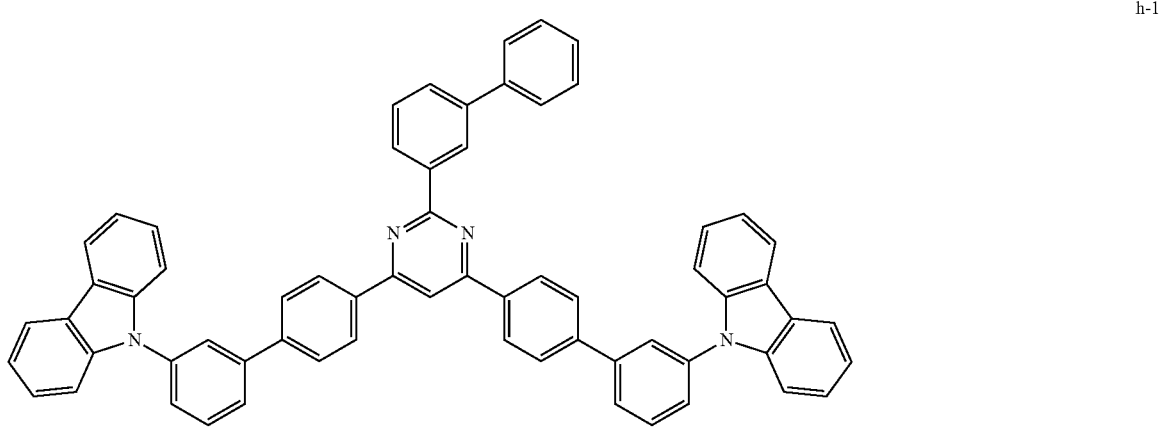

h-2
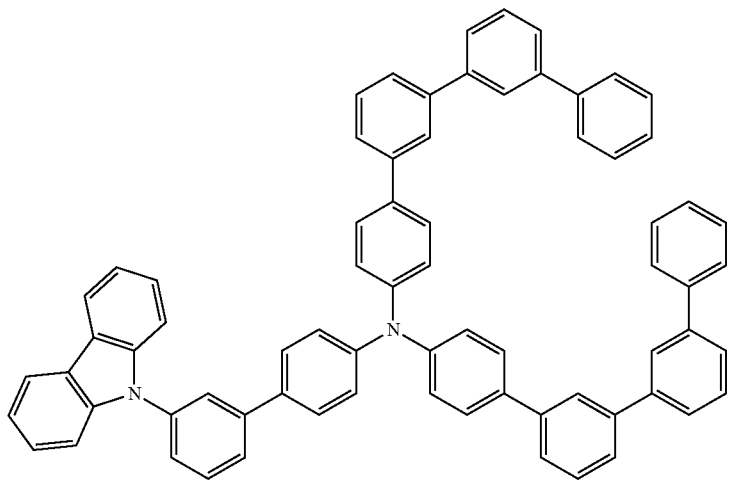
h-3
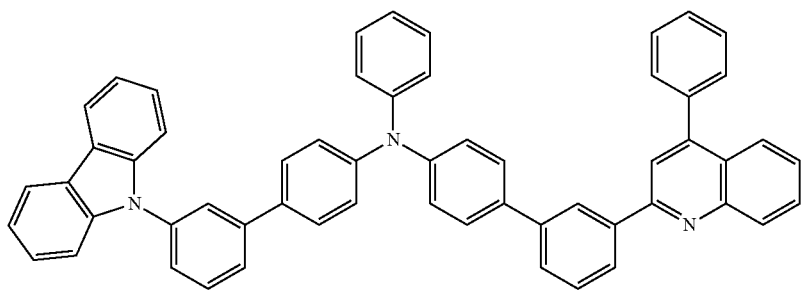
h-4 h-5
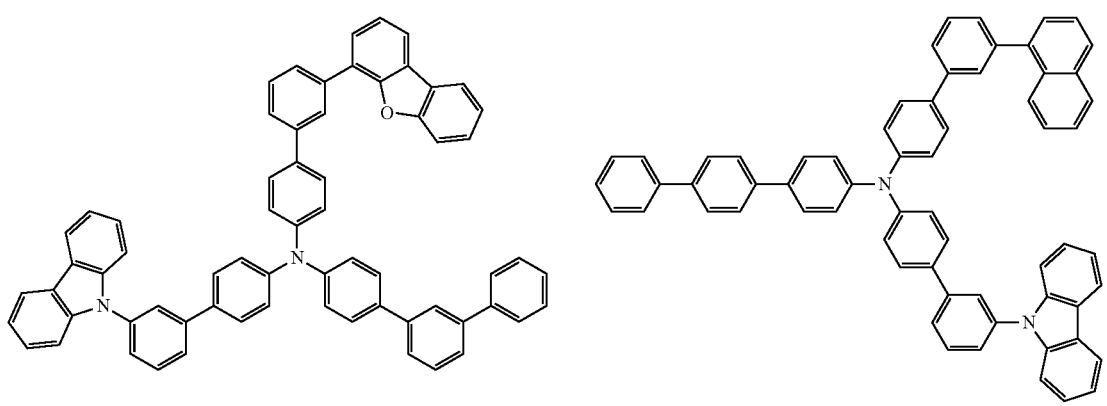

h-6
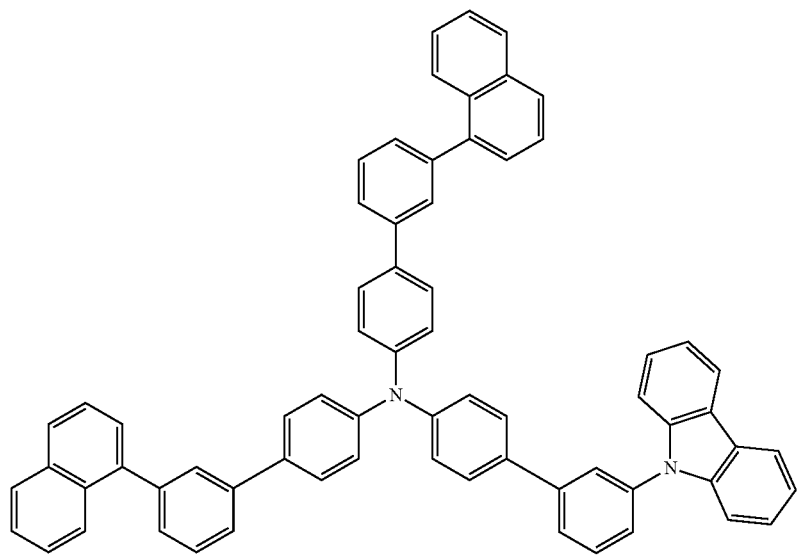
h-7
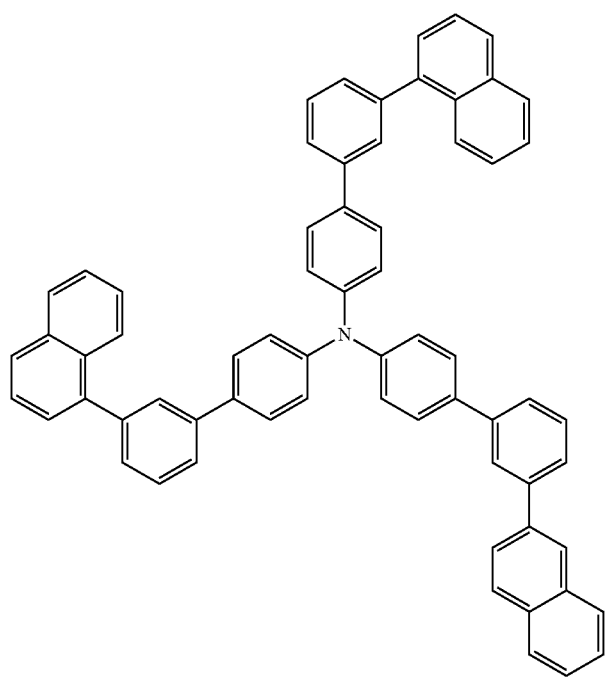

h-8
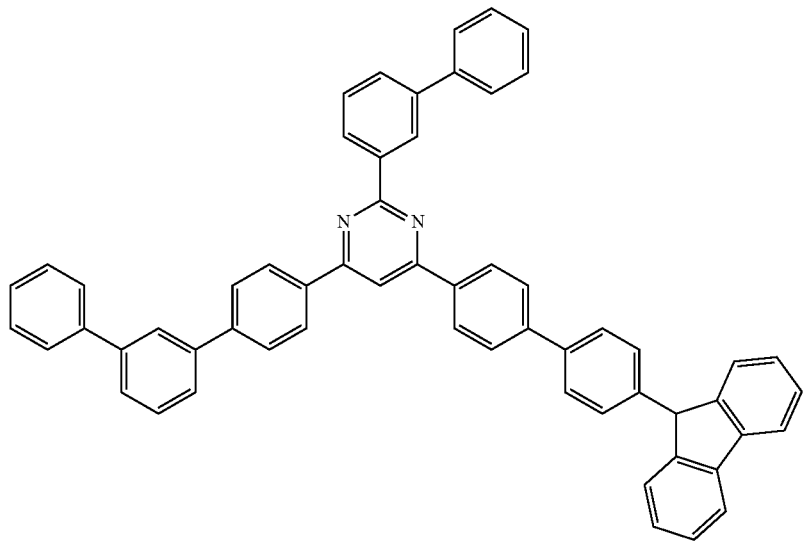
h-9
h-10
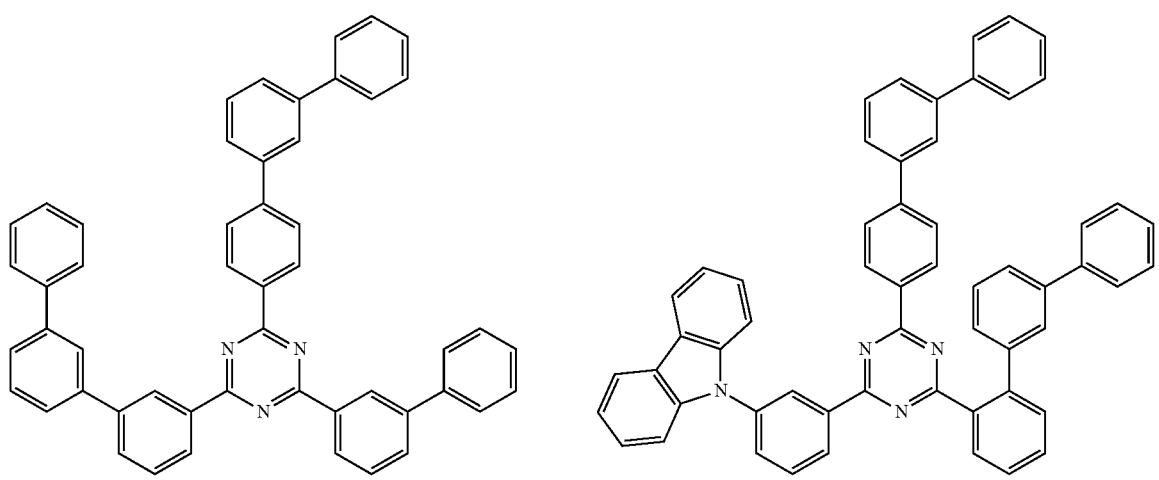
[Chem. 35]
h-11
h-12
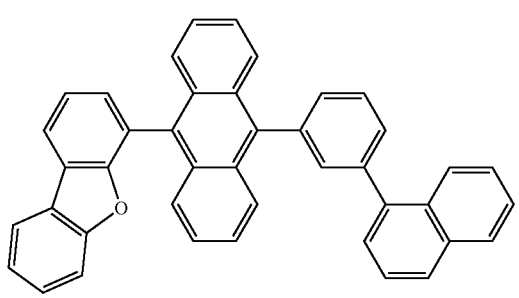
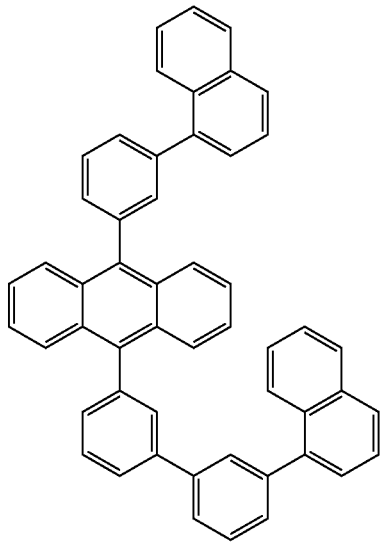

-continued
h-13
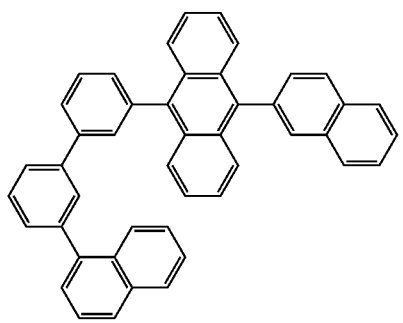
h-14
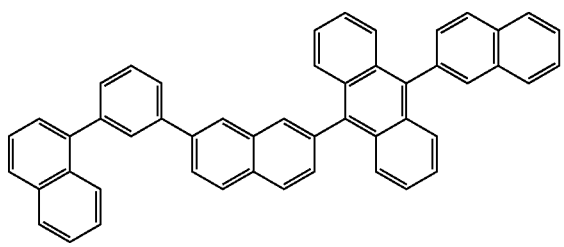
h-15
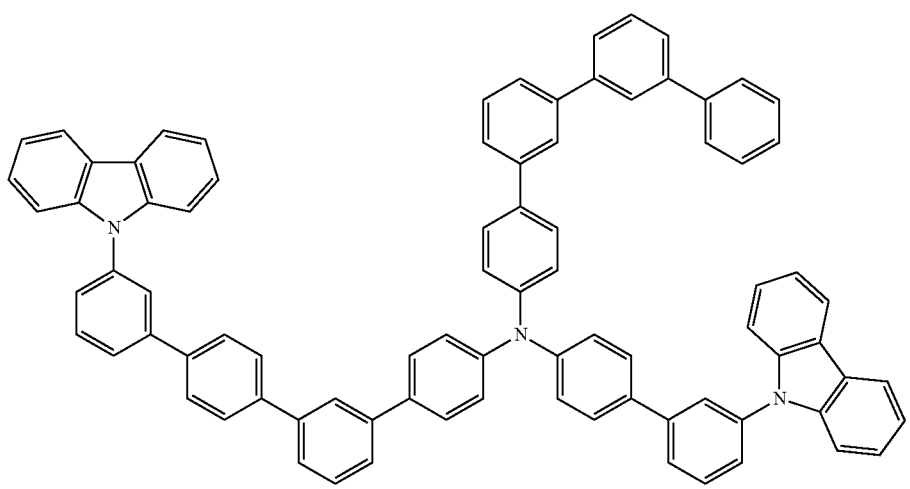
h-16
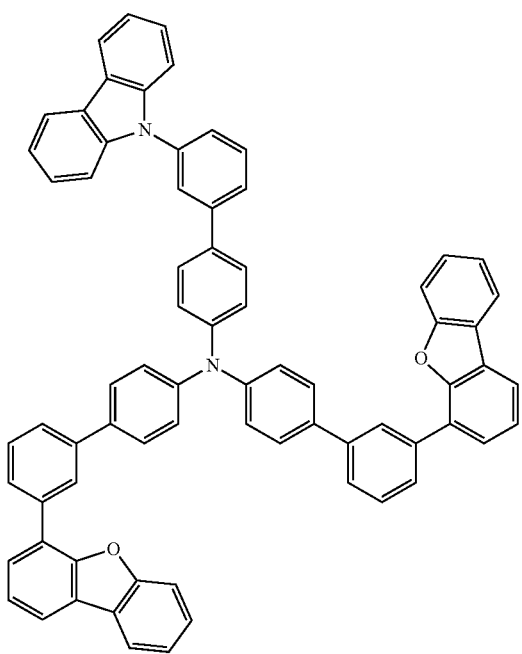
h-17
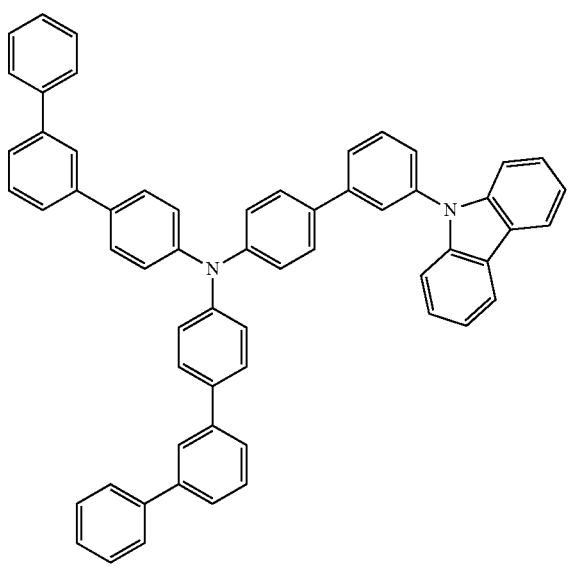

-continued
h-18
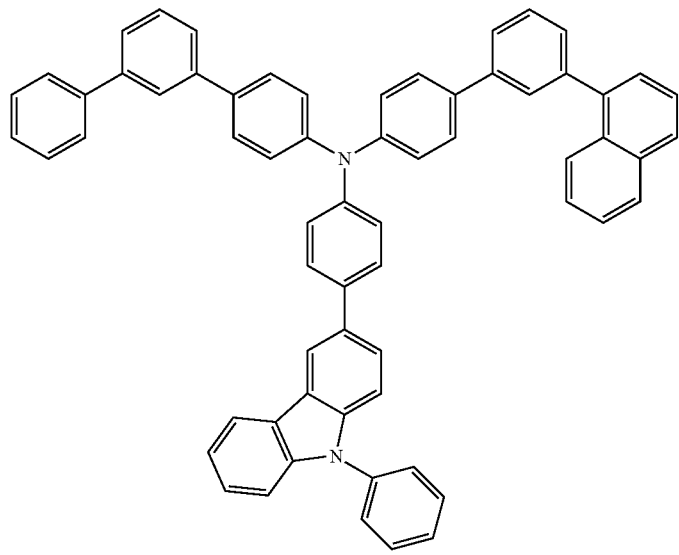
h-19
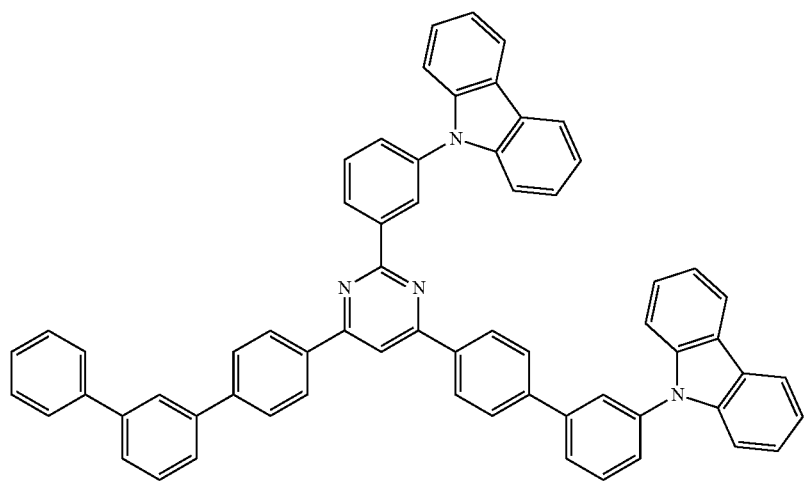
h-20
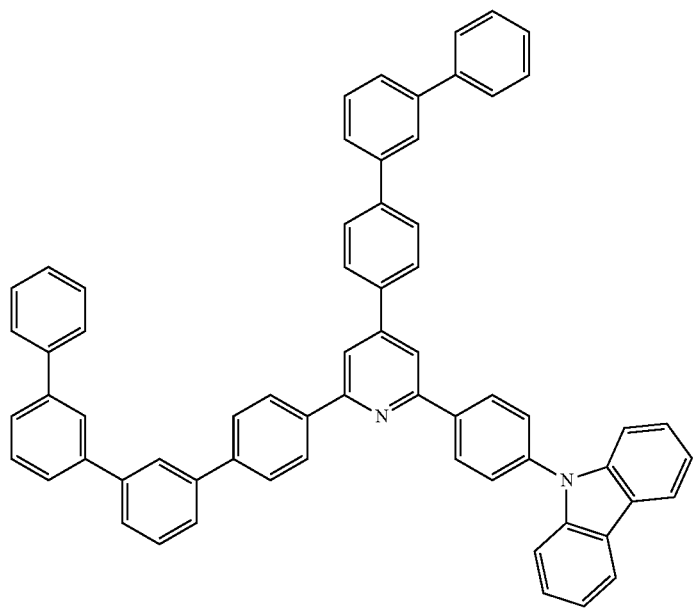

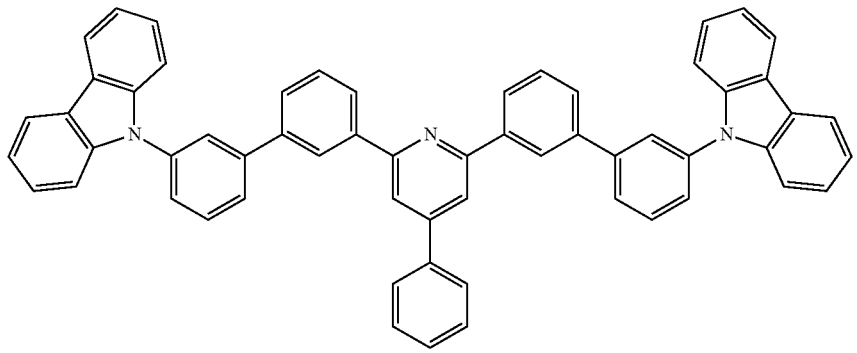

h-21

The composition for formation of light-emitting layer was applied onto the hole transport layer 4 according to a spin coating method under the condition mentioned below, and then baked under the baking condition also mentioned below, thereby forming the light-emitting layer 5 having a thickness of 50 nm.

<Film Formation Condition>

Spin Coating Atmosphere: nitrogen atmosphere

Baking Condition: nitrogen atmosphere, 120° C., 10 min

Next, the substrate with the hole injection layer 3, the hole transport layer 4 and the light-emitting layer 5 formed thereon was conveyed into a vacuum evaporation apparatus, which was roughly degassed, and then, using a cryo-pump, the apparatus was further degassed to a vacuum degree of $3.0 \times 10^{-4}$ Pa or less. While the vacuum degree was kept at $2.2 \times 10^{-4}$ Pa or less in the apparatus, the charge transport material (h-19) as a hole block material was deposited onto the light-emitting layer 5 at an evaporation speed of from 0.6 to 1.2 angstrom/sec to a thickness of 10 nm thereby forming the hole block layer 6.

Next, while the vacuum degree was still kept at $2.2 \times 10^{-4}$ Pa or less in the apparatus, tris(8-hydroxyquinolinato)aluminium ($Alq_3$) was applied under heat onto the hole block layer 6 at an evaporation speed of from 0.7 to 1.3 angstrom/sec to a thickness of 20 nm thereby forming the electron transport layer 7.

The substrate on which the layers up to the electron transport layer 7 had been formed up to here was transferred from the organic layer deposition chamber to a metal deposition chamber. As a mask for cathode deposition, a 2-mm wide strip shadow mask was kept in contact with the substrate in such a manner that the stripes of the mask could be perpendicular to the ITO stripes of the anode 2. Like in the process of organic layer deposition, the apparatus was degassed down to a vacuum degree of $1.1 \times 10^{-4}$ Pa or less.

Subsequently, while the vacuum degree was kept at $1.0 \times 10^{-4}$ Pa or less in the chamber, lithium fluoride (LiF) was heated in a molybdenum boat and applied onto the electron transport layer 7 at an evaporation rate of from 0.07 to 0.15 angstrom/sec to a thickness of 0.5 nm, thereby forming the electron injection layer 8. Next, similarly, while the vacuum degree was kept at $2.0 \times 10^{-4}$ Pa or less in the chamber, aluminium was heated in a molybdenum boat and applied onto the layer at an evaporation rate of from 0.6 to 10.0 angstrom/sec to at thickness of 80 nm, thereby forming the cathode 9. The substrate temperature in vapor deposition of the above electrode injection layer 8 and cathode 9 was kept at room temperature.

Subsequently, for preventing the organic electroluminescent element from being deteriorated by moisture in air during storage, the element was sealed up according to the method mentioned below.

In a nitrogen globe box, a photocurable resin "30Y-437" (by Three Bond) was applied to the outer periphery of a glass plate having a size of 23 mm×23 mm in a width of 1 mm therearound, and in the center part, a water getter sheet (by Dynic) was arranged. On this, the substrate that had been processed to have thereon all the layers up to the anode 9 in the above was set in such a manner that the coated surface of the substrate could face the desiccant sheet, and stuck together. Subsequently, only the region coated with the photocurable resin was exposed to UV light to cure the resin.

In the manner as above, an organic electroluminescent element of Example 1, having an emission area portion of 2 mm×2 mm, was produced.

Examples 2 to 5, Comparative Examples 1 to 4

Organic electroluminescent elements of Examples 2 to 5 and Comparative Examples 1 to 4 were produced in the same manner as in Example 1, except that the light-emitting material and the charge transport material for use in the composition for formation of light-emitting layer were combined and prepared as in Table 2. In Table 2, the content of each material (% by weight) is shown in the columns of the materials used in the compositions for formation of light-emitting layer. The blank column means that the material was not in the composition for formation of light-emitting layer. In the Examples and Comparative Examples, the total number of the materials contained in the light-emitting layer and the number of the charge transport materials contained in the light-emitting layer are also shown. The same shall apply to the other Tables given below.

TABLE 2

| Material Number | Content (wt %) in Composition for Formation of Light-Emitting Layer | | | | | | | | | | | Total Number of Materials Contained in Light-Emitting Layer | Number of Charge-Transporting Material Contained in Light-Emitting Layer | Voltage Difference (V) at 10 mA/cm$^2$ relative to Comparative Example 1 |
|---|---|---|---|---|---|---|---|---|---|---|---|---|---|---|
| | h-1 | h-2 | h-3 | h-4 | h-5 | h-6 | h-7 | h-8 | h-9 | h-10 | D-1 | | | |
| Example 1 | 1.2 | 0.6 | 0.6 | 0.6 | 0.6 | 0.6 | 0.6 | | | | 0.48 | 8 | 7 | −0.8 |
| Example 2 | 1.2 | 1.2 | | 1.2 | | 1.2 | | | | | 0.48 | 5 | 4 | −0.8 |
| Example 3 | 1.2 | 1.2 | | | 1.2 | | 1.2 | | | | 0.48 | 5 | 4 | −0.8 |
| Example 4 | 0.3 | 0.6 | 0.6 | 0.6 | 0.6 | 0.6 | 0.6 | 0.3 | 0.3 | 0.3 | 0.48 | 11 | 10 | −0.8 |
| Example 5 | 0.6 | 1.8 | | | 1.8 | | | | | 0.6 | 0.48 | 5 | 4 | −0.7 |
| Comparative Example 1 | 1.2 | 3.6 | | | | | | | | | 0.48 | 3 | 2 | 0.0 |
| Comparative Example 2 | 1.2 | 1.8 | 1.8 | | | | | | | | 0.48 | 4 | 3 | 0.0 |
| Comparative Example 3 | | 1.2 | | 1.2 | | 1.2 | | | | | 0.48 | 4 | 3 | 2.0 |
| Comparative Example 4 | 0.6 | 3.6 | | | | | | | | 0.6 | 0.48 | 4 | 3 | 0.0 |

Example 6, Comparative Example 5

Organic electroluminescent elements of Example 6 and Comparative Example 5 were produced in the same manner as in Example 1, except that the light-emitting material and the charge transport material for use in the composition for formation of light-emitting layer were combined and prepared as in Table 3.

TABLE 3

| Material Number | Content (wt %) in Composition for Formation of Light-Emitting Layer | | | | | Total Number of Materials Contained in Light-Emitting Layer | Number of Charge-Transporting Material Contained in Light-Emitting Layer | Voltage Difference (V) at 10 mA/cm$^2$ relative to Comparative Example 5 |
|---|---|---|---|---|---|---|---|---|
| | h-11 | h-12 | h-13 | h-14 | D-2 | | | |
| Example 6 | 0.88 | 0.88 | 0.88 | 0.88 | 0.35 | 5 | 4 | −0.2 |
| Comparative Example 5 | 1.2 | 1.2 | 1.2 | | 0.35 | 4 | 3 | 0.0 |

Examples 7 to 10, Comparative Example 6

Organic electroluminescent elements of Examples 7 to 10 and Comparative Example 6 were produced in the same manner as in Example 1, except that the light-emitting material and the charge transport material for use in the composition for formation of light-emitting layer were combined and prepared as in Table 4 and that HB-01 represented by the following formula was used as the hole block material in place of (h-19) in forming the hole block layer.

[Chem. 36]

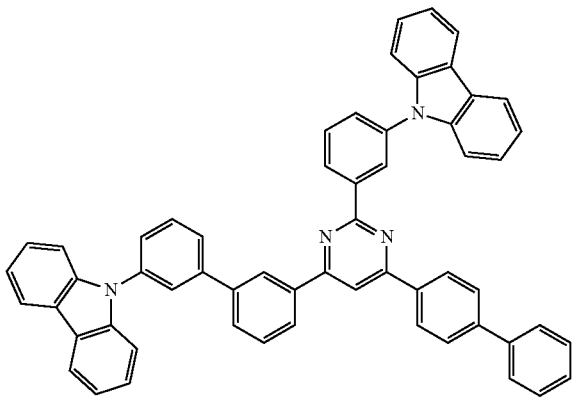

HB-01

TABLE 4

| Material Number | Content (wt %) in Composition for Formation of Light-Emitting Layer | | | | | | | | | | | | | Total Number of Materials Contained in Light-Emitting Layer | Number of Charge-Transporting Material Contained in Light-Emitting Layer | Voltage Difference (V) at 10 mA/cm$^2$ relative to Comparative Example 6 |
|---|---|---|---|---|---|---|---|---|---|---|---|---|---|---|---|---|
| | h-1 | h-2 | h-4 | h-6 | h-10 | h-15 | h-16 | h-17 | h-18 | h-19 | h-20 | D-3 | D-4 | | | |
| Example 7 | | 1.8 | | 1.8 | | | | | | | 1.2 | 0.38 | 0.096 | 5 | 3 | −0.2 |
| Example 8 | 0.6 | | 1.8 | 0.6 | | | 1.8 | | | | | 0.38 | 0.096 | 6 | 4 | −0.6 |
| Example 9 | 1.2 | 1.2 | | | | 1.2 | | 1.2 | | | | 0.38 | 0.096 | 6 | 4 | −0.7 |
| Example 10 | 0.4 | | 1.8 | 0.4 | | 1.8 | | | | 0.4 | | 0.38 | 0.096 | 7 | 5 | −0.5 |
| Comparative Example 6 | | | | | | | | 3.6 | | | 1.2 | 0.38 | 0.096 | 4 | 2 | 0.0 |

Examples 11 to 19, Comparative Example 7

Organic electroluminescent elements of Examples 11 to 19 and Comparative Example 7 were produced in the same manner as in Example 1, except that the light-emitting material and the charge transport material for use in the composition for formation of light-emitting layer were combined and prepared as in Table 5 and that HB-01 was used as the hole block material in place of (h-19) in forming the hole block layer.

materials were changed (Table 2). Of the samples of Examples 1 to 5 in which the total number of the materials is 5, or that is, the number of the charge transport materials is 4 or more, the voltage is lower by 0.7 V or more than that of the samples of Comparative Examples 1 to 4 in which the total number of the material is 4 or less, or that is, the number of the charge transport materials is 3 or less, and the advantageous effects of the present invention are thus obvious.

TABLE 5

| Material Number | Content (wt %) in Composition for Formation of Light-Emitting Layer | | | | | | | | Total Number of Materials Contained in Light-Emitting Layer | Number of Charge-Transporting Material Contained in Light-Emitting Layer | Voltage Difference (V) at 10 mA/cm$^2$ relative to Comparative Example 1 |
|---|---|---|---|---|---|---|---|---|---|---|---|
| | h-10 | h-15 | h-17 | h-18 | h-19 | h-21 | D-1 | D-4 | | | |
| Example 11 | | 3.6 | | | 0.6 | 0.6 | 0.096 | 0.38 | 5 | 3 | −0.2 |
| Example 12 | | 1.8 | 1.8 | | | 1.2 | 0.096 | 0.38 | 5 | 3 | −0.1 |
| Example 13 | | 1.8 | | 1.8 | | 1.2 | 0.096 | 0.38 | 5 | 3 | −0.2 |
| Example 14 | | 1.8 | 1.8 | | 0.6 | 0.6 | 0.096 | 0.38 | 6 | 4 | −0.7 |
| Example 15 | 0.6 | 1.8 | 1.8 | | | 0.6 | 0.096 | 0.38 | 6 | 4 | −0.5 |
| Example 16 | | 1.8 | | 1.8 | 0.6 | 0.6 | 0.096 | 0.38 | 6 | 4 | −0.7 |
| Example 17 | 0.6 | 1.8 | | 1.8 | | 0.6 | 0.096 | 0.38 | 6 | 4 | −0.5 |
| Example 18 | | 1.2 | 1.2 | 1.2 | 0.6 | 0.6 | 0.096 | 0.38 | 7 | 5 | −0.6 |
| Example 19 | 0.6 | 1.2 | 1.2 | 1.2 | | 0.6 | 0.096 | 0.38 | 7 | 5 | −0.6 |
| Comparative Example 7 | | 3.6 | | | | 1.2 | 0.096 | 0.38 | 4 | 2 | 0.0 |

(Evaluation and Consideration of Elements for Characteristics Evaluation)

The organic electroluminescent elements of Examples and Comparative Examples were analyzed for the current-voltage-luminance (IVL) characteristics thereof, from which the voltage at 10 mA/cm$^2$ was calculated. The voltage difference relative to the voltage of the standard Comparative Example is also shown in Tables 2 to 5. The standard Comparative Example is Comparative Example 1 for Examples 1 to 5 and Comparative Examples 1 to 4; Comparative Example 5 for Example 6 and Comparative Example 5; Comparative Example 6 for Examples 7 to 10 and Comparative Example 6; and Comparative Example 7 for Examples 11 to 19 and Comparative Example 7. The minus value of voltage difference means that the voltage value of the corresponding Example or Comparative Example is lower than that of the standard Comparative Example.

In Examples 1 to 5 and Comparative Examples 1 to 4, one specific light-emitting material was used and the number of the charge transport materials and the combination of those (h-6) was added to Comparative Example 2 to be Example 2; but the voltage difference between Comparative Example 2 and Example 2 is not caused by the effect of (h-6) itself. This is because Example 3 did not contain (h-6) but enjoyed the same voltage level as in Example 2. In that manner, from the data of various kinds of combination, it is considered that the reason of obtaining the advantageous effects of the present invention would not be caused by specific examples but the main reason thereof would be the influence of the number of the kinds of the combined materials.

Similarly, Example 6 is compared with Comparative Example 5 in that in the two cases containing one type of light-emitting material differing from that in Example 1, one contains four kinds of the charge transport materials while the other contains three kinds of the charge transport materials (Table 3). In the two cases, a voltage reduction of 0.2 V was attained, which suggests that the advantageous effects of the present invention are not caused by any specific light-emitting material.

Next, the results of cases containing two kinds of specific light-emitting materials, in which, however, the number of the charge transport materials and the combination of those materials were changed variously, are shown as Examples 7 to 10 and Comparative Example 6 (Table 4). Also in these cases in which the total number of the materials is 4, both the sample of Example 7 in which the number of the charge transport materials was increased to 3 and the sample of Comparative Example 6 in which the number of the charge transport material was 2 enjoyed the effect of a voltage reduction of 0.2 V. Further, it is known that the samples of Examples 8 to 10 in which the number of the charge transport materials is 4 or more enjoyed the effect of a large voltage reduction of 0.5 V or more as compared with the sample of Comparative Example 6.

Next, the results of cases containing two kinds of light-emitting materials that differ from each other, in which, in addition, the number of the charge transport materials and the combination of those materials were changed variously, are shown as Examples 11 to 19 and Comparative Example 7 (Table 5). Also in these cases in which the total number of the materials is 4, the samples of Examples 11 to 13 in which the number of the charge transport materials was increased to 3 enjoyed the effect of a voltage reduction of from 0.1 V to 0.2 V, as compared with the sample of Comparative Example 7 in which the number of the charge transport materials is 2. Further, it is known that the samples of Examples 14 to 19 in which the number of the charge transport materials is 4 or more enjoyed the effect of a large voltage reduction of 0.5 V or more as compared with the sample of Comparative Example 7. Specifically, it is obvious that the present invention provides the advantageous effects of the invention irrespective of some specific charge transport materials.

The above results confirm that when the total number of kinds of the charge transport material and the light-emitting material in the light-emitting layer is 5 or more and the total number of kinds of the charge transport material therein is 3 or more, then the element enjoys low-voltage performance.

While the invention has been described in detail with reference to specific examples thereof, it will be apparent to one skilled in the art that various changes and modifications can be made therein without departing from the spirit and scope thereof. The present application is based on a Japanese patent application filed on Nov. 11, 2011 (Application No. 2011-247576), the contents of which are incorporated herein by reference.

REFERENCE SIGNS LIST

1 Substrate
2 Anode
3 Hole Injection Layer
4 Hole Transport Layer
5 Light-Emitting Layer
6 Hole Block Layer
7 Electron Transport Layer
8 Electron Injection Layer
9 Cathode
10 Organic Electroluminescent Element

The invention claimed is:
1. An organic electroluminescent element comprising an anode, a light-emitting layer and a cathode, in this order, wherein
a total number of kinds of a charge transport material and a light-emitting material contained in the light-emitting layer is 5 or more, and a total number of kinds of the charge transport material contained in the light-emitting layer is 3 or more,
wherein the charge transport material has a molecular weight of 10,000 or less,
wherein the charge transport material comprises a hole transport material and an electron transport material and wherein the electron transport material comprises at least one of the following ring structures:

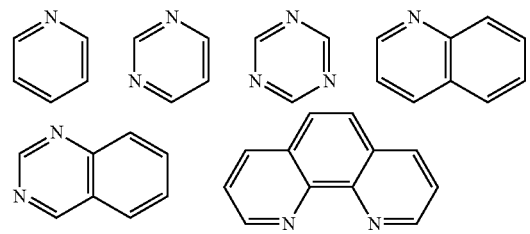

wherein each of the rings are with an aromatic ring group at an o-position and a p-position relative to the nitrogen atom in the ring.

2. The organic electroluminescent element according to claim 1, wherein the total number of kinds of the charge transport material contained in the light-emitting layer is 4 or more.

3. The organic electroluminescent element according to claim 1, wherein the light-emitting layer contains three or more kinds of charge transport materials that differ in at least one value of ionization potential and electron affinity.

4. The organic electroluminescent element according to claim 1, which has at least one combination satisfying a relationship where, when two kinds of the charge transport materials contained in the light-emitting layer are arbitrarily selected, at least one of ionization potential difference and electron affinity difference between the charge transport materials is 0.30 eV or less.

5. The organic electroluminescent element according to claim 1, which has at least two combinations each satisfying a relationship where, when two kinds of the charge transport materials contained in the light-emitting layer are arbitrarily selected, at least one of ionization potential difference and electron affinity difference between the charge transport materials is 0.30 eV or less.

6. The organic electroluminescent element according to claim 1, which has at least two combinations each satisfying a relationship where, when two kinds of the charge transport materials contained in the light-emitting layer are arbitrarily selected, at least one of ionization potential difference and electron affinity difference between the charge transport materials is 0.20 eV or less.

7. The organic electroluminescent element according to claim 1, which has at least three combinations each satisfying a relationship where, when two kinds of the charge transport materials and the light-emitting materials contained in the light-emitting layer are arbitrarily selected, at least one of ionization potential difference and electron affinity difference between the selected materials is 0.20 eV or less.

8. An organic electroluminescent device comprising two or more organic electroluminescent elements each emitting light in a different color, which comprises one or more organic electroluminescent elements of claim 1.

9. An organic electroluminescent device comprising two or more organic electroluminescent elements each emitting light in a different color, wherein the two or more organic electroluminescent elements are composed of only the organic electroluminescent element of claim 1.

10. An organic EL display using the organic electroluminescent device of claim 8.

11. An organic EL lighting using the organic electroluminescent device of claim 8.

12. An organic EL display using the organic electroluminescent device of claim 9.

13. An organic EL lighting using the organic electroluminescent device of claim 9.

14. The organic electroluminescent element according to claim 1, wherein the charge transport material has a molecular weight of 5,000 or less.

15. The organic electroluminescent element according to claim 1, wherein the charge transport material has a molecular weight of 3,000 or less.

16. The organic electroluminescent element according to claim 1, wherein the charge transport material has a molecular weight of 100 to 10,000.

17. The organic electroluminescent element according to claim 14, wherein the charge transport material has a molecular weight of 200 to 5,000.

18. The organic electroluminescent element according to claim 15, wherein the charge transport material has a molecular weight of 400 to 3,000.

19. The organic electroluminescent element according to claim 1, wherein the hole transport material comprises a structure containing a hetero atom with an $sp^3$ orbital, or an aromatic condensed ring having a carbon number of 4n, and the electron transport material is a material including a monocyclic ring or a condensed ring that contains a hetero atom with an $sp^2$ hybrid orbital.

20. The organic electroluminescent element according to claim 1, wherein the hole transport material comprises at least one of the following ring structures:

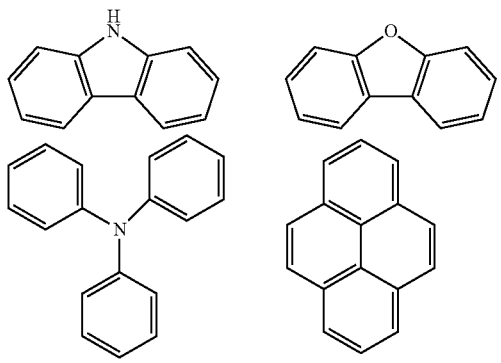

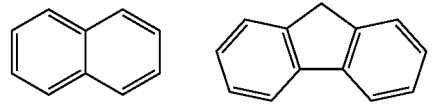

wherein each ring structure is optionally substituted.

21. The organic electroluminescent element according to claim 1, wherein the hole transport material is a compound of formula (E):

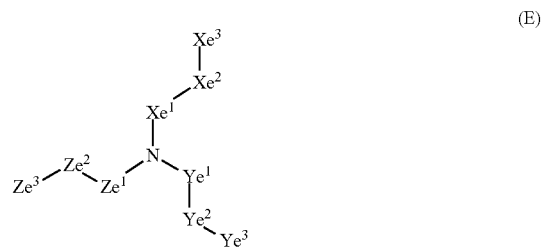

(E)

wherein $Xe^1$, $Xe^2$, $Ye^1$, $Ye^2$, $Ze^1$ and $Ze^2$ each independently represent an aromatic hydrocarbon group having from 6 to 30 carbon atoms and optionally having a substituent, or an aromatic heterocyclic group having from 3 to 30 carbon atoms and optionally having a substituent; $Xe^3$, $Ye^3$ and $Ze^3$ each independently represent a hydrogen atom, an aromatic hydrocarbon group having from 6 to 30 carbon atoms and optionally having a substituent, or an aromatic heterocyclic group having from 3 to 30 carbon atoms and optionally having a substituent.

22. The organic electroluminescent element according to claim 1, wherein the light-emitting layer comprises a compound group α comprising two or more compounds each having a basic skeleton of multiple aromatic rings bonding to each other and having a molecular weight of 2000 or less wherein the compound group α comprises a compound α1 in which the number of the aromatic ring groups constituting the basic skeleton is the smallest, and any other compound of which at least 50% of the basic skeleton is the same as that of the compound α1.

* * * * *